United States Patent
Takahashi et al.

(10) Patent No.: US 12,275,921 B2
(45) Date of Patent: Apr. 15, 2025

(54) TREATMENT LIQUID AND SUBSTRATE TREATMENT METHOD

(71) Applicant: FUJIFILM Corporation, Tokyo (JP)

(72) Inventors: Tomonori Takahashi, Shizuoka (JP); Yasuo Sugishima, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/170,195

(22) Filed: Feb. 16, 2023

(65) Prior Publication Data

US 2023/0287304 A1    Sep. 14, 2023

Related U.S. Application Data

(63) Continuation of application No. PCT/JP2021/030094, filed on Aug. 18, 2021.

(30) Foreign Application Priority Data

Aug. 24, 2020 (JP) ................................. 2020-140565
Jan. 21, 2021 (JP) ................................. 2021-007860
Aug. 13, 2021 (JP) ................................. 2021-131974

(51) Int. Cl.
| | | |
|---|---|---|
| C11D 3/34 | (2006.01) | |
| C11D 1/04 | (2006.01) | |
| C11D 1/14 | (2006.01) | |
| C11D 1/34 | (2006.01) | |
| C11D 3/00 | (2006.01) | |
| C11D 3/30 | (2006.01) | |
| H01L 21/02 | (2006.01) | |
| H01L 21/3213 | (2006.01) | |

(52) U.S. Cl.
CPC ............. *C11D 3/3454* (2013.01); *C11D 1/04* (2013.01); *C11D 1/143* (2013.01); *C11D 1/34* (2013.01); *C11D 3/0026* (2013.01); *C11D 3/0073* (2013.01); *C11D 3/30* (2013.01); *H01L 21/02065* (2013.01); *H01L 21/02074* (2013.01); *H01L 21/02178* (2013.01); *H01L 21/02186* (2013.01); *H01L 21/02244* (2013.01); *C11D 2111/22* (2024.01); *H01L 21/32138* (2013.01)

(58) Field of Classification Search
None
See application file for complete search history.

(56) References Cited

U.S. PATENT DOCUMENTS

| | | |
|---|---|---|
| 2015/0111804 A1 | 4/2015 | Dory et al. |
| 2019/0003062 A1 | 1/2019 | Matsumoto |
| 2019/0136161 A1 | 5/2019 | Kamimura et al. |
| 2019/0284436 A1 | 9/2019 | Mitsumoto et al. |
| 2020/0024547 A1 | 1/2020 | Ishida et al. |
| 2020/0347299 A1 | 11/2020 | Takahashi et al. |

FOREIGN PATENT DOCUMENTS

| | | |
|---|---|---|
| CN | 105849245 A | 8/2016 |
| JP | 2008-20746 A | 1/2008 |
| JP | 2014-142635 A | 8/2014 |
| JP | 2017-150069 A | 8/2017 |
| JP | 2018-092960 A | 6/2018 |
| JP | 2019-39027 A | 3/2019 |
| JP | 2019-156990 A | 9/2019 |
| WO | 2018/021038 A1 | 2/2018 |
| WO | 2018/163781 A1 | 9/2018 |
| WO | 2019/138814 A1 | 7/2019 |

OTHER PUBLICATIONS

Google Patents translation of JP2014142635A (Year: 2024).*
Google Patents translation of JP2019156990A (Year: 2024).*
Google Patents translation of WO2018021038A1 (Year: 2024).*
International Preliminary Report on Patentability dated Feb. 28, 2023 with a Translation of the Written Opinion of the International Searching Authority in Application No. PCT/JP2021/030094 6 pages.
International Search Report dated Nov. 16, 2021 in Application No. PCT/JP2021/030094.
Written Opinion of the International Searching Authority dated Nov. 16, 2021 in Application No. PCT/JP2021/030094 9 pages, not in English.
Office Action issued Sep. 19, 2023 in Japanese Application No. 2022-544481 30 pages.
Chinese Office Action dated Mar. 1, 2024 in Application No. 202180051654.5 23 pages.

* cited by examiner

*Primary Examiner* — Eric W Golightly
(74) *Attorney, Agent, or Firm* — Sughrue Mion, PLLC

(57) ABSTRACT

A treatment liquid for a semiconductor device contains water, a removing agent, and a copolymer. The copolymer has a first repeating unit having at least one group selected from a primary amino group, a secondary amino group, a tertiary amino group, and a quaternary ammonium cation, and a second repeating unit different from the first repeating unit. A substrate treatment method using the treatment liquid is also provided.

28 Claims, 1 Drawing Sheet

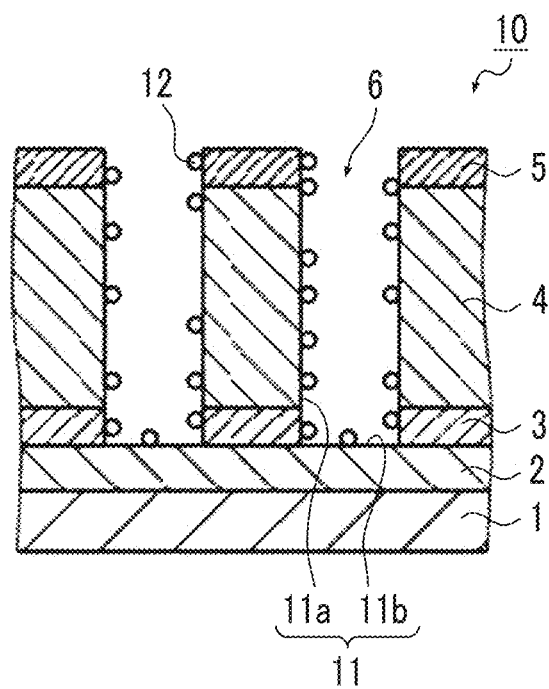
PRIOR ART

TREATMENT LIQUID AND SUBSTRATE TREATMENT METHOD

CROSS-REFERENCE TO RELATED APPLICATIONS

This application is a Continuation of PCT International Application No. PCT/JP2021/030094 filed on Aug. 18, 2021, which claims priority under 35 U.S.C. § 119 (a) to Japanese Patent Application No. 2020-140565 filed on Aug. 24, 2020, Japanese Patent Application No. 2021-007860 filed on Jan. 21, 2021, and Japanese Patent Application No. 2021-131974 filed on Aug. 13, 2021. The above applications are hereby expressly incorporated by reference, in its entirety, into the present application.

BACKGROUND OF THE INVENTION

1. Field of the Invention

The present invention relates to a treatment liquid and a substrate treatment method.

2. Description of the Related Art

With the progress of miniaturization of semiconductor products, there is an increasing demand for carrying out a step of removing unnecessary metal-containing substances on a substrate with high efficiency and accuracy in a semiconductor product manufacturing process.

Semiconductor devices are manufactured, for example, by disposing a laminate having a metal layer serving as a wiring line material, an etching stop film, and an insulating film on a substrate, forming a resist film on this laminate, and carrying out a photolithography step and a dry etching step.

In the photolithography step, a method of carrying out etching or a method of removing a foreign matter that has adhered to the surface of a substrate by using a treatment liquid that dissolves a metal-containing substance is widely known.

For example, in the photolithography step, a metal layer and/or an insulating film on a substrate may be etched by a dry etching treatment using a resist film as a mask. In this case, residues derived from the metal layer and/or the insulating film and the like may adhere to the substrate, the metal layer, and/or the insulating film. In order to remove the adhered residues, washing using a treatment liquid is often carried out.

In addition, the resist film that is used as a mask at the time of etching is then removed from the laminate by a dry-type method (dry ashing) with ashing (incineration) or a wet-type method. The residues derived from the resist film or the like may adhere to the laminate from which the resist has been removed by using the dry ashing method. In order to remove the adhered residues, washing using a treatment liquid is often carried out. On the other hand, examples of the aspect of the wet-type method in which the resist film is removed include an aspect of removing the resist film using a treatment liquid.

As described above, the treatment liquid is used for a treatment such as the removal of metal-containing substances (etching residues and ashing residues) on a substrate and/or a resist film in the semiconductor device manufacturing step.

For example, JP2018-092960A discloses a composition for washing a wiring board, which contains a specific compound having an amino group or hydroxy group and a carboxy group, and a water-soluble polymer having at least one functional group selected from the group consisting of a carboxy group, a sulfo group, and an amino group.

SUMMARY OF THE INVENTION

As a result of studying a treatment liquid for a semiconductor device with reference to JP2018-092960A, the inventors of the present invention found that in a case where a treatment liquid is applied to a laminate having a metal-containing layer (for example, a tungsten-containing layer), a component that imparts a corrosion prevention property remains on the surface of the metal-containing layer, which may affect the subsequent process. That is, it was revealed that regarding the treatment liquid for a semiconductor device, there is room for further improvement in the corrosion prevention property with respect to the metal-containing layer and the removability (that is, the removal selectivity) of the object to be removed, as well as the solubility in a post-treatment liquid.

Therefore, an object of the present invention to provide a treatment liquid for a semiconductor device, where the treatment liquid has an excellent corrosion prevention property with respect to a metal-containing layer and excellent removability of an object to be removed, and also has excellent solubility in a post-treatment liquid.

In addition, an object of the present invention is to provide a substrate treatment method using the treatment liquid.

As a result of diligent studies to solve the above problems, the inventors of the present invention found that the above problems can be solved in a case where a treatment liquid contains a resin having two kinds of specific repeating units, thereby completing the present invention.

That is, the inventors of the present invention found that the above-described problems can be solved by the following configurations.

[1] A treatment liquid for a semiconductor device, comprising water, a removing agent, and a resin, in which the resin has a first repeating unit having at least one selected from the group consisting of a primary amino group, a secondary amino group, a tertiary amino group, and a quaternary ammonium cation, and a second repeating unit different from the first repeating unit.

[2] The treatment liquid according to [1], in which the first repeating unit has the primary amino group.

[3] The treatment liquid according to [1] or [2], in which the second repeating unit has at least one hydrophilic group.

[4] The treatment liquid according to [3], in which the hydrophilic group is a group selected from the group consisting of a hydroxy group, a carboxy group, a primary amino group, a secondary amino group, a tertiary amino group, an amide group, a polyoxyalkylene group, a sulfo group, and a sulfonyl group.

[5] The treatment liquid according to any one of [1] to [4], in which the second repeating unit includes a repeating unit represented by Formula (2a) described later.

[6] The treatment liquid according to any one of [1] to [5], in which the resin has at least one selected from the group consisting of skeleton structures represented by Formulae (P-1) to (P-18) described later.

[7] The treatment liquid according to any one of [1] to [6], in which a ratio m/n of the number of moles m of the first repeating unit to the number of moles n of the second repeating unit is 5:1 to 1:5, where the first repeating unit and the second repeating unit are contained in the resin.

[8] The treatment liquid according to any one of [1] to [7], in which the resin has a weight-average molecular weight of 1,000 to 150,000.

[9] The treatment liquid according to any one of [1] to [8], in which a content of the resin is 10 to 10,000 ppm by mass with respect to a total mass of the treatment liquid.

[10] The treatment liquid according to any one of [1] to [9], in which the removing agent includes at least one selected from the group consisting of hydrofluoric acid, ammonium fluoride, tetramethylammonium fluoride, a hydroxylamine compound, ammonium hydroxide, a water-soluble amine, a quaternary ammonium compound, sulfuric acid, hydrochloric acid, phosphoric acid, carboxylic acid, sulfonic acid, and phosphonic acid.

[11] The treatment liquid according to any one of [1] to [10], in which the removing agent includes a water-soluble amine and at least one organic acid selected from the group consisting of carboxylic acid, sulfonic acid, and phosphonic acid.

[12] The treatment liquid according to [11], in which the water-soluble amine is at least one selected from the group consisting of methylamine, ethylamine, propylamine, butylamine, pentylamine, methoxyethylamine, methoxypropylamine, 2-amino-2-methyl-1-propanol, and allylamine, and the organic acid is at least one selected from the group consisting of acetic acid, propionic acid, methanesulfonic acid, ethanesulfonic acid, allylglycine, maleic acid, citraconic acid, fumaric acid, and itaconic acid.

[13] The treatment liquid according to any one of [1] to [12], further comprising an oxidizing agent.

[14] The treatment liquid according to [13], in which the oxidizing agent is at least one selected from the group consisting of hydrogen peroxide, nitric acid, peracetic acid, periodic acid, perchloric acid, chloric acid, hypochlorous acid, a cerium ammonium nitrate salt, iron nitrate, and ammonium persulfate.

[15] The treatment liquid according to any one of [1] to [14], further comprising a corrosion inhibitor.

[16] The treatment liquid according to [15], in which the corrosion inhibitor includes at least one compound selected from the group consisting of a compound represented by Formula (A) described later, a compound represented by Formula (B) described later, a compound represented by Formula (C) described later, and a substituted or unsubstituted tetrazole,

[17] The treatment liquid according to any one of [1] to [16], further comprising a surfactant.

[18] The treatment liquid according to [17], in which the surfactant is at least one selected from the group consisting of a phosphoric acid ester-based surfactant, a carboxylic acid-based surfactant, a sulfonic acid-based surfactant, and a sulfuric acid ester-based surfactant.

[19] The treatment liquid according to [18], in which the phosphoric acid ester-based surfactant is at least one selected from the group consisting of an alkyl phosphoric acid ester, a mono- or polyoxyalkyl ether phosphoric acid ester, and a salt thereof.

[20] The treatment liquid according to or [19], in which the carboxylic acid-based surfactant is a polyoxyalkylene alkyl ether carboxylic acid.

[21] The treatment liquid according to any one of to [20], in which the sulfonic acid-based surfactant is an alkyl diphenyl ether disulfonic acid, and the sulfuric acid ester-based surfactant is a polyoxyalkylene ether sulfuric acid ester or a salt thereof.

[22] The treatment liquid according to any one of [1] to [21], further comprising an organic solvent.

[23] The treatment liquid according to any one of [1] to [22], further comprising an antifoaming agent.

[24] The treatment liquid according to [23], in which the antifoaming agent is a silicone-based antifoaming agent.

[25] The treatment liquid according to any one of [1] to [24], in which the treatment liquid is a treatment liquid for a substrate having a metal-containing substance, and the metal-containing substance contains at least one component selected from the group consisting of copper, cobalt, a cobalt alloy, tungsten, a tungsten alloy, ruthenium, a ruthenium alloy, tantalum, a tantalum alloy, aluminum oxide, aluminum nitride, aluminum oxynitride, titanium aluminum, titanium, titanium nitride, titanium oxide, zirconium oxide, hafnium oxide, tantalum oxide, lanthanum oxide, and a yttrium alloy.

[26] The treatment liquid according to any one of [1] to [25], in which the treatment liquid is used as a washing solution for removing etching residues, a solution for removing a resist film used in a pattern formation, a washing solution for removing residues from a substrate after chemical mechanical polishing, or an etchant.

[27] A substrate treatment method comprising a step A of removing a metal-containing substance on a substrate by using the treatment liquid according to any one of [1] to [25].

[28] The substrate treatment method according to [27], further comprising a step C of subjecting the substrate obtained in the step A to a rinsing treatment by using a rinsing liquid, after the step A.

[29] A substrate treatment method for treating a substrate having a metal-containing layer on a surface, the substrate treatment method comprising:

a step P of carrying out a liquid treatment of bringing the surface of the substrate into contact with a chemical liquid selected from the group consisting of water, hydrogen peroxide water, a mixed aqueous solution of ammonia water and hydrogen peroxide water, a mixed aqueous solution of hydrofluoric acid and hydrogen peroxide water, a mixed aqueous solution of sulfuric acid and hydrogen peroxide water, a mixed aqueous solution of hydrochloric acid and hydrogen peroxide water, oxygen-dissolved water, and ozone-dissolved water, an ozone treatment of bringing an ozone gas into contact with the substrate, a heating treatment of the substrate in an oxygen atmosphere, or a plasma treatment of the substrate using an oxygen gas, and oxidizing a surface layer of the metal-containing layer to form a metal oxide layer; and a step Q of bringing the treatment liquid according to any one of [1] to into contact with a surface of the metal oxide layer formed in the step P to remove the metal oxide layer.

[30] The treatment method according to [29], in which the step P and the step Q are repeatedly carried out.

[31] The treatment method according to or [30], in which the metal-containing layer contains at least one selected from the group consisting of cobalt, copper, tungsten, titanium, and aluminum.

According to the present invention, it is possible to provide a treatment liquid for a semiconductor device, where the treatment liquid has an excellent corrosion prevention property with respect to a metal-containing layer and excellent removability of an object to be removed, and also has excellent solubility in a post-treatment liquid.

In addition, according to the present invention, it is possible to provide a substrate treatment method using the treatment liquid.

BRIEF DESCRIPTION OF THE DRAWINGS

FIG. 1 is a schematic cross-sectional view illustrating an example of a laminate which is an object to be treated in a substrate washing method.

DESCRIPTION OF THE PREFERRED EMBODIMENTS

Hereinafter, the present invention will be described in detail.

Descriptions of the configuration requirements which will be described later are made based on representative embodiments of the present invention in some cases, but it should not be construed that the present invention is limited to such embodiments.

In the present specification, the numerical value range indicated by using "to" means a range including the numerical values before and after "to" as the lower limit value and the upper limit value, respectively.

In addition, in the present invention, the "preparation" is meant to include supplying a predetermined material by purchases or the like, in addition to providing specific materials by synthesis, combination, or the like.

In the present specification, in a case where two or more kinds of a certain component are present, the "content" of the component means a total content of the two or more kinds of the component.

In the present specification, "ppm" means "parts-per-million $(10^{-6})$", "ppb" means "parts-per-billion $(10^{-9})$", and "ppt" means "parts-per-trillion $(10^{-12})$".

In the present specification, 1 Å (angstrom) corresponds to 0.1 nm.

In the present specification, in a case where there is no description regarding whether a group (atomic group) is substituted or unsubstituted, the group includes both the group having no substituent and the group having a substituent as long as the effect of the present specification is not reduced. For example, the "hydrocarbon group" refers to not only a hydrocarbon group not having a substituent (unsubstituted hydrocarbon group) but also a hydrocarbon group having a substituent (substituted hydrocarbon group). This also applies to each compound.

In the present specification, the "radiation" means, for example, a bright line spectrum of a mercury lamp, far ultraviolet rays typified by an excimer laser, extreme ultraviolet rays (EUV rays), X-rays, or electron beams. In the present specification, light means actinic rays or radiation. Unless otherwise specified, the "exposure" in the present specification includes not only exposure with a mercury lamp, far ultraviolet rays represented by an excimer laser, X-rays, or EUV rays but also includes drawing with particle beams s as electron beams and ion beams.

[Treatment Liquid]

The treatment liquid according to the embodiment of the present invention (hereinafter, also referred to as "the present treatment liquid") contains water, a removing agent, and a copolymer, and the copolymer has a first repeating unit having at least one group selected from the group consisting of a primary amino group, a secondary amino group, a tertiary amino group, and a quaternary ammonium cation, and a second repeating unit different from the first repeating unit.

The present treatment liquid contains, together with water and a removing agent, a resin having two kinds of specific repeating units.

Since the treatment liquid that is used for the treatment of a laminate having a metal-containing layer (particularly, a tungsten-containing layer) contains the above-described resin, it is conceived that a protective film composed of a resin is formed on the surface of the metal-containing layer during the treatment, and the elution of the metal from the metal-containing layer is suppressed, whereas the residual residues derived from the treatment liquid can be further suppressed since the protective film is easily removed after the treatment by a post-treatment liquid such as a rinsing liquid.

Hereinafter, each component of the present treatment liquid will be described in detail.

[Water]

The present treatment liquid contains water.

The content of water is not particularly limited; however, it is, for example, 1% to 97% by mass, preferably 10% to 98% by mass, and more preferably 10% to 97% by mass, with respect to the total mass of the treatment liquid.

The water is preferably ultrapure water that is used for manufacturing a semiconductor device.

In particular, the water is preferably water in which inorganic anions, metal ions, and the like are reduced. Among the above, it is more preferably water in which the concentration of ions derived from metals of Fe, Co, Na, K, Ca, Cu, Mg, Mn, Li, Al, Cr, Ni, and Zn is reduced, and it is still more preferably water in which the above concentration thereof is adjusted to be on the order of ppt or less (in one form, the metal content is less than 0.001 ppt by mass) at the time when used in the preparation of the treatment liquid. The method of carrying out the adjustment is preferably, purification using a filtration membrane or an ion-exchange membrane or purification by distillation. Examples of the method of carrying out the adjustment include the method described in paragraphs to of JP2011-110515A and the method described in JP2007-254168A.

The water that is used in the embodiment of the present invention is preferably the water obtained as described above. In addition, from the viewpoint that the desired effect of the present invention can be remarkably obtained, it is more preferable that the above-described water is used not only for the treatment liquid but also for washing a storage container. Further, it is preferable that the above-described water is also used in the manufacturing step of the treatment liquid, the measurement of components of the treatment liquid, the measurement for evaluation of the treatment liquid, and the like.

[Resin (A)]

The present treatment liquid contains a resin (A) having the first repeating unit having at least one specific group and the second repeating unit different from the first repeating unit.

The first repeating unit contained in the resin (A) has at least one group (hereinafter, also referred to as the "specific amino group") selected from the group consisting of a primary amino group (—NH$_2$), a secondary amino group (—NH—), a tertiary amino group (>N—), and a quaternary ammonium cation (>N$_+$<).

The first repeating unit is not particularly limited as long as it has at least one specific amino group and it is a repeating unit that constitutes the main chain of the resin (A).

In the first repeating unit, a salt may be formed by the specific amino group and an acid selected from an inorganic acid and an organic acid. That is, the first repeating unit contained in the resin (A) has at least one group selected from the group consisting of a primary amino group, a secondary amino group, a tertiary amino group, and a quaternary ammonium cation, and a salt between this and an inorganic acid or organic acid.

Examples of the inorganic acid include hydrochloric acid, sulfuric acid, phosphoric acid, and nitric acid. Examples of the organic acid include acetic acid, propionic acid, methanesulfonic acid, ethanesulfonic acid, allylglycine, maleic acid, citraconic acid, fumaric acid, and itaconic acid.

In a case where the specific amino group is a salt, a salt with hydrochloric acid, acetic acid, propionic acid, methanesulfonic acid, or ethanesulfonic acid is preferable, and a salt with hydrochloric acid, acetic acid, or ethanesulfonic acid is more preferable.

It is noted that in a case of being a quaternary ammonium cation, the specific amino group forms a salt together with a counter ion that matches with the above inorganic acid or organic acid.

The number of specific amino groups contained in the first repeating unit is not particularly limited; however, it is preferably 1 to 4, more preferably 1 or 2, and still more preferably 1.

In addition, in a case where the specific amino group contained in the first repeating unit is a secondary amino group, a tertiary amino group, or a quaternary ammonium cation, one, two, or three substituents which are contained on the nitrogen atom of the secondary amino group, the tertiary amino group, or the quaternary ammonium cation are not particularly limited; however, the substituents are preferably an aliphatic hydrocarbon group, more preferably a linear or branched alkyl group having 1 to 6 carbon atoms, and still more preferably a methyl group or an ethyl group.

The specific amino group contained in the first repeating unit is preferably a primary amino group, a secondary amino group, or a tertiary amino group, and it is more preferably a primary amino group.

Examples of the first repeating unit include a repeating unit represented by Formula (1).

$$(Q_1(X_1)_i)— \quad (1)$$

In Formula (1), $Q_1$ represents an aliphatic hydrocarbon group having 2 to 4 carbon atoms, which has a valence of (2+i). Here, $X_1$ represents a monovalent group having at least one specific amino group, and i represents 1 or 2. In a case where i represents 2, two $X_1$'s may be linked to each other to form, together with at least a part of $Q_1$, a ring structure having at least one specific amino group.

$X_1$ may be a group consisting of only the specific amino group or may be a group consisting of the specific amino group and a linking group L.

The linking group L is not particularly limited as long as it is a group having a valence corresponding to the number of the specific amino groups. However, it includes an aliphatic hydrocarbon group and a group obtained by substituting a methylene group contained in the aliphatic hydrocarbon group with a group selected from the group consisting of —O—, —CO—, —NH—, and —NR— (R represents an aliphatic hydrocarbon group).

The linking group L is preferably a group obtained by eliminating hydrogen atoms of which the number corresponds to the number of the specific amino groups to be substituted, from a linear or branched alkyl group or a group obtained by substituting a methylene group contained in the alkyl group of the linear or branched alkyl group with —O—, —CO—, or —NH—. The linear or branched alkyl group preferably has 1 to 8 carbon atoms and more preferably 1 to 4 carbon atoms. The linking group L is more preferably a methylene group or an ethylene group and still more preferably a methylene group.

Examples of the ring structure formed by linking two $X_1$'s to each other together with at least a part of $Q_1$ include a nitrogen-containing heterocyclic ring having a 5- to 7-membered ring, where a pyrrolidine ring, a pyrrolidinium ring, a 1-pyrrolinic ring, or a piperidine ring is preferable, and a pyrrolidine ring or a pyrrolidinium ring is more preferable.

The aliphatic hydrocarbon group represented by $Q_1$ is preferably an ethylene group, a propylene group, a trimethylene group, or a tetramethylene group, and it is more preferably an ethylene group.

The substituent which may be contained in the aliphatic hydrocarbon group represented by $Q_1$ is preferably an aliphatic hydrocarbon group, more preferably a linear or branched alkyl group having 1 to 4 carbon atoms, still more preferably a methyl group or an ethyl group, and particularly preferably a methyl group.

i preferably represents 1.

The first repeating unit is preferably a repeating unit represented by Formula (1a).

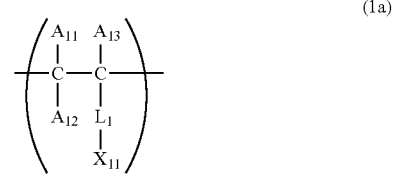

In Formula (1a), $X_{11}$ represents a specific amino group, $L_1$ represents a single bond or a divalent linking group, and $A_{11}$, $A_{12}$, and $A_{13}$ independently represent a hydrogen atom or a linear or branched alkyl group having 1 to 4 carbon atoms.

The preferred aspect of the specific amino group represented by $X_{11}$ is as described above.

The divalent linking group represented by $L_1$ is as described in the linking group L, including the preferred aspect thereof. $L_1$ is preferably a single bond or a linear or branched alkylene group having 1 to 4 carbon atoms, more preferably a single bond, a methylene group, or an ethylene group, and still more preferably a single bond or a methylene group.

$A_{11}$, $A_{12}$, and $A_{13}$ are preferably a hydrogen atom, a methyl group, or an ethyl group and more preferably a hydrogen atom.

The content of the first repeating unit is preferably 1% to 99% by mole, more preferably 5% to 95% by mole, still more preferably 15% to 85% by mole, and particularly preferably 25% to 75%, with respect to all the repeating units in the resin (A).

The resin (A) has a second repeating unit different from the first repeating unit.

Here, "different from the first repeating unit" means that, for example, a group contained in the first repeating unit as the specific amino group is not contained, and/or a structure of the main chain in the first repeating unit or a structure of the linking group that links the main chain to the specific amino group is different.

The second repeating unit may have a specific amino group different from the specific amino group that is actually contained in the first repeating unit. In addition, the second repeating unit may have the same specific amino group as the first repeating unit as long as the structure of the main chain or the side chain is different from that of the first repeating unit. The second repeating unit preferably has a hydrophilic group different from the specific amino group that is actually contained in the first repeating unit.

The second repeating unit preferably has at least one hydrophilic group.

The number of hydrophilic groups contained in the second repeating unit is not particularly limited; however, it is preferably 1 to 5, more preferably 1 to 3, and still more preferably 1 or 2.

Examples of the hydrophilic group include a specific amino group, a carboxy group, a hydroxy group, an alkoxy group, a polyoxyalkylene group, an amide group, a carbamoyl group, a nitrile group, a sulfo group, a sulfonyl group, a sulfonamide group, and a sulfamoyl group.

Examples of the polyoxyalkylene group include a polyoxyethylene group, a polyoxypropylene group, and a polyoxyalkylene group in which an oxyethylene group and an oxypropylene group are block-bonded or randomly bonded, where a polyoxyethylene or polyoxypropylene is preferable, and polyoxyethylene is more preferable.

The number of repetitions of the oxyalkylene group in the polyoxyalkylene group is not particularly limited; however, it is preferably 1 to 30 and more preferably 1 to 10.

The above-described hydrophilic group may form a salt. The salt of the specific amino group is as described above in the section of the first repeating unit. Examples of the salts of the carboxy group and the sulfo group include alkali metal salts thereof and salts with basic compounds described later.

The above-described hydrophilic group may further have a substituent. Examples of the substituent which may be contained in the hydrophilic group include an aliphatic hydrocarbon group and the above-described hydrophilic group, where a linear or branched alkyl group having 1 to 4 carbon atoms is preferable, a methyl group or an ethyl group is more preferable, and a methyl group is still more preferable.

The hydrophilic group contained in the second repeating unit is preferably a hydroxy group, a carboxy group, a primary amino group, a secondary amino group, a tertiary amino group, an amide group, a polyoxyalkylene group, a sulfo group, or a sulfonyl group, more preferably a primary amino group, a carboxy group, a hydroxy group, or a polyoxyethylene group, and still more preferably a carboxy group.

Examples of the second repeating unit include a repeating unit represented by Formula (2).

(2)

In Formula (1), $Q_2$ represents an aliphatic hydrocarbon group having 2 to 4 carbon atoms, which has a valence of (2+j). $X_2$ represents a monovalent group having at least one hydrophilic group, and j represents 1 or 2. In a case where J represents 2, two $X_2$'s may be linked to each other to form, together with at least a part of $Q_2$, a ring structure having at least one hydrophilic group.

$X_2$ may be a group consisting of only a hydrophilic group or may be a group consisting of a hydrophilic group and a linking group L.

The linking group L has the same meaning as the linking group L in Formula (1), including the preferred aspect thereof.

Examples of the ring structure formed by linking two $X_2$'s to each other together with at least a part of $Q_2$ include a nitrogen-containing heterocyclic ring having a 5- to 7-membered ring, where a pyrrolidine ring, a pyrrolidinium ring, a 1-pyrrolinic ring, or a piperidine ring is preferable, and a pyrrolidine ring or a pyrrolidinium ring is more preferable.

The aliphatic hydrocarbon group represented by $Q_2$ is preferably an ethylene group, a propylene group, a trimethylene group, or a tetramethylene group, and it is more preferably an ethylene group.

Examples of the substituent which may be contained in the aliphatic hydrocarbon group represented by $Q_2$ include an aliphatic hydrocarbon group, where a linear or branched alkyl group having 1 to 4 carbon atoms is preferable, a methyl group or an ethyl group is more preferable, and a methyl group is still more preferable.

j preferably represents 1.

The second repeating unit may be a divalent hydrophilic group. Examples of the divalent hydrophilic group serving as the second repeating unit include a sulfonyl group.

The second repeating unit is preferably a repeating unit represented by Formula (2a).

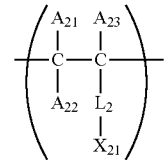
(2a)

In Formula (2a), $A_{21}$, $A_{22}$, and $A_{23}$ each independently represent a hydrogen atom, a linear or branched alkyl group having 1 to 4 carbon atoms, or -$L_2$-$X_{21}$. $X_{21}$ represents a hydrophilic group. $L_2$ represents a single bond or a divalent linking group. In a case where two or more $X_{21}$'s or two or more $L_2$'s are present, the two or more $X_{21}$'s or two or more $L_2$'s may be the same or different from each other.

The preferred aspect of the hydrophilic group represented by $X_{21}$ is as described above.

The divalent linking group represented by $L_2$ is as described in the linking group L, including the preferred aspect thereof. $L_2$ is preferably a single bond or a linear or branched alkylene group having 1 to 4 carbon atoms, more preferably a single bond, a methylene group, or an ethylene group, and still more preferably a single bond or a methylene group.

It is preferable that $A_{21}$, $A_{22}$, and $A_{23}$ each independently represent a hydrogen atom or a linear or branched alkyl group having 1 to 4 carbon atoms, or one of $A_{21}$, $A_{22}$, and $A_{23}$ represents -$L_2$-$X_{21}$ and the remaining two represent a hydrogen atom or a linear or branched alkyl group having 1 to 4 carbon atoms.

Among the above, it is preferable that $A_{21}$, $A_{22}$, and $A_{23}$ each independently represent a hydrogen atom, a methyl group, or an ethyl group, or one of $A_{21}$, $A_{22}$, and $A_{23}$ represents a hydrophilic group and the remaining two represent a hydrogen atom, a methyl group or an ethyl group, It is still more preferable that, $A_{21}$, $A_{22}$, and $A_{23}$ each independently represent a hydrogen atom or a methyl group, or one of $A_{21}$, $A_{22}$, and $A_{23}$ represents a carboxy group and the remaining two represent a hydrogen atom or a methyl group.

The content of the second repeating unit is preferably 1% to 99% by mole, more preferably 5% to 95% by mole, still more preferably 15% to 85% by mole, and particularly preferably 25% to 75%, with respect to all the repeating units in the resin (A).

One kind of the second repeating unit may be used alone, or two or more kinds thereof may be combined. In a case where the resin (A) has two or more kinds of the second repeating units, it is preferable that the resin (A) has at least one repeating unit represented by Formula (2) or Formula (2a).

The content of the repeating unit represented by Formula (2) or Formula (2a) is preferably 1% to 99% by mole, more preferably 5% to 95% by mole, still more preferably 15% to 85% by mole, and particularly preferably 25% to 75%, with respect to all the repeating units in the resin (A).

The ratio of the first repeating unit to the second repeating unit in the resin (A) is not particularly limited. However, from the viewpoint that the anticorrosion properties with respect to a metal-containing layer (particularly, a tungsten-containing layer) are more excellent, the ratio (m:n) of the number of moles m of the first repeating unit to the number of moles n of the second repeating unit is preferably 20:1 to 1:20, more preferably 10:1 to 1:10, still more preferably 5:1 to 1:5, and particularly preferably 3:1 to 1:3.

Specific examples of the resin (A) include resins having skeleton structures represented by Formulae (P-1) to (P-23). In Formulae (P-1) to (P-23), the repeating unit designated by the reference numeral m is the first repeating unit, and the repeating unit designated by the reference numeral n is the second repeating unit.

It is noted that in the skeleton structures represented by Formulae (P-1) to (P-23), a plurality of repeating units are described, and the bonding modes of the plurality of repeating units are not particularly limited. For example, the plurality of repeating units may be bonded randomly (so-called the random copolymer), may be alternately bonded (so-called the alternating copolymer), or may be bonded in a block shape (so-called the block copolymer).

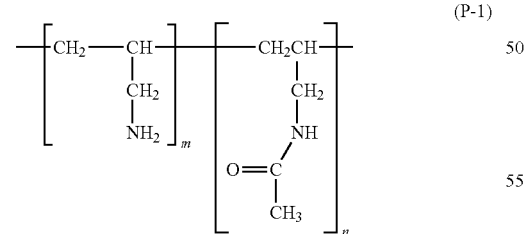

(P-1)

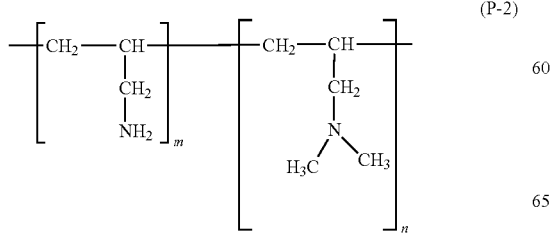

(P-2)

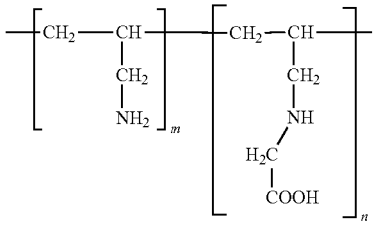

(P-3)

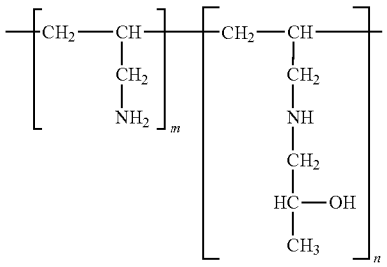

(P-4)

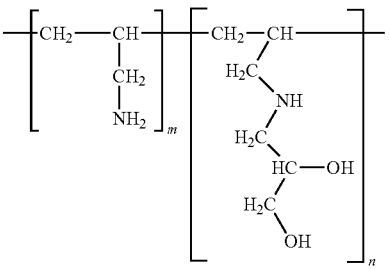

(P-5)

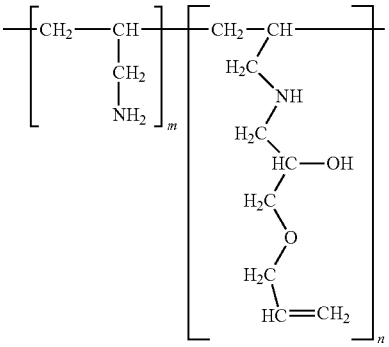

(P-6)

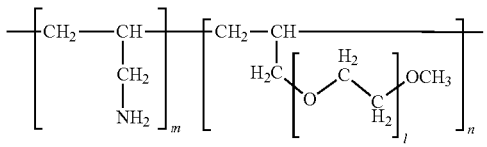

(P-7)

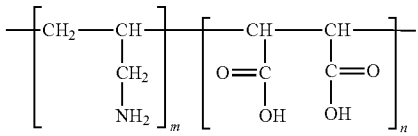

(P-8)

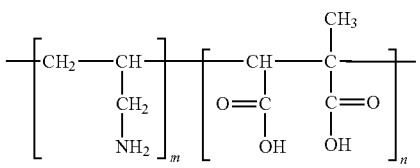

(P-9)

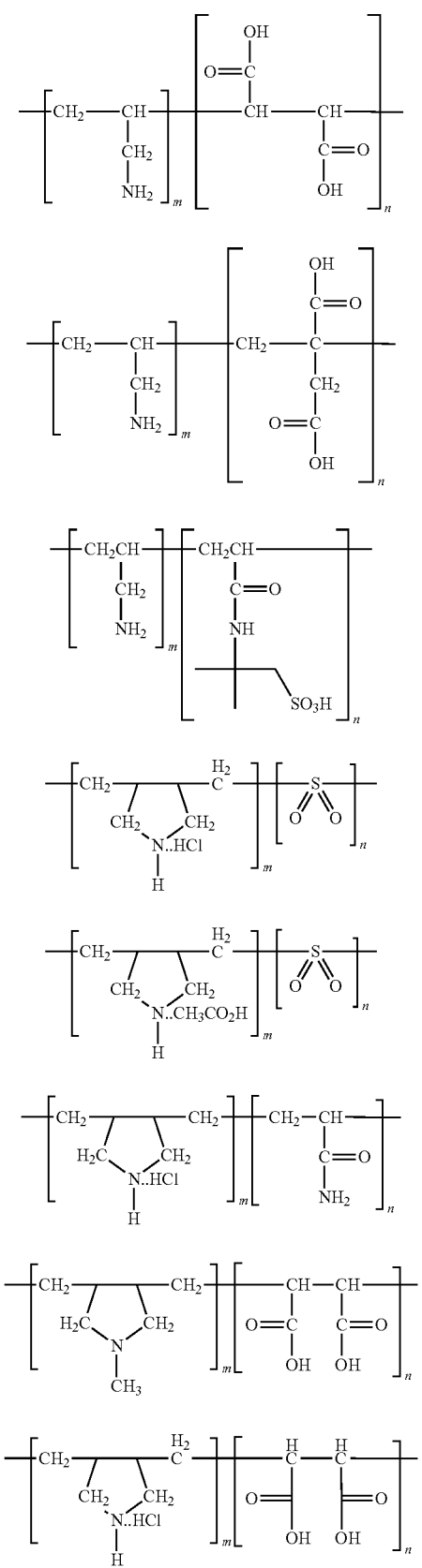
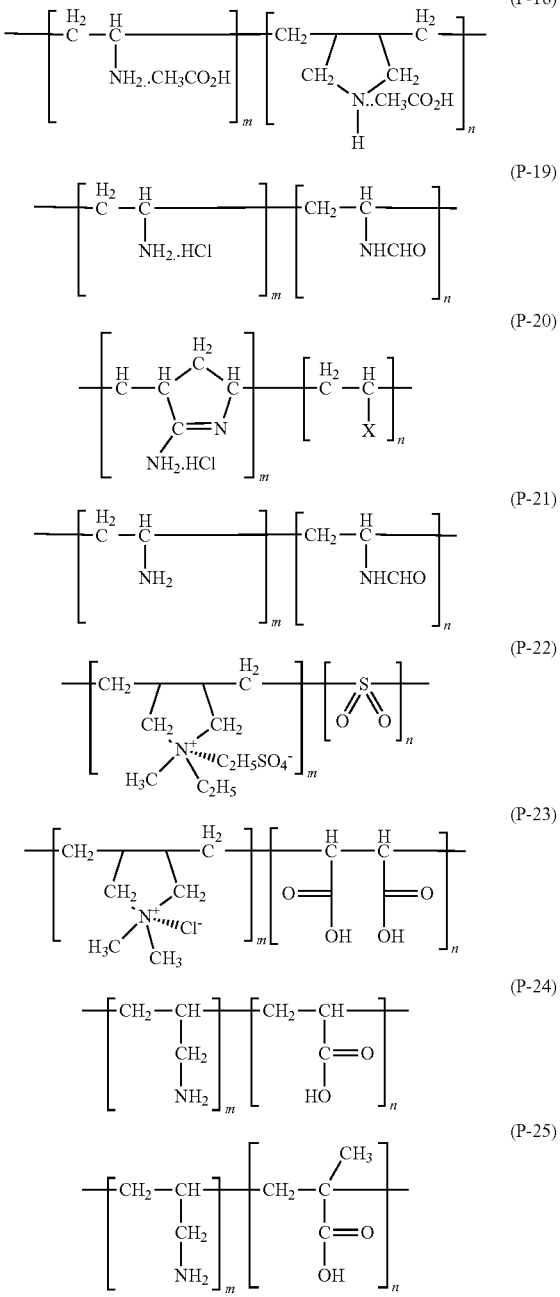

In Formulae (P-1) to (P-25), a ratio (m:n) of the number of moles m of the first repeating unit to the number of moles n of the second repeating unit is 1:20 to 20:1.

In addition, l in Formula (P-7) represents the number of repetitions of the oxyalkylene unit and represents an integer of 1 to 30.

In addition, in Formula (P-20), X represents an amide group, a nitrile group, an amino hydrochloride group, or a formamide group.

Among the above, at least one selected from the group consisting of skeleton structures represented by Formulae (P-1) to (P-18) is preferable, at least one selected from the group consisting of skeleton structures represented by (P-8), (P-9), (P-10), and (P-11) is preferable, and at least one selected from the group consisting of skeleton structures represented by (P-8), (P-10), and (P-11) is preferable.

It is noted that the structure and the compositional ratio (the ratio in terms of % by mole) of each repeating unit in the resin (A) can be measured by 13C-NMR.

The weight-average molecular weight of the resin (A) is not particularly limited; however, it is preferably 500 to 200,000, more preferably 1,000 to 100,000, still more preferably 2,000 to 50,000, and particularly preferably 3,000 to 10,000.

It is noted that in the present specification, the "weight-average molecular weight" means a weight-average molecular weight in terms of polystyrene, which is measured by gel permeation chromatography (GPC).

One kind of the resin (A) may be used alone, or two or more kinds thereof may be used in combination.

The content of the resin (A) is preferably 1 ppm by mass to 10% by mass, more preferably 10 to 10,000 ppm by mass, and still more preferably 50 to 1,000 ppm by mass, with respect to the total mass of the treatment liquid.

[Removing Agent]

The present treatment liquid contains a removing agent.

The removing agent is not particularly limited as long as it is a compound having a function of removing residues such as an etching residue and an ashing residue, and examples thereof include a fluorine-containing compound, a hydroxylamine compound, a basic compound, and an acidic compound.

<Fluorine-Containing Compound>

The fluorine-containing compound is not particularly limited as long as it is a compound containing a fluorine atom, and it may be an inorganic compound containing a fluorine atom or may be an organic compound containing a fluorine atom.

Examples of the fluorine-containing compound include hydrofluoric acid (fluorinated acid), ammonium fluoride, tetramethylammonium fluoride, and tetrabutylammonium fluoride. The fluorine-containing compound has a function of removing residues in the treatment liquid. As a result, in a case where the treatment liquid contains a fluorine-containing compound, the residue removability is more excellent.

The fluorine-containing compound is preferably hydrofluoric acid, ammonium fluoride, or tetramethylammonium fluoride, and it is more preferably hydrofluoric acid or ammonium fluoride.

One kind of the fluorine-containing compound may be used singly, or two or more kinds thereof may be used in combination.

The content of the fluorine-containing compound in the treatment liquid is preferably 0.01% to 10.0% by mass and more preferably 0.1% to 5.0% by mass with respect to the total mass of the treatment liquid.

<Hydroxylamine Compound>

The treatment liquid may contain a hydroxylamine compound as the removing agent.

The hydroxylamine compound is at least one compound selected from the group consisting of hydroxylamine ($NH_2OH$), a hydroxylamine derivative, and a salt thereof.

Since the hydroxylamine compound has a function of promoting decomposition and solubilization of residues and removing residues such as an etching residue and an ashing residue, the treatment liquid preferably contains a hydroxylamine compound as the removing agent.

The hydroxylamine derivative is not particularly limited; however, examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

Examples of the salts of the hydroxylamine and the hydroxylamine derivative include inorganic acid salts and organic acid salts, where an inorganic acid salt formed by bonding a non-metal atom such as Cl, S, N, or P to a hydrogen atom is preferable, and a salt of any acid of hydrochloric acid, sulfuric acid, or nitric acid is more preferable.

The inorganic acid salts of the hydroxylamine and the hydroxylamine derivative are preferably hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture thereof.

In addition, examples of the organic acid salts of the hydroxylamine and the hydroxylamine derivative include a hydroxylammonium citrate, a hydroxylammonium oxalate, and a hydroxylammonium fluoride.

The hydroxylamine compound is preferably hydroxylamine or hydroxylamine sulfate from the viewpoint of more excellent residue removability.

One kind of the hydroxylamine compound may be used alone, or two or more kinds thereof may be used in combination.

The content of the hydroxylamine compound is not particularly limited; however, it is preferably 0.01% to 30% by mass and more preferably 0.5% to 25% by mass with respect to the total mass of the treatment liquid.

<Basic Compound>

The treatment liquid may contain a basic compound as the removing agent. The basic compound is intended to be a compound, where the pH of a solution of the compound exceeds 7 in a case of being dissolved in water. The basic compound also has a function as a pH adjusting agent for adjusting the pH of the treatment liquid.

It is noted that in the present specification, the compound contained in a corrosion inhibitor described below is not included in the basic compound.

As described above, the basic compound may form a salt with a hydrophilic group contained in the second repeating unit of the resin (A).

The basic compound is not particularly limited, and examples thereof include ammonium hydroxide, a water-soluble amine, and a quaternary ammonium compound.

Hereinafter, the ammonium hydroxide, the water-soluble amine, and the quaternary ammonium compound will be described in detail.

(Ammonium Hydroxide)

The treatment liquid may contain ammonium hydroxide ($NH_4OH$) as the basic compound.

In a case where the treatment liquid contains ammonium hydroxide, the content of the ammonium hydroxide is not particularly limited; however, it is preferably 0.01% to 10% by mass, and more preferably 0.05% to 5.0% by mass with respect to the total mass of the treatment liquid.

(Water-Soluble Amine)

In the present specification, the water-soluble amine is intended to be a compound having an amino group in the molecule, where an amount of 50 g or more of the compound can be dissolved in 1 L of water.

Examples of the water-soluble amine include a primary amine having a primary amino group ($—NH_2$) in the molecule, a secondary amine having a secondary amino group (>NH) in the molecule, a tertiary amine having a tertiary amino group (>N—) in the molecule, and a salt thereof.

Examples of the salt of the above amine include a salt of an inorganic acid, in which at least one non-metal selected from the group consisting of Cl, S, N, and P is bonded to hydrogen, where a hydrochloride, a sulfate, or a nitrate is preferable.

The water-soluble amine is preferably a low-molecular-weight compound. In the present specification, the "low-molecular-weight compound" means a compound having substantially no molecular weight distribution. The low-molecular-weight compound preferably has a molecular weight of 1,000 or less. Any one of the following specific examples of the water-soluble amines is a low-molecular-weight compound having a molecular weight of 1,000 or less.

The water-soluble amine may be an alicyclic amine compound having a ring structure in the molecule or may be an alkanol amine having at least one hydroxyalkyl group in the molecule.

Examples of the alicyclic amine compound include 1,8-diazabicyclo[5.4.0]-7-undecene (DBU), ε-caprolactam, the following compound 1, the following compound 2, the following compound 3, 1,4-diazabicyclo[2.2.2]octane (DABCO), tetrahydrofurfurylamine, N-(2-aminoethyl) piperazine, hydroxyethylpiperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4,3,0]-5-nonene.

Compound 1

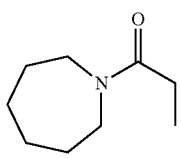

Compound 2

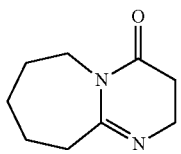

Compound 3

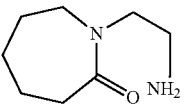

The alkanol amine may have any one of a primary amino group, a secondary amino group, or a tertiary amino group; however, it preferably has a primary amino group.

Examples of the alkanol amine include monoethanolamine (MEA), diethanolamine (DEA), triethanolamine (TEA), diethylene glycolamine (DEGA), trishydroxymethylaminomethane (THAM), and 2-amino-2-methyl-1-propanol (AMP), 2-amino-2-methyl-1,3-dipropanol (AMPD), 2-amino-2-ethyl-1,3-dipropanol (AEPD), 2-(methylamino)-2-methyl-1-propanol (N-MAMP), 2-(aminoethoxy) ethanol (AEE), 2-(2-aminoethylamino) ethanol (CAS registration number: 111-41-1) (AEEA), and N-(3-aminopropyl) diethanolamine (APDA), where AEE or AEEA is preferable.

Among the water-soluble amines, examples of the primary amine other than the alicyclic amine compound and the alkanol amine include methylamine, ethylamine, propylamine, butylamine, pentylamine, methoxyethylamine, methoxypropylamine, 2-amino-2-methyl-1-propanol (AMP), and allylamine.

Examples of the secondary amine other than the alicyclic amine compound and the alkanol amine include dimethylamine, diethylamine, dipropylamine, and dibutylamine (DBA).

Examples of the tertiary amine other than the alicyclic amine compound and the alkanol amine include trimethylamine, triethylamine, and tributylamine (TBA).

One kind of the water-soluble amine may be used alone, or two or more kinds thereof may be used in combination.

The content of the water-soluble amine is not particularly limited; however, it is preferably 0.01% to 10% by mass and more preferably 0.1% to 5.0% by mass with respect to the total mass of the treatment liquid.

(Quaternary Ammonium Compound)

The treatment liquid may include, as a removing agent, a quaternary ammonium compound which is a compound having one quaternary ammonium cation or a salt thereof in the molecule.

The quaternary ammonium compound is not particularly limited as long as it is a compound having one quaternary ammonium cation in which a nitrogen atom is substituted with four hydrocarbon groups (preferably an alkyl group), or a salt thereof.

Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate.

The quaternary ammonium compound is preferably a quaternary ammonium hydroxide and more preferably a compound represented by Formula (a1).

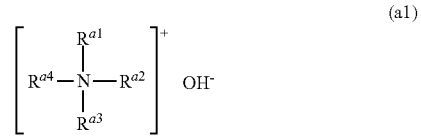 (a1)

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}$ to $R^{a4}$ may be bonded to each other to form a cyclic structure.

From the viewpoint of ease of availability, the compound represented by Formula (a1) is preferably at least one selected from the group consisting of tetramethylammonium hydroxide (TMAH), tetraethylammonium hydroxide (TEAH), tetrapropylammonium hydroxide, tetrabutylammonium hydroxide (TBAH), methyltripropylammonium hydroxide, methyltributylammonium hydroxide, ethyltrimethylammonium hydroxide, dimethyldiethylammonium hydroxide, benzyltrimethylammonium hydroxide (BzTMAH), hexadecyltrimethylammonium hydroxide, (2-hydroxyethyl)trimethylammonium hydroxide, and spiro-(1,1')-bipyrrolidinium hydroxide, more preferably TMAH, TEAH, TBAH, or BzTMAH, and still more preferably TMAH, TEAH, or TBAH.

One kind of the quaternary ammonium compound may be used alone, or two or more kinds thereof may be used in combination.

The content of the quaternary ammonium compound is preferably 0.01% to 15% by mass and more preferably 0.1% to 10% by mass with respect to the total mass of the treatment liquid.

One kind of the basic compound may be used alone, or two or more kinds thereof may be used in combination.

In a case where the treatment liquid contains a basic compound, the content of the basic compound is preferably 0.01% to 20% by mass and more preferably 0.01% to 10% by mass with respect to the total mass of the treatment liquid.

<Acidic Compound>

The treatment liquid may contain an acidic compound as the removing agent. The acidic compound is intended to be a compound, where the pH of a solution of the compound becomes less than 7 in a case of being dissolved in water. The acidic compound also has a function as a pH adjusting agent for adjusting the pH of the treatment liquid.

It is noted that in the present specification, a compound included in any one of the above-described fluorine-containing compound, the oxidizing agent described below, or the anionic surfactant described below is not included in the acidic compound.

The acidic compound may be an inorganic acid or an organic acid.

As described above, the inorganic acid or the organic acid may form a salt with the specific amino group contained in the first repeating unit or the second repeating unit of the resin (A).

(Inorganic Acid)

Examples of the inorganic acid include sulfuric acid, hydrochloric acid, and phosphoric acid, where sulfuric acid is preferable.

One kind of the inorganic acid may be used alone, or two or more kinds thereof may be used in combination.

In a case where the treatment liquid contains an inorganic acid, the content of the basic compound is preferably 0.01% to 20% by mass and more preferably 0.01% to 10% by mass with respect to the total mass of the treatment liquid.

(Organic Acid)

The organic acid is an organic compound that has an acidic functional group and is acidic (has a pH of less than 7.0) in an aqueous solution. Examples of the acidic functional group include a carboxy group, a phosphonic acid group, a sulfo group, a phenolic hydroxyl group, and a mercapto group.

The organic acid is not particularly limited; however, examples thereof include a carboxylic acid having a carboxy group in the molecule (an organic carboxylic acid), a phosphonic acid having a phosphonic acid group in the molecule (an organic phosphonic acid), and a sulfonic acid having a sulfo group in the molecule (an organic sulfonic acid), where a carboxylic acid or is preferable.

The number of acidic functional groups contained in the organic acid is not particularly limited; however, it is preferably 1 to 4 and more preferably 1 to 3.

In addition, the organic acid is preferably a compound having a function of chelating with a metal included in the residue, and it is more preferably a compound having two or more functional groups (coordinating groups) that coordinate with a metal ion in the molecule. Examples of the coordinating group include the above-described acidic functional group and amino group.

—Carboxylic Acid—

Examples of the carboxylic acid include an polyaminopolycarboxylic acid, an amino acid, a polycarboxylic acid, and a monocarboxylic acid.

The polyaminopolycarboxylic acid is a compound having a plurality of amino groups and a plurality of carboxy groups in one molecule, and examples thereof include a mono- or polyalkylene polyamine carboxylic acid, a polyaminoalkane carboxylic acid, a polyaminoalkanol carboxylic acid, and a hydroxyalkyl ether polyamine carboxylic acid.

More specific examples of the polyaminopolycarboxylic acid include butylenediaminetetraacetic acid, diethylenetriaminepentaacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid (Cy-DTA), ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid.

Among them, diethylenetriaminepentaacetic acid (DTPA), ethylenediaminetetraacetic acid (EDTA), or trans-1,2-diaminocyclohexanetetraacetic acid (Cy-DTA) is preferable.

The amino acid is a compound that has one or more amino groups and one or more carboxy groups in one molecule. However, the above-described polyaminopolycarboxylic acid is not included in the amino acid.

Examples of the amino acid include glycine, allylglycine, serine, α-alanine (2-aminopropionic acid), β-alanine (3-aminopropionic acid), lysine, leucine, isoleucine, cystine, cysteine, methionine, ethionine, threonine, tryptophan, tyrosine, valine, histidine, a histidine derivative, asparagine, glutamine, arginine, proline, phenylalanine, the compounds described in paragraphs to of JP2016-086094A, and salts thereof. It is noted that as the histidine derivative, the compounds described in JP2015-165561A and JP2015-165562A, the contents of which are incorporated herein by reference, can be used. In addition, examples of the salt include alkali metal salts such as a sodium salt and a potassium salt, an ammonium salt, a carbonate, and acetate.

In addition, examples of the amino acid having a plurality of amino groups and one carboxy group include a compound represented by Formula (I) or a salt thereof.

$(R_3NH)C(R^1)(R^2)CO_2H$            (I)

In Formula (I), $R^1$ and $R^2$ each independently represent a hydrogen atom, an alkyl group having 1 to 4 carbon atoms, or a group having at least one nitrogen-containing group, and $R^3$ represents a hydrogen atom, an alkyl group having 1 to 10 carbon atoms, or a group having at least one nitrogen-containing group.

However, at least one of $R^1$, $R^2$, or $R^3$ represents a group having at least one nitrogen-containing group.

Examples of the compound represented by Formula (I) include the following compounds.

Compounds in which $R^1$ represents a group having at least one nitrogen-containing group and $R^2$ and $R^3$ represent hydrogen atoms: lysine, 2,3-diaminobutyric acid, 2,4-diaminobutyric acid, ornithine, 2,3-diaminopropionic acid, 2,6-diaminoheptanoic acid, 4-methyllysine, 3-methyllysine, 5-hydroxylysine, 3-methyl-L-arginine, arginine, homoarginine, $N_5$-monomethyl-L-arginine, $N_5$-[imino(methylamino)methyl]-D-ornithine, canavanine, and histidine.

Compounds in which R$^1$ and R$^2$ represent a hydrogen atom and R$^3$ represents a group having at least one nitrogen-containing group: N-(2-aminoethyl)glycine and N-(2-aminopropyl)glycine.

Compounds in which R$^1$ represents a group having at least one nitrogen-containing group, R$^2$ represents a hydrogen atom, and R$^3$ represents an alkyl group having 1 to 10 carbon atoms: N$_2$-methyllysine and N$_2$-methyl-L-arginine.

Compounds in which R$^1$ and R$^3$ represent a group having at least one nitrogen-containing group and R$^2$ represents a hydrogen atom: N$_2$-(2-aminoethyl)-D-arginine and N$_2$-(2-aminoethyl)-L-arginine.

Compounds in which R$^1$ represents an alkyl having 1 to 4 carbon atoms, R$^2$ represents a group having at least one nitrogen-containing group, and R$^3$ represents a hydrogen atom: 2-methyllysine and 2-methyl-L-arginine.

The polycarboxylic acid is a compound having a plurality of carboxy groups in one molecule. However, the above-described polyaminopolycarboxylic acid is not included in the polycarboxylic acid.

Examples of the polycarboxylic acid include oxalic acid, citric acid, malonic acid, maleic acid, succinic acid, malic acid, tartrate acid, glutaric acid, adipic acid, pimelic acid, sebacic acid, citraconic acid, fumaric acid, and itaconic acid, where citric acid is preferable.

The monocarboxylic acid is a compound having only one carboxy group in one molecule. However, the above-described amino acids are not included in the monocarboxylic acid.

Examples of the monocarboxylic acid include lower (having 1 to 4 carbon atoms) aliphatic monocarboxylic acids such as formic acid, acetic acid, propionic acid, and butyric acid.

—Phosphonic Acid—

The phosphonic acid may be a monophosphonic acid having one phosphonic acid group in the molecule or may be a polyphosphonic acid having two or more phosphonic acid groups in the molecule.

The number of phosphonic acid groups contained in the phosphonic acid is preferably 2 to 5, more preferably 2 to 4, and still more preferably 2 or 3.

As the phosphonic acid, the compounds represented by General Formulae [1] to [3] described in paragraphs [0013] to [0023] of WO$_2$013/162020A, the compounds described in paragraphs [0026] to [0036] of WO$_2$018/020878A, or the compounds ((co) polymers) described in paragraphs [0031] to [0046] of WO$_2$018/030006A, the contents of which can be incorporated herein by reference, can be used.

Examples of the phosphonic acid include ethylidene diphosphonic acid, 1-hydroxyethylidene-1,1'-diphosphonic acid (HEDePO), 1-hydroxypropyridene-1,1'-diphosphonic acid, and 1-hydroxybutylidene-1,1'-diphosphonic acid, ethylaminobis(methylenephosphonic acid), dodecylaminobis(methylenephosphonic acid), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), acid), ethylenediaminetetra(ethylenephosphonic 1,3-propylenediaminetetra(methylenephosphonic acid) (PDTMP), 1,2-diaminopropanetetra(methylenephosphonic acid), 1,6-hexamethylenediaminetetra(methylenephosphonic acid), diethylenetriaminepenta(methylenephosphonic acid) (DEPPO), diethylenetriaminepenta(ethylenephosphonic acid), triethylenetetraminehexa(methylenephosphonic acid), and triethylenetetraminehexa(ethylenephosphonic acid), where HEDEPO is preferable.

—Sulfonic Acid—

The sulfonic acid may be a monosulfonic acid having only one sulfo group in the molecule or may be a polysulfonic acid having two or more sulfo groups in the molecule.

The number of sulfo groups contained in the sulfonic acid is preferably 1 or 2 and more preferably 1.

Examples of the sulfonic acid include methanesulfonic acid (MSA), ethanesulfonic acid, isethionic acid (2-hydroxyethanesulfonic acid), benzenesulfonic acid, and p-toluenesulfonic acid (tosylic acid), where methanesulfonic acid or isethionic acid is preferable.

The organic acid preferably has a low molecular weight. Specifically, the molecular weight of the organic acid is preferably 600 or less and more preferably 450 or less. The lower limit thereof is not particularly limited; however, it is preferably 85 or more.

In addition, the number of carbon atoms of the organic acid is preferably 15 or less, more preferably 12 or less, and still more preferably 8 or less. The lower limit thereof is not particularly limited; however, it is preferably 2 or more.

The organic acid is preferably the above-described polyaminopolycarboxylic acid, the above-described polycarboxylic acid, the above-described monocarboxylic acid, the above-described phosphonic acid, or the above-described sulfonic acid, and it is more preferably DTPA, EDTA, Cy-DTA, citric acid, acetic acid, HEDEPO, MSA, or isethionic acid.

One kind of the organic acid may be used alone, or two or more kinds thereof may be used in combination.

In a case where the treatment liquid contains an organic acid, the content of the organic acid is not particularly limited; however, it is preferably 0.001% to 90% by mass and more preferably 0.005% to 70% by mass with respect to the total mass of the treatment liquid.

The treatment liquid may contain a removing agent other than those described above. Examples of another removing agent include a compound having at least two nitrogen-containing groups and no carboxy group. Specific examples of such a compound include at least one biguanide compound selected from the group consisting of a compound having a biguanide group and a salt thereof.

In addition, as a removing agent, the chelating agent described in JP2017-504190A can also be used, and the content described in this document is incorporated in the present specification.

The removing agent is preferably at least one selected from the group consisting of a fluorine-containing compound, a hydroxylamine compound, a basic compound, and an acidic compound, and it is preferably at least one selected from the group consisting of hydrofluoric acid, ammonium fluoride, tetramethylammonium fluoride, a hydroxylamine compound, ammonium hydroxide, a water-soluble amine, a quaternary ammonium compound, sulfuric acid, hydrochloric acid, phosphoric acid, carboxylic acid, sulfonic acid, and phosphonic acid.

In addition, from the viewpoint of further improving the removal performance of dry etching residues in a case of being used as a washing solution, the treatment liquid preferably contains, as a removing agent, a water-soluble amine and at least one organic acid selected from the group consisting of a carboxylic acid (more preferably an amino acid or a polycarboxylic acid), a sulfonic acid, and a phosphonic acid, and it still more preferably contains at least one water-soluble amine selected from the group consisting of methylamine, ethylamine, propylamine, butylamine, pentylamine, methoxyethylamine, methoxypropylamine, 2-amino-2-methyl-1-propanol, and allylamine, and at least one organic acid selected from the group consisting of acetic acid, propionic acid, methanesulfonic acid, ethanesulfonic acid, allylglycine, maleic acid, citraconic acid, fumaric acid, and itaconic acid.

One kind of the removing agent may be used alone, or two or more kinds thereof may be used in combination.

The content of the removing agent is not particularly limited; however, it is preferably 0.001% to 90% by mass and more preferably 0.005% to 70% by mass with respect to the total mass of the treatment liquid.

[Optional Component]

The treatment liquid may further contain a component other than the above-described components. Hereinafter, optional components that may be contained in the treatment liquid will be described in detail.

<Oxidizing Agent>

The treatment liquid may contain an oxidizing agent. In a case where the treatment liquid is an etchant, the treatment liquid preferably contains an oxidizing agent.

Examples of the oxidizing agent include a peroxide such as hydrogen peroxide or peracetic acid, nitric acid, iodic acid, periodic acid, hypochlorous acid, chlorous acid, chloric acid, perchloric acid, persulfuric acid, bichromic acid, permanganic acid, ozone water, a silver (II) salt, and an iron (III) salt such as iron nitrate. The above-described oxidizing agent may form a salt with a counter ion.

The oxidizing agent that is contained in the treatment liquid is preferably hydrogen peroxide, nitric acid, peracetic acid, periodic acid, perchloric acid, chloric acid, hypochlorous acid, a cerium ammonium nitrate salt, iron nitrate, or ammonium persulfate, and it is more preferably hydrogen peroxide, nitric acid, peracetic acid, periodic acid, or perchloric acid.

One kind of the oxidizing agent may be used alone, or two or more kinds thereof may be used in combination.

In a case where the treatment liquid contains an oxidizing agent, the content of the oxidizing agent is preferably 0.1% to 20% by mass and more preferably 0.5% to 15% by mass with respect to the total mass of the treatment liquid.

<Corrosion Inhibitor>

The treatment liquid may contain a corrosion inhibitor, and it preferably contains a corrosion inhibitor.

The corrosion inhibitor has a function of preventing corrosion of a metal-containing layer due to over-etching or the like, by coordinating and forming a film on the surface of the metal-containing layer serving as wires of a semiconductor device.

It is noted that in the present specification, the above-described chelating agent (a compound having chelating ability) is not included in the corrosion inhibitor.

The corrosion inhibitor is not particularly limited. However, examples thereof include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyltriazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzoimidazole (2-MBI), 4-methyl-2-phenylimidazole, 2-mercaptothiazoline, 2,4-diamino-6-methyl-1,3,5-triazine, thiazole, imidazole, benzoimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, pyrazoles, propanethiol, silanes, benzohydroxamic acids, a heterocyclic nitrogen inhibitor, thiourea, 1,1,3,3-tetramethylurea, urea, urea derivatives, uric acid, potassium ethylxanthogenate, boric acid, 2,3,5-trimethylpyrazine, 2-ethyl-3,5-dimethylpyrazine, quinoxaline, acetylpyrrole, pyridazine, histadine, pyrazine, glutathione (reduced type), thiophene, mercaptopyridine N-oxide, thiamine HCl, tetraethylthiuam disulfide, catechol, t-butyl catechol, phenol, and pyrogallol.

The corrosion inhibitor is preferably a substituted or unsubstituted benzotriazole (hereinafter, also referred to as a "benzotriazole compound"). The substitution-type benzotriazole is preferably benzotriazole substituted with an alkyl group, an aryl group, a halogen group, an amino group, a nitro group, an alkoxy group, or a hydroxyl group. The substitution-type benzotriazole also includes those fused with one or more aryl groups (for example, a phenyl group) or a heteroaryl group.

Examples of the benzotriazole compound suitable as the corrosion inhibitor include benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole (5MBTA), benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl) benzotriazole.

In addition, examples of the benzotriazole compound include 2,2'-{[(4-methyl-1H-benzotriazole-1-yl)methyl]imino}bisethanol, 2,2'-{[(5-methyl-1H-benzotriazole-1-yl)methyl]imino}bisethanol, 2,2'-{[(4-methyl-1H-benzotriazole-1-yl)methyl]imino}bisethane, or 2,2'-{[(4-methyl-1H-benzotriazole-1-yl)methyl]imino}bispropane, and N,N-bis(2-ethylhexyl)-(4 or 5)-methyl-1H-benzotriazole-1-methylamine.

The corrosion inhibitor preferably includes at least one compound selected from the group consisting of a compound represented by Formula (A), a compound represented by Formula (B), a compound represented by Formula (C), and a substituted or unsubstituted tetrazole.

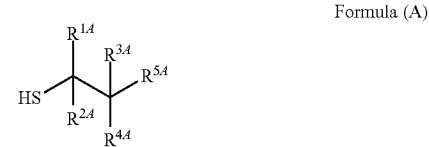

Formula (A)

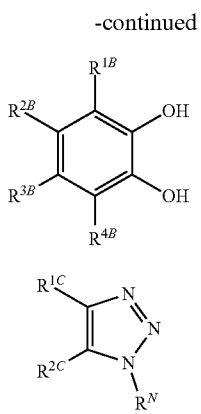

In Formula (A), $R^{1A}$ to $R^{5A}$ each independently represent a hydrogen atom, a substituted or unsubstituted hydrocarbon group, a hydroxyl group, a carboxy group, or a substituted or unsubstituted amino group. However, a structure of Formula (A) includes at least one group selected from the hydroxyl group, the carboxy group, or the substituted or unsubstituted amino group.

In Formula (B), $R^{1B}$ to $R^{4B}$ each independently represent a hydrogen atom or a substituted or unsubstituted hydrocarbon group.

In Formula (C), $R^{1C}$, $R^{2C}$, and $R^N$ each independently represent a hydrogen atom or a substituted or unsubstituted hydrocarbon group. In addition, $R^{1C}$ and $R^{2C}$ may be bonded to each other to form a ring.

In Formula (A), examples of the hydrocarbon represented by $R^{1A}$ to $R^{5A}$ include an alkyl group (preferably having 1 to 12 carbon atoms, more preferably 1 to 6 carbon atoms, and still more preferably 1 to 3 carbon atoms), an alkenyl group (preferably having 2 to 12 carbon atoms and more preferably 2 to 6 carbon atoms), an alkynyl group (preferably having 2 to 12 carbon atoms and more preferably 2 to 6 carbon atoms), an aryl group (preferably having 6 to 22 carbon atoms, more preferably 6 to 14, and still more preferably 6 to 10 carbon atoms), and an aralkyl group (preferably having 7 to 23 carbon atoms, more preferably 7 to 15 carbon atoms, and still more preferably 7 to 11 carbon atoms).

In addition, examples of the substituent in a case where the hydrocarbon group is substituted include a hydroxyl group, a carboxy group, and a substituted or unsubstituted amino group (the substituent in a case where the amino group is substituted is preferably an alkyl group having 1 to 6 carbon atoms and more preferably an alkyl group having 1 to 3 carbon atoms).

In addition, in Formula (A), at least one selected from a hydroxyl group, a carboxy group, or a substituted or unsubstituted amino group (the substituent in a case where the amino group is substituted is preferably an alkyl group having 1 to 6 carbon atoms and more preferably an alkyl group having 1 to 3 carbon atoms) is included in the structure.

In Formula (A), examples of the substituted or unsubstituted hydrocarbon group represented by $R^{1A}$ to $R^{5A}$ include a hydrocarbon group having 1 to 6 carbon atoms, which is substituted with a hydroxyl group, a carboxy group, or an amino group.

Examples of the compound represented by Formula (A) include 1-thioglycerol, L-cysteine, and thiomaleic acid.

In Formula (B), the substituted or unsubstituted hydrocarbon group represented by $R^{1B}$ to $R^{4B}$ has the same meaning as the substituted or unsubstituted hydrocarbon group represented by $R^{1A}$ to $R^{5A}$ of Formula (A) described above.

Examples of the substituted or unsubstituted hydrocarbon group represented by $R^{1B}$ to $R^{4B}$ include a hydrocarbon group having 1 to 6 carbon atoms, such as a methyl group, an ethyl group, a propyl group, or a t-butyl group.

Examples of the compound represented by Formula (B) include catechol and t-butyl catechol.

In Formula (C), the substituted or unsubstituted hydrocarbon group represented by $R^{1C}$, $R^{2C}$, and $R^N$ has the same meaning as the substituted or unsubstituted hydrocarbon group represented by $R^{1A}$ to $R^{5A}$ of Formula (A) described above.

Examples of the substituted or unsubstituted hydrocarbon group represented by $R^{1C}$, $R^{2C}$, and $R^N$ include a hydrocarbon group having 1 to 6 carbon atoms, such as a methyl group, an ethyl group, a propyl group, or a butyl group.

In addition, $R^{1C}$ and $R^{2C}$ may be bonded to each other to form a ring. Examples of the ring formed by bonding $R^{1C}$ and $R^{2C}$ to each other include a benzene ring. In a case where $R^{1C}$ and $R^{2C}$ are bonded to each other to form a ring, a substituent (for example, a hydrocarbon group having 1 to 5 carbon atoms) may be further contained.

Examples of the compound represented by Formula (C) include 1H-1,2,3-triazole, benzotriazole, 5-methyl-1H-benzotriazole, tolyltriazole, 2,2'-{[(4-methyl-1H-benzotriazole-1-yl)methyl]imino}bisethanol (product name "IRGAMET 42", manufactured by BASF SE), and N,N-bis(2-ethylhexyl)-(4 or 5)-methyl-1H-benzotriazole-1-methylamine (product name "IRGAMET 39", manufactured by BASF SE), where benzotriazole, 5-methyl-1H-benzotriazole, or tolyltriazole is preferable, and 5-methyl-1H-benzotriazole is more preferable, from the viewpoint that the effect of the present invention is more excellent.

Examples of the substituted or unsubstituted tetrazole include an unsubstituted tetrazole and a tetrazole having, as a substituent, a hydroxyl group, a carboxy group, or a substituted or unsubstituted amino group. Here, the substituent in a case where the amino group is substituted is preferably an alkyl group having 1 to 6 carbon atoms and more preferably an alkyl group having 1 to 3 carbon atoms.

One kind of the corrosion inhibitor may be used alone, or two or more kinds thereof may be used in combination.

In a case where the treatment liquid contains a corrosion inhibitor, the content of the corrosion inhibitor in the treatment liquid is preferably 0.001% to 10% by mass, more preferably 0.002% to 5% by mass, and still more preferably 0.05% to 1% by mass with respect to the total mass of the treatment liquid. In a case where two or more kinds of the corrosion inhibitors are used in combination, the total amount thereof is preferably within the above-described range.

As the corrosion inhibitor, a corrosion inhibitor of a high-purity grade is preferably used, which is more preferably used by being further purified.

The method of purifying the corrosion inhibitor is not particularly limited. However, for example, a known method such as filtration, ion exchange, distillation, adsorption purification, recrystallization, reprecipitation, sublimation, or purification using a column is used, and this method can be also applied in combination.

<Surfactant>

The treatment liquid may contain a surfactant.

The treatment liquid preferably contains a surfactant from the viewpoint that the corrosion prevention performance (particularly, the corrosion prevention performance for a Ti alloy metal film) is excellent.

The surfactant is not particularly limited as long as it is a compound having a hydrophilic group and a hydrophobic group (a lipophilic group) in the molecule. Examples thereof include an anionic surfactant, a cationic surfactant, a nonionic surfactant, and an amphoteric surfactant, where an anionic surfactant is preferable from the viewpoint that the corrosion prevention performance (particularly, the corrosion prevention performance for a Ti alloy metal film) is more excellent.

In a large number of cases, the surfactant has a hydrophobic group selected from an aliphatic hydrocarbon group, an aromatic hydrocarbon group, and a combination thereof. The hydrophobic group contained in the surfactant is not particularly limited; however, in a case where the hydrophobic group includes an aromatic hydrocarbon group, it preferably has 6 or more carbon atoms and more preferably has 10 or more carbon atoms. In a case where the hydrophobic group does not include an aromatic hydrocarbon group and is composed only of an aliphatic hydrocarbon group, it preferably has 10 or more carbon atoms and more preferably 12 or more carbon atoms. The upper limit of the number of carbon atoms of the hydrophobic group is not particularly limited; however, it is preferably 20 or less.

(Anionic Surfactant)

Examples of the anionic surfactant include a phosphoric acid ester-based surfactant, a phosphonic acid-based surfactant, a sulfonic acid-based surfactant, a carboxylic acid-based surfactant, and a sulfuric acid ester-based surfactant.

Examples of the phosphoric acid ester-based surfactants include a phosphoric acid ester (an alkyl phosphoric acid ester and an aryl phosphoric acid ester), a mono- or polyoxyalkylene ether phosphoric acid ester (a mono- or polyoxyalkylene alkyl ether phosphoric acid ester and a mono- or polyoxyalkylene aryl ether phosphoric acid ester), and salts thereof. Among them, at least one selected from the group consisting of an alkyl phosphoric acid ester, a mono- or polyoxyalkyl ether phosphoric acid ester, or a salt thereof is preferable.

Examples of the salt of the phosphoric acid ester-based surfactant include a sodium salt, a potassium salt, an ammonium salt, and an organic amine salt.

The monovalent alkyl group contained in the alkyl phosphoric acid ester and the mono- or polyoxyalkylene alkyl ether phosphoric acid ester include an alkyl group having 6 to 22 carbon atoms, where an n alkyl group having 10 to 20 carbon atoms is preferable.

Examples of the monovalent aryl group contained in the aryl phosphoric acid ester and the mono- or polyoxyalkylene aryl ether phosphoric acid ester include an aryl having 6 to 14 carbon atoms, which may have an alkyl group, where a phenyl group which may have an alkyl group is preferable.

Examples of the divalent alkylene group contained in the mono- or polyoxyalkylene alkyl ether phosphoric acid ester and the mono- or polyoxyalkylene aryl ether phosphoric acid ester include an alkylene group having 2 to 6 carbon atoms, where an ethylene group or a propylene group, and an ethylene group is more preferable. The number of repetitions of the oxyalkylene group is preferably 1 to 12 and more preferably 1 to 10.

More specific examples of the phosphoric acid ester-based surfactant include an octyl phosphoric acid ester, a lauryl phosphoric acid ester, a tridecyl phosphoric acid ester, a myristyl phosphoric acid ester, a cetyl phosphoric acid ester, a stearyl phosphate, a mono- or polyoxyethylene octyl ether phosphoric acid ester, a mono- or polyoxyethylene lauryl ether phosphoric acid ester, and a mono or polyoxyethylene tridecyl ether phosphoric acid ester. Among them, a lauryl phosphoric acid ester or a mono- or polyoxyethylene lauryl ether phosphoric acid ester is preferable.

In addition, as the phosphoric acid ester-based surfactant, the compounds described in paragraphs to of JP2011-040502A, the contents of which can be incorporated herein by reference, can also be used.

Examples of the phosphonic acid-based surfactant include an alkyl phosphonic acid and a polyvinyl phosphonic acid, as well as aminomethyl phosphonic acid described in JP2012-057108A and the like.

Examples of the sulfonic acid-based surfactant include an alkylsulfonic acid, an alkylbenzenesulfonic acid, an alkylnaphthalenesulfonic acid, an alkyl diphenyl ether disulfonic acid, an alkylmethyl taurine, a sulfosuccinic acid diester, a polyoxyalkylene alkyl ether sulfonic acid, and a salt thereof.

Specific examples of the sulfonic acid-based surfactant include hexanesulfonic acid, octanesulfonic acid, decanesulfonic acid, dodecanesulfonic acid, toluenesulfonic acid, cumenesulfonic acid, octylbenzenesulfonic acid, dodecylbenzenesulfonic acid (DBSA), dinitrobenzenesulfonic acid (DNBSA), and lauryldodecylphenyl ether disulfonic acid (LDPEDSA), as well as salts thereof, where dodecylbenzenesulfonic acid is preferable.

Examples of the carboxylic acid-based surfactant include an alkylcarboxylic acid, an alkylbenzenecarboxylic acid, a polyoxyalkylene alkyl ether carboxylic acid, and a salt thereof.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

Examples of the sulfuric acid ester-based surfactant include a sulfuric acid ester (an alkyl ether sulfate ester), a polyoxyalkylene ether sulfuric acid ester, and a salt thereof.

Specific examples of the sulfuric acid ester-based surfactant include lauryl sulfate, myristyl sulfate, and polyoxyethylene lauryl ether sulfate.

The anionic surfactant is preferably a phosphoric acid ester-based surfactant, a sulfonic acid-based surfactant, a phosphonic acid-based surfactant, or a carboxylic acid-based surfactant, and it is more preferably a sulfonic acid-based surfactant.

In addition, from the viewpoint that the corrosion prevention performance for a TiAlC film is more excellent, the anionic surfactant is preferably a phosphoric acid ester-based surfactant, a sulfonic acid-based surfactant, a carboxylic acid-based surfactant, or a sulfuric acid ester-based surfactant, more preferably a phosphoric acid ester-based surfactant or a carboxylic acid-based surfactant, and still more preferably a phosphoric acid ester-based surfactant.

(Cationic Surfactant)

Examples of the cationic surfactant include primary to tertiary alkylamine salts (for example, monostearylammonium chloride, distearylammonium chloride, and tristearylammonium chloride) and modified aliphatic polyamines (for example, polyethylene polyamine).

(Nonionic Surfactant)

Examples of the nonionic surfactant include a polyoxyalkylene alkyl ether, a polyoxyalkylene alkenyl ether, a polyoxyethylene alkyl phenyl ether, a polyoxyalkylene glycol, a polyoxyalkylene monoalkylate, a polyoxyalkylene dialkylate, a bispolyoxyalkylene alkylamide, a sorbitan fatty acid ester, a polyoxyethylene sorbitan fatty acid ester, a polyoxyethylene alkylamine, a glycerin fatty acid ester, an oxyethyleneoxypropylene block copolymer, an acetylene glycol-based surfactant, and an acetylene-based polyoxyethylene oxide.

(Amphoteric Surfactant)

Examples of the amphoteric surfactant include carboxybetaine (for example, an alkyl-N,N-dimethylaminoacetic acid betaine and an alkyl-N,N-dihydroxyethylaminoacetic acid betaine), sulfobetaine (for example, an alkyl-N,N-dimethylsulfoethyleneammonium betaine), and imidazolinium betaine (for example, a 2-alkyl-N-carboxymethyl-N-hydroxyethyl imidazolinium betaine).

As the surfactant, the compounds described in paragraphs [0092] to [0096] of JP2015-158662A, paragraphs [0045] and [0046] of JP2012-151273A, and paragraphs [0014] to [0020] of JP2009-147389A, the contents of which are incorporated herein by reference, can also be used.

One kind of the surfactant may be used alone, or two or more kinds thereof may be used in combination. In a case where the treatment liquid contains a surfactant, the content thereof is preferably 0.001% to 1% by mass and more preferably 0.005% to 0.5% by mass with respect to the total mass of the treatment liquid from the viewpoint that the effect of the present invention is more excellent.

<Antifoaming Agent>

The treatment liquid may contain an antifoaming agent. The surfactant may cause foaming depending on the usage. As a result, it is preferable that the treatment liquid containing a surfactant contains an antifoaming agent that suppresses the occurrence of foaming, shortens the life of the generated foam, and suppresses foam residue.

The antifoaming agent is not particularly limited as long as the effect of the present invention is not impaired, and examples thereof include a silicone-based antifoaming agent, an acetylenediol-based antifoaming agent, a fatty acid ester-based antifoaming agent, a long-chain aliphatic alcohol-based antifoaming agent, and a polyether-based antifoaming agent. Among them, a silicone-based antifoaming agent is preferable, and a silicone-based antifoaming agent having a high molecular weight is more preferable, from the viewpoint that the effect of suppressing foam residue is more excellent.

The antifoaming agent shall not include the compound included in the above-described surfactant.

The silicone-based antifoaming agent is an antifoaming agent consisting of a compound having a polysiloxane structure.

Examples of the silicone-based antifoaming agent include an oil type, an oil compound type, a solution type, an emulsion type, and a self-emulsification type. Examples of the silicone-based antifoaming agent include polydimethylsiloxane, silicone glycol, and fluorosilicone. Examples of the long-chain aliphatic alcohol-based antifoaming agent include an aliphatic alcohol having 7 to 22 carbon atoms.

Examples of the antifoaming agent available on the market include KM-73A, KA-540, and KF-6701 (all of which are a silicone-based antifoaming agents) manufactured by Shin-Etsu Chemical Co., Ltd.; KS-508, KS-531, KM-72, and KM-85, manufactured by Shin-Etsu Chemical Co., Ltd.; Surfynol (registered trade name) MD20 (an acetylenediol-based antifoaming agent) manufactured by Evonic Chemicals; BYK-012 (a polydimethylsiloxane-based antifoaming agent), BYK-014 (a polydimethylsiloxane-based antifoaming agent), BYK-019, BYK-020, BYK-025, BYK-080A, BYK-094, BYK-1650, and BYK-1660 (silicone-based antifoaming agents), manufactured by BYK Additives & Instruments; Q-23183A and SH5510 (both are a silicone-based antifoaming agent) manufactured by DuPont Toray Specialty Materials K.K.; SAG30 (a silicone-based antifoaming agent) manufactured by Nippon Unicar Company Limited; and ADEKA NATE series (silicone-based antifoaming agents), manufactured by Asahi Denka Kogyo Co., Ltd.

One kind of the antifoaming agent may be used alone, or two or more kinds thereof may be used in combination. In a case where the treatment liquid contains an antifoaming agent, the content thereof is preferably 0.0001% to 1% by mass, more preferably 0.001% to 0.5% by mass, and still more preferably 0.005% to 0.1% by mass, with respect to the total mass of the treatment liquid from the viewpoint of the more excellent suppression of foam residue.

<Organic Solvent>

The treatment liquid may contain an organic solvent, and it preferably contains an organic solvent.

The organic solvent is preferably a water-soluble organic solvent. The description that the organic solvent is water-soluble means that water and the organic solvent at 25° C. can be mixed (dissolved) at any ratio.

Examples of the organic solvent include an alcohol-based solvent, a ketone-based solvent, an ester-based solvent, an ether-based solvent (for example, a glycol diether), a sulfone-based solvent, a sulfoxide-based solvent, a nitrile-based solvent, and an amide-based solvent.

These solvents may be water-soluble.

Among them, the treatment liquid preferably contains one or more kinds of organic solvents selected from the group consisting of an alcohol-based solvent, a ketone-based solvent, an ester-based solvent, and an ether-based solvent.

Examples of the alcohol-based solvent include an alkanediol (including, for example, an alkylene glycol), an alkoxyalcohol (including, for example, a glycol monoether), a saturated aliphatic monohydric alcohol, an unsaturated non-aromatic monovalent alcohol, and a low molecular weight alcohol containing a ring structure.

Among them, the alcohol-based solvent is preferably a glycol monoether or a saturated aliphatic monohydric alcohol.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and an alkylene glycol.

Examples of the alkylene glycol include ethylene glycol, propylene glycol, hexylene glycol, diethylene glycol, dipropylene glycol, triethylene glycol, and tetraethylene glycol, where propylene glycol or hexylene glycol is preferable.

Examples of the alkoxyalcohol include 3-methoxy-3-methyl-1-butanol, 3-methoxy-1-butanol, 1-methoxy-2-butanol, and a glycol monoether, where a glycol monoether is preferable.

Examples of the glycol monoether include ethylene glycol mono C1-C4 alkyl ethers such as ethylene glycol monomethyl ether, ethylene glycol monoethyl ether, ethylene glycol mono-n-propyl ether, ethylene glycol monoisopropyl ether, and ethylene glycol monobutyl ether; diethylene glycol mono C1-C4 alkyl ethers such as diethylene glycol monomethyl ether, diethylene glycol monoethyl ether, and diethylene glycol monobutyl ether; triethylene glycol mono C1-C4 alkyl ethers such as triethylene glycol monomethyl ether, triethylene glycol monoethyl ether, and triethylene glycol monobutyl ether; and 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Among them, an ethylene glycol mono C1 to C4 alkyl ether is preferable, and ethylene glycol monomethyl ether, ethylene glycol monoethyl ether, or ethylene glycol monobutyl ether is more preferable.

Examples of the saturated aliphatic monovalent alcohol include methanol, ethanol, n-propyl alcohol, isopropyl alcohol, 1-butanol, 2-butanol, isobutyl alcohol, tert-butyl alcohol, 2-pentanol, t-pentyl alcohol, and hexanol.

Examples of the unsaturated non-aromatic monovalent alcohol include allyl alcohol, propargyl alcohol, 2-butenyl alcohol, 3-butenyl alcohol, and 4-penten-2-ol.

Examples of the low molecular weight alcohol containing a ring structure include tetrahydrofurfuryl alcohol, furfuryl alcohol, and 1,3-cyclopentanediol.

Examples of the ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of the ester-based solvent include ethyl acetate, butyl acetate, a glycol monoester such as ethylene glycol monoacetate or diethylene glycol monoacetate, and a glycol monoether monoester such as propylene glycol monomethyl ether acetate, ethylene glycol monomethyl ether acetate, propylene glycol monoethyl ether acetate, or ethylene glycol monoethyl ether acetate.

Examples of the sulfone-based solvent include sulfolane, 3-methylsulfolane, and 2,4-dimethylsulfolane, where sulfolane is preferable.

Examples of the sulfoxide-based solvent include dimethyl sulfoxide.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, $\varepsilon$-caprolactam, formamide, N-methylformamide, acetamide, N-methylacetamide, N,N-dimethylacetamide, N-methylpropanamide, and hexamethylphosphoric triamide.

One kind of the organic solvent may be used alone, or two or more kinds thereof may be used in combination.

In a case where the treatment liquid contains an organic solvent, the content of the organic solvent is preferably 0.1% to 99% by mass and more preferably 1% to 90% by mass with respect to the total mass of the treatment liquid.

<Metal Component>

The treatment liquid may contain a metal component.

Examples of the metal component include metal particles and metal ions. For example, in a case of being referred to as the content of the metal component, it indicates the total content of metal particles and metal ions.

The treatment liquid may contain either metal particles or metal ions, or it may contain both metal particles and metal ions.

Examples of the metal atom contained in the metal component include an metal atom selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one kind of metal atom or two or more kinds thereof.

The metal particle may be a single body or an alloy or may be present in a form in which the metal is associated with an organic substance.

The metal component may be a metal component unavoidably contained in each component (raw material) contained in the treatment liquid or may be a metal component unavoidably contained during the production, storage, and/or transfer of the treatment liquid, and it may be added intentionally.

In a case where the treatment liquid contains a metal component, the content of the metal component is 0.01 ppt by mass to 10 ppm by mass with respect to the total mass of the treatment liquid in a large number of cases, and it is preferably 0.1 ppt by mass to 1 ppm by mass and more preferably 0.1 ppt by mass to 100 mass ppb.

It is noted that the kind and content of the metal component in the treatment liquid can be measured by an SP-ICP-MS method (single nano particle inductively coupled plasma mass spectrometry).

Here, the SP-ICP-MS method is different from a general SP-ICP-MS method (an inductive coupling plasma mass analysis method) only in data analysis but uses the same apparatus as in the general SP-ICP-MS method. The data analysis of the SP-ICP-MS method can be carried out by commercially available software.

In the ICP-MS method, the content of the metal component to be measured is measured regardless of the existence form thereof. As a result, the total mass of metal particles to be measured and metal ions is quantified as the content of the metal component.

On the other hand, in the SP-ICP-MS method, the content of the metal particles can be measured. As a result, the content of the metal ions in the sample can be calculated by subtracting the content of the metal particles from the content of the metal component in the sample.

Regarding a measuring method by the SP-ICP-MS method, it is possible to carry out measurement according to the method described in Examples, for example, by using an Agilent 8800 triple quadrupole ICP-MS (inductively coupled plasma mass spectrometry, for semiconductor analysis, option #200) manufactured by Agilent Technologies, Inc.). As an apparatus other than those described above, NextION350S manufactured by Perkin Elmer, Inc., and Agilent 8900 manufactured by Agilent Technologies, Inc. can also be used.

The method of adjusting the content of each metal component in the treatment liquid is not particularly limited. For example, the content of the metal component in the treatment liquid can be reduced by carrying out a known treatment of removing a metal from the treatment liquid and/or from a raw material containing each component that is used in the preparation of the treatment liquid. In addition, the content of the metal component in the treatment liquid can be increased by adding a compound containing metal ions to the treatment liquid.

The treatment liquid may contain an additive other than the above components. Examples of the additive include a surfactant, an antifoaming agent, a rust inhibitor, and a preservative.

It is noted that the content of each of the components (excluding the metal component) in the treatment liquid can be measured by a known method such as a gas chromatography-mass spectrometry (GC-MS) method, a liquid chromatography-mass spectrometry (LC-MS) method, or an ion-exchange chromatography (IC) method.

[Physical Properties of Treatment Liquid]

<pH>

The pH of the treatment liquid is not particularly limited; however, it is preferably 0 to 14 and more preferably 6 to 12. In a case where the pH of the treatment liquid is 6 or more, the corrosion prevention effect of the cobalt-containing layer is further improved, and in a case where the pH of the treatment liquid is 12 or less, the corrosion prevention effect of the tungsten-containing layer is further improved.

The pH of the treatment liquid is a value obtained by carrying out the measurement at 25° C. using a known pH meter.

<Coarse Particle>

It is preferable that the treatment liquid is substantially free of coarse particles.

The coarse particles refer to particles having a diameter of 0.2 μm or more in a case where the shape of the particles is regarded as a sphere. In addition, a case of being substantially free of coarse particles refers to that ten or fewer particles of 0.2 μm or more are present in 1 mL of the treatment liquid in a case where the treatment liquid is subjected to measurement using a commercially available measuring device in the light scattering type in-liquid particle measuring method.

It is noted that the coarse particles contained in the treatment liquid are particles or the like of dirt, dust, organic solids, inorganic solids, and the like contained as impurities in raw materials, and particles of dirt, dust, and organic solids, and inorganic solids brought in as contaminants during the preparation of the treatment liquid, which correspond to the particles that are finally present as particles without being dissolved in the treatment liquid.

The amount of the coarse particles present in the treatment liquid can be measured in the liquid phase using a commercially available measuring device in a light scattering type in-liquid particle measuring method using a laser as a light source.

Examples of the method of removing coarse particles include a purification treatment such as filtering.

[Kit and Concentrated Solution]

The raw materials of the treatment liquid may be divided into a plurality of parts to be used as a kit for preparing the treatment liquid. Although not particularly limited, specific examples of the method using the treatment liquid as a kit include an aspect in which a liquid composition containing water and a removing agent as the first liquid is prepared, and a liquid composition containing the resin (A) as the second liquid is prepared.

The content of each component included in the first liquid and the second liquid provided in the kit is not particularly limited; however, the content of each component in the treatment liquid prepared by mixing the first liquid and the second liquid is preferably an amount corresponding to the preferred amount described above.

The pH of each of the first liquid and the second liquid provided in the kit is not particularly limited, and it suffices that the pH is adjusted so that the pH of the treatment liquid prepared by mixing the first liquid and the second liquid is a desired value.

In addition, the treatment liquid may be prepared as a concentrated solution. In this case, it can be diluted with a diluent liquid before the time of use. That is, a kit may include the treatment liquid in the form of a concentrated solution and a diluent liquid.

The diluent liquid is preferably a liquid selected from the group consisting of water, isopropanol, a mixed solution of water and isopropanol, and a solvent containing ammonium hydroxide (more preferably water, isopropanol, or a mixed solution of water and isopropanol).

The dilution ratio of the concentrated solution is not particularly limited; however, it is preferably 1 to 2,000 times and more preferably 1 to 100 times.

[Use Application]

Next, the use application of the treatment liquid involved in the above-described embodiment will be described.

The treatment liquid is a treatment liquid for a semiconductor device. In the present specification, "for a semiconductor device" means that it is used in the manufacture of a semiconductor device. The treatment liquid can be used in any step for manufacturing a semiconductor device and can be used, for example, for treating an insulating film, a resist film, an antireflection film, an etching residue, an ashing residue, and the like, which are present on a substrate. It is noted that in the present specification, the etching residue and the ashing residue are collectively referred to as residues. In addition, the treatment liquid may be used in an etching treatment for removing a metal-containing substance on a substrate or may be used in a treatment of a substrate after chemical mechanical polishing.

For example, the treatment liquid can be used as a pre-wet liquid to be applied on a substrate to improve the coatability of an actinic ray-sensitive or radiation-sensitive composition before the step of forming a resist film using the composition, a washing solution that is used for removing residues that have adhered on a metal layer, a solution (for example, a removal liquid, a stripping liquid, or the like) that is used for removing various resist films for pattern formation, a solution (for example, a removal liquid, a stripping liquid, or the like) that is used for removing a permanent film (for example, a color filter, a transparent insulating film, a lens made of a resin) or the like from a semiconductor substrate, or the like. It is noted that since the semiconductor substrate after the removal of the permanent film may be used again for the use of the semiconductor device, the removal of the permanent film is included in the manufacturing step of the semiconductor device.

In addition, the treatment liquid can also be used as a washing solution that is used for removing residues such as metal impurities or fine particles from a substrate after chemical mechanical polishing.

In addition, the treatment liquid can also be used as an etchant for a metal-containing substance (including a metal oxide and a composite oxide consisting of a plurality of metal oxides) on a substrate.

Among the above-described applications, in particular, it can be suitably used as a washing solution for removing etching residues, a solution for removing a resist film used in a pattern formation, a washing solution for removing residues from a substrate after chemical mechanical polishing, or an etchant.

The treatment liquid may be used in only one use application or two or more of use applications among the above-described use applications.

The treatment liquid can also be used for treating a substrate of a semiconductor device, including a metal layer containing Co, a substrate of a semiconductor device, including a metal layer containing W, or a substrate of a semiconductor device, including a metal layer containing Cu. Further, since the treatment liquid has a corrosion prevention property with respect to an insulating film, it can also be used, for example, for treating a substrate of a semiconductor device which includes a layer containing at least one selected from the group consisting of $SiO_x$, SiN, and SiOC (x represents a number of 1 to 3).

[Production Methods for Treatment Liquid, Concentrated Solution, and Kit]

<Treatment Liquid Preparation Step>

The production method for the treatment liquid is not particularly limited, and a known production method can be used. Examples of the production method for the above-described treatment liquid include a method having at least a treatment liquid preparation step of mixing the above-described components to prepare the treatment liquid.

In the treatment liquid preparation step, the order in which the respective components are mixed is not particularly limited. It is preferable that each of the liquids provided in the kit and the concentrated solution is also produced according to the same method as described above.

The method for producing the kit is not particularly limited. For example, after preparing the first liquid and the second liquid described above, the first liquid and the second liquid are respectively accommodated in containers different from each other to produce a kit for preparing the treatment liquid.

<Filtration Step>

It is preferable that the production method includes a filtration step of filtering a liquid in order to remove foreign matters, coarse particles, and the like from the liquid.

The filtration method is not particularly limited, and a known filtration method can be used. Among the above, filtering using a filter is preferable.

The filter that is used for filtering can be used without particular limitation as long as it is a filter that is conventionally used in the use application of filtering and the like. Examples of the material constituting the filter include a fluororesin such as polytetrafluoroethylene (PTFE), a polyamide-based resin such as nylon, and a polyolefin-based resin (having a high density and an ultrahigh molecular weight) such as polyethylene or polypropylene (PP). Among them, a polyamide-based resin, PTFE, and polypropylene (including high-density polypropylene) are preferable.

In a case of using a filter formed from these materials, it is possible to more effectively remove foreign matters having high polarity, which are likely to cause defects, from the treatment liquid.

The lower limit value of the critical surface tension of the filter is preferably 70 mN/m or more, and the upper limit value thereof is preferably 95 mN/m or less. In particular, the critical surface tension of the filter is preferably 75 to 85 mN/m.

It is noted that the value of the critical surface tension is a nominal value of a manufacturer. In a case of using a filter having a critical surface tension in the above range, it is possible to more effectively remove foreign matters having high polarity, which are likely to cause defects, from the treatment liquid.

The pore diameter of the filter is preferably about 0.001 to 1.0 µm, more preferably about 0.02 to 0.5 µm, and still more preferably about 0.01 to 0.1 µm. In a case of setting the pore diameter of the filter within the above range, it is possible to reliably remove fine foreign matters contained in the treatment liquid while suppressing filtration clogging.

In a case of using a filter, different filters may be combined. In this case, filtering with a first filter may be carried out only once or may be carried out twice or more times. In a case where different filters are combined and filtering is carried out two or more times, the kinds of filters may be the same or different from each other; however, the kinds of filters are preferably different from each other. Typically, it is preferable that at least one of the pore diameter or the constitutional material is different between the first filter and the second filter.

It is preferable that the pore diameters of the second and subsequent filtering are equal to or smaller than the pore diameter of the first filtering. In addition, the first filters having different pore diameters within the above range may be combined. With regard to the pore diameters herein, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), and Kitz Micro Filter Corporation. In addition, the following filters can also be used: "P-nylon filter (pore diameter: 0.02 µm, critical surface tension: 77 mN/m)" made of polyamide (manufactured by Nihon Pall Ltd.); "PE clean filter (pore diameter: 0.02 µm)" made of high-density polyethylene (manufactured by Nihon Pall Ltd.); and "PE clean filter (pore diameter: 0.01 µm)" made of high-density polyethylene (manufactured by Nihon Pall Ltd.).

As the second filter, a filter formed of the same material as that of the first filter can be used. A filter having the same pore diameter as that of the first filter described above can be used. In a case where the second filter having a pore diameter smaller than that of the first filter is used, the ratio of the pore diameter of the second filter to the pore diameter of the first filter (the pore diameter of the second filter/the pore diameter of the first filter) is preferably 0.01 to 0.99, more preferably 0.1 to 0.9, and still more preferably 0.3 to 0.9. In a case of setting the pore diameter of the second filter within the above range, fine foreign matters mixed in the treatment liquid are more reliably removed.

For example, filtering with the first filter may be carried out with a mixed liquid containing a part of components of the treatment liquid, and after mixing the remaining components with the mixed liquid to prepare the treatment liquid, the second filtering may be carried out.

In addition, it is preferable that the filter to be used is treated before filtering the treatment liquid. The liquid that is used for this treatment is not particularly limited; however, it is preferably the treatment liquid or a liquid containing components that are contained in the concentrated solution and the treatment liquid.

In a case of carrying out filtering, the upper limit value of the temperature during filtering is preferably room temperature (25° C.) or lower, more preferably 23° C. or lower, and still more preferably 20° C. or lower. The lower limit value of the temperature at the time of filtering is preferably 0° C. or higher, more preferably 5° C. or higher, and still more preferably 10° C. or higher.

In the filtering, particulate foreign matters and/or impurities can be removed. However, in a case where the filtering is carried out at the above temperature, the amount of the particulate foreign matters and/or impurities dissolved in the treatment liquid is reduced, and thus the filtering is carried out more efficiently.

<Destaticization Step>

The above-described production method may further include a destaticization step of destaticizing at least one selected from the group consisting of a treatment liquid, a concentrated solution, and a kit. A specific method for destaticization will be described later.

It is preferable that all the steps involved in the production method are carried out in a clean room. It is preferable that the clean room satisfies 14644-1 clean room standards. It is preferable that the clean room satisfies any one of the International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

<Container>

The container that accommodates the above-described treatment liquid, concentrated solution, or kit is not particularly limited as long as the corrosiveness due to the liquid does not cause a problem, and a known container can be used.

The container is preferably a container for a use application in a semiconductor, which has high internal cleanliness and hardly causes elution of impurities.

Specific examples of the container include "CLEAN BOTTLE" series manufactured by AICELLO CHEMICAL Co., Ltd. and "PURE BOTTLE" manufactured by KODAMA PLASTICS Co., Ltd. In addition, for the intended purpose of preventing the mixing (contamination) of raw materials and impurities into the chemical liquid, it is also preferable to use a multi-layer container in which an inner wall of the container has a six-layer structure consisting of six kinds of resins and a multi-layer container in which an inner wall of the container has a seven-layer structure consisting of six kinds of resins. Examples of these containers include a container described in JP2015-123351A, which are not limited thereto.

The inner wall of the container is preferably formed of or coated with one or more resins selected from the group consisting of a polyethylene resin, a polypropylene resin, and a polyethylene-polypropylene resin, a resin different from these, and a metal such as stainless steel, HASTELLOY, INCONEL, or MONEL.

As the above-described different resin, a fluorine-based resin (a perfluororesin) can be preferably used. In this manner, by using a container in which an inner wall of the container is formed of a fluorine-based resin or coated with a fluororesin, the occurrence of a problem of elution of ethylene or propylene oligomers can be suppressed, as compared with a case of using a container in which an inner wall of the container is formed of or coated with a polyethylene resin, a polypropylene resin, or a polyethylene-polypropylene resin.

Specific examples of such a container having an inner wall include a FluoroPure PFA composite drum manufactured by Entegris Inc. In addition, it is also possible to use the containers described on page 4 of the pamphlet of JP1991-502677A (JP-H3-502677A), page 3 of the pamphlet of WO2004/016526A, pages 9 and 16 of the WO99/046309A, and the like.

Further, for the inner wall of the container, quartz and an electropolished metal material (that is, a completely electropolished metal material) are also preferably used, in addition to the above-described fluorine-based resin.

The metal material used that is for producing the electropolished metal material is preferably a metal material which contains at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is preferably 25% by mass or more and more preferably 30% by mass or more with respect to the total mass of the metal material.

It is noted that the upper limit value of the total content of Cr and Ni in the metal material is not particularly limited; however, it is generally preferably 90% by mass or less.

The stainless steel is not particularly limited, and known stainless steel can be used. Among them, an alloy containing nickel at 8% by mass or more is preferable, and austenitic stainless steel containing nickel at 8% by mass or more is more preferable. Examples of the austenitic stainless steels include SUS (Steel Use Stainless) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

The nickel-chromium alloy is not particularly limited, and known nickel-chromium alloys can be used. Among them, a nickel-chromium alloy having a nickel content of 40% to 75% by mass and a chromium content of 1% to 30% by mass is preferable.

Examples of the nickel-chromium alloy include HASTELLOY (product name, the same applies hereinafter), MONEL (product name, the same applies hereinafter), and INCONEL (product name, the same applies hereinafter). More specific examples thereof include HASTELLOY C-276 (Ni content: 63% by mass, Cr content: 16% by mass), HASTELLOY-C (Ni content: 60% by mass, Cr content: 17% by mass), and HASTELLOY C-22 (Ni content: 61% by mass, Cr content: 22% by mass).

In addition, the nickel-chromium alloy may further contain boron, silicon, tungsten, molybdenum, copper, cobalt, and the like as necessary, in addition to the above alloys.

A method of electropolishing a metal material is not particularly limited, and known methods can be used. For example, the methods described in paragraphs [0011] to [0014] of JP2015-227501A, paragraphs [0036] to [0042] of JP2008-264929A, or the like can be used.

In a case where the metal material is electropolished, it is presumed that a content of chromium in a passivation layer on a surface becomes larger than a content of chromium in a primary phase. As a result, it is presumed that since the metal element is unlikely to flow out into the treatment liquid from the inner wall coated with the electropolished metal material, the treatment liquid in which the specific metal element is reduced can be obtained.

The metal material is preferably subjected to buff polishing. A method of buff polishing is not particularly limited, and known methods can be used. The size of abrasive grains for polishing used for buff polishing finish is not particularly limited; however, it is preferably #400 or less from the viewpoint that then unevenness of the surface of the metal material is easily reduced.

The buff polishing is preferably carried out before the electropolishing.

In addition, the metal material may be treated by combining one or two or more of a plurality of stages of buff polishing, acid washing, magnetic fluid polishing, and the like, which are carried out by changing the count of the size or the like of the abrasive grains.

It is preferable to wash the inside of these containers before being filled. The liquid that is used for washing may be appropriately selected according to the intended use; however, it is preferably the treatment liquid, a liquid obtained by diluting the treatment liquid, or a liquid containing at least one of the components which are added to the treatment liquid.

In order to prevent the change in the components in the treatment liquid during storage, the inside of the container may be replaced with inert gas (nitrogen, argon, or the like) with a purity of 99.99995% by volume or more. In particular, a gas having a low moisture content is preferable. Although the liquid container body may be transported and stored at normal temperature, the temperature may be controlled in a range of −20° C. to 20° C. in order to prevent deterioration.

[Substrate Treatment Method]

In a substrate treatment method using a treatment liquid (hereinafter, also simply referred to as "the present treatment method"), the treatment liquid can be typically used by being brought into contact with a substrate (hereinafter, also referred to as "an object to be treated") having a metal-containing substance which is a material containing a metal. At this time, the object to be treated may contain a plurality of kinds of metal-containing substances.

[Object to be Treated]

The object to be treated, which is an object to be treated using a treatment liquid, is not particularly limited as long as it is a substrate having a metal-containing substance.

It is noted that "on the substrate" in the present specification includes, for example, any of the front and back surfaces, the side surface, the inside of the groove, and the like of the substrate. In addition, the case of "the metal-containing substance on the substrate" includes not only a case where the metal-containing substance is directly present on the surface of the substrate but also a case where the metal-containing substance is present on the substrate through another layer.

In addition, the "substrate" in the present specification includes, for example, a semiconductor substrate consisting of a single layer and a semiconductor substrate consisting of multiple layers.

In addition, the notation of "object to be removed" in the present specification is at least one selected from the group consisting of metal-containing substances (particularly, metal oxide-containing substances) that are present on the substrate and are targets to be removed using the treatment liquid.

The metal-containing substance is a material including a single body of a metal (a metal atom) as a main component.

Examples of the metal contained in the metal-containing substance include at least one metal M selected from the group consisting of copper (Cu), cobalt (Co), tungsten (W), titanium (Ti), tantalum (Ta), ruthenium (Ru), chromium (Cr), hafnium (Hf), osmium (Os), platinum (Pt), nickel (Ni), manganese (Mn), zirconium (Zr), molybdenum (Mo), lantern (La), and iridium (Ir).

The metal-containing substance only needs to be a substance containing a metal (a metal atom), and examples thereof include a single body of the metal M, an alloy including the metal M, an oxide of the metal M, a nitride of the metal M, and an oxynitride of the metal M.

More specific examples of the metal-containing substance include a metal-containing substance containing at least one component selected from the group consisting of copper, cobalt, a cobalt alloy, tungsten, a tungsten alloy, ruthenium, a ruthenium alloy, tantalum, a tantalum alloy, aluminum oxide, aluminum nitride, aluminum oxynitride, titanium aluminum, titanium, titanium nitride, titanium oxide, zirconium oxide, hafnium oxide, tantalum oxide, lanthanum oxide, and a yttrium alloy.

In addition, the metal-containing substance may be a mixture containing two or more of these compounds.

It is noted that the oxide, the nitride, and the oxynitride may be a composite oxide, a composite nitride, or a composite oxynitride, which includes a metal. In addition, the metal-containing substance may contain at least one element selected from the group consisting of a single body metal, an alloy, a metal oxide, and a metal nitride, and at least one element, as a dopant, selected from the group consisting of carbon, nitrogen, boron, and phosphorus.

The content of the metal atom in the metal-containing substance is preferably 10% by mass or more, more preferably 30% by mass or more, and still more preferably 50% by mass or more with respect to the total mass of the metal-containing substance. The upper limit thereof is 100% by mass since the metal-containing substance may be the metal itself.

In a case where the metal-containing substance contains the above dopant, the content of the dopant is preferably 0.1% to 50% by mass and more preferably 10% to 40% by mass with respect to the total mass of the metal-containing substance. In that case, the content of the metal atom in the metal-containing substance is preferably 30% to 99.9% by mass and more preferably 60% to 90% by mass with respect to the total mass of the metal-containing substance.

The metal oxide-containing substance is a material containing a metal oxide as a main component.

Examples of the metal atom constituting the oxide of the metal contained in the metal oxide-containing substance include the metal M. The metal oxide-containing substance preferably contains an oxide of the metal M and more preferably contains tungsten oxide ($WO_x$), cobalt oxide ($CoO_x$), or ruthenium oxide ($RuO_x$).

The metal oxide-containing substance may be a mixture containing two or more kinds of metal oxides.

In addition, the metal oxide-containing substance may contain a single body of a metal and/or a nitride of a metal as long as the oxide of the metal is contained as a main component.

The content of the oxide of the metal in the metal oxide-containing substance is preferably 5% by mass or more and more preferably 20% by mass or more with respect to the total mass of the metal oxide-containing substance. The upper limit thereof is not particularly limited and may be 100% by mass or less.

A form of the metal-containing substance is not particularly limited, and it may be, for example, any one of a film-shaped (layer-shaped) form, a wiring line-shaped form, and a particle-shaped form.

The metal-containing substance may be disposed only on one main surface of the substrate or may be disposed on both main surfaces. In addition, the metal-containing substance may be disposed on the entire main surface of the substrate or may be disposed on a part of the main surface of the substrate.

The substrate preferably has a metal M-containing substance containing the metal M, more preferably has a metal-containing substance containing at least one metal selected from the group consisting of Cu, Co, W, Ti, Ta, and Ru, and still more preferably has a metal-containing substance containing at least one metal selected from the group consisting of Cu, W, and Co.

In particular, the substrate preferably has a copper-containing film, a Co-containing film, or a W-containing film.

Examples of the copper-containing film include a wiring line film (a copper wiring line film) consisting of only metallic copper and a wiring line film (a copper alloy wiring line film) consisting of an alloy, consisting of metallic copper and another metal.

Specific examples of the copper alloy wiring line film include a wiring line film consisting of an alloy of one or more metals selected from Al, Ti, Cr, Mn, Ta, and W, and copper. More specific examples of the copper alloy wiring line film include a CuAl alloy wiring line film, a CuTi alloy wiring line film, a CuCr alloy wiring line film, a CuMn alloy wiring line film, a CuTa alloy wiring line film, and a CuW alloy wiring line film.

Examples of the Co-containing film include a metal film (a Co metal film) consisting of only metal cobalt and a metal film (a Co alloy metal film) consisting of an alloy consisting of metallic cobalt and another metal.

Specific examples of the Co alloy metal film include a metal film consisting of an alloy made of one or more metals selected from Ti, Cr, Fe, Ni, Mo, Pd, Ta, and W, and cobalt. More specific examples of the Co alloy metal film include a CoTi alloy metal film, a CoCr alloy metal film, a CoFe alloy metal film, a CoNi alloy metal film, a CoMo alloy metal film, a CoPd alloy metal film, a CoTa alloy metal film, and a CoW alloy metal film.

Among the Co-containing films, the Co metal film is often used as the wiring line film, and the Co alloy metal film is often used as the barrier metal.

Examples of the W-containing film include a metal film (a W metal film) consisting of only tungsten and a metal film (a W alloy metal film) consisting of an alloy made of tungsten and another metal. Specific examples of the W alloy metal film include a WTi alloy metal film and a WCo alloy metal film.

The tungsten-containing film is often used as a wiring line film or a barrier metal.

Examples of the titanium-containing film include a Ti alloy metal film which is a metal film containing an alloy consisting of titanium and another metal such as aluminum and may further contain the above-described dopant. Specific examples of the Ti alloy metal film include a TiAl film, a TiAlC film, and a TiAlN film.

The Ti alloy metal film is often used in a structure of a gate and a structure surrounding the gate.

More specific examples of the object to be treated include a laminate including, on a substrate, a metal layer, an insulating film, and a metal hard mask at least in this order. The laminate may further have holes formed from the surface (the opening portion) of the metal hard mask toward the substrate so that the surface of the metal layer is exposed, as a result of undergoing a dry etching step or the like.

A manufacturing method for such a laminate having holes as described above is not particularly limited; however, examples thereof include a method in which a laminate before treatment, having a substrate, a metal layer, an insulating film, and a metal hard mask in this order, is subjected to a dry etching step by using a metal hard mask as a mask and an insulating film is etched so that the surface of the metal layer is exposed, thereby providing holes that penetrate through the metal hard mask and the inside of the insulating film.

It is noted that a manufacturing method for the metal hard mask is not particularly limited. Examples thereof include a method in which, first, a metal layer containing a predetermined component is formed on an insulating film, a resist film having a predetermined pattern is formed on the metal layer, and next, using a resist film as a mask, a metal layer is etched to manufacture a metal hard mask (that is, a film in which a metal layer is patterned).

In addition, the laminate may have a layer other than the above-described layers, examples of which include an etching stop film and an antireflection layer.

FIG. 1 shows a schematic cross-sectional view illustrating an example of a laminate which is an object to be treated.

A laminate 10 illustrated in FIG. 1 includes a metal layer 2, an etching stop layer 3, an insulating film 4, and a metal hard mask 5 in this order on a substrate 1, and holes 6 by which the metal layer 2 is exposed is formed at a predetermined position as a result of a dry etching step or the like. That is, the object to be treated illustrated in FIG. 1 is a laminate which includes the substrate 1, the metal layer 2, the etching stop layer 3, the insulating film 4, and the metal hard mask 5 in this order, in which the holes 6 that penetrate from the surface of the metal hard mask 5 to the surface of the metal layer 2 at the position of the opening portion of the metal hard mask 5. An inner wall 11 of the holes 6 is consisting of a cross-sectional wall 11a consisting of the etching stop layer 3, the insulating film 4, and the metal hard mask 5, and a bottom wall 11b consisting of the exposed metal layer 2, and dry etching residues 12 are attached thereto.

This treatment method can be suitably used for removing these dry etching residues 12. That is, while being excellent in the removal performance (the residue removability) for the dry etching residues 12, it is also excellent in the corrosion prevention property with respect to the inner wall 11 (for example, the metal layer 2 and the like) of the object to be treated.

In addition, a laminate that has undergone a dry ashing step after the dry etching step may be subjected to the substrate washing method.

Hereinafter, each layer-constituting material of the above-described laminate will be described.

<Metal Hard Mask>

The metal hard mask preferably contains at least one selected from the group consisting of copper, cobalt, a cobalt alloy, tungsten, a tungsten alloy, ruthenium, a ruthenium alloy, tantalum, a tantalum alloy, aluminum oxide, aluminum nitride, aluminum oxynitride, titanium aluminum, titanium, titanium nitride, titanium oxide, zirconium oxide, hafnium oxide, tantalum oxide, lanthanum oxide, and a yttrium alloy (preferably YSiOx). Here, x and y are preferably numbers represented by x=1 to 3 and y=1 to 2, respectively.

Examples of the material of the metal hard mask include TIN, $WO_2$, and $ZrO_2$.

<Insulating Film>

The material of the insulating film is not particularly limited, and examples thereof include those having a dielectric constant k of 3.0 or less and more preferably 2.6 or less.

Specific examples of the material of the insulating film include organic polymers such as SiOx, SiN, SiOC, and polyimide. Here, x is preferably a number represented by 1 to 3.

The insulating film may be composed of a plurality of films. Examples of the insulating film composed of a plurality of films include an insulating film obtained by combining a film containing silicon oxide and a film containing oxidized silicon carbide.

<Etching Stop Layer>

The material of the etching stop layer is not particularly limited. Specific examples of the material of the etching stop layer include materials based on SiN, SiON, and SiOCN, and metal oxides such as AlOx.

<Metal Layer>

The material that forms the metal layer, which is a wiring line material and/or a plug material, is not particularly limited. However, it preferably contains one or more selected from the group consisting of cobalt, tungsten, and copper. Further, the material that forms the metal layer may be cobalt, tungsten, or an alloy of copper and another metal.

The metal layer may further contain a metal other than cobalt, tungsten, and copper, a metal nitride, and/or an alloy. Examples of the metal other than cobalt, tungsten, and copper, which may be contained in the metal layer include titanium, titanium-tungsten, titanium nitride, tantalum, a tantalum compound, chromium, a chromium oxide, and aluminum.

The metal layer may contain at least one dopant selected from the group consisting of carbon, nitrogen, boron, and phosphorus, in addition to one or more selected from the group consisting of cobalt, tungsten, and copper.

<Substrate>

Specific examples of the wafer constituting a substrate include a wafer consisting of silicon-based material, such as a silicon (Si) wafer, a silicon carbide (SiC) wafer, or a wafer based on a resin containing silicon (a glass epoxy wafer), a gallium phosphorus (GaP) wafer, a gallium arsenic (GaAs) wafer, and an indium phosphorus (InP) wafer.

The silicon wafer may be an n-type silicon wafer obtained by doping a silicon wafer with a pentavalent atom (for example, phosphorus (P), arsenic (As), or antimony (Sb)), or a p-type silicon wafer obtained by doping a silicon wafer with a trivalent atom (for example, boron (B) or gallium (Ga)). The silicon of the silicon wafer may be, for example, any one of amorphous silicon, single crystal silicon, polycrystalline silicon, or polysilicon.

In addition to those described above, the object to be treated may include various layers and/or structures as desired. For example, the substrate may include a metal wire, a gate electrode, a source electrode, a drain electrode, an insulating layer, a ferromagnetic layer, and/or a non-magnetic layer.

The substrate may include an exposed integrated circuit structure, for example, an interconnect mechanism such as a metal wire or a dielectric material. Examples of the metal and the alloy which are used in the interconnect mechanism include aluminum, a copper-aluminum alloy, copper, titanium, tantalum, cobalt, silicon, titanium nitride, tantalum nitride, and tungsten. The substrate may include layers of silicon oxide, silicon nitride, silicon carbide, and/or silicon oxide dope with carbon.

The manufacturing method for the object to be treated is not particularly limited as long as it is a method that is generally carried out in this field.

Examples of the method of forming the insulating film on a wafer constituting a substrate include a method in which a wafer constituting a substrate is subjected to a heat treatment in the presence of an oxygen gas to form a silicon oxide film, and then a gas of silane and ammonia is introduced thereto to form a silicon nitride film by a chemical vapor deposition (CVD) method.

Examples of the method of forming the metal-containing layer on a wafer constituting a substrate include a method in which a circuit is formed on the wafer having an insulating film by a known method such as resist, and then a metal-containing layer is formed by a method such as plating, a sputtering method, a CVD method, or a molecular beam epitaxy (MBE) method.

The object to be treated may be a substrate that has been subjected to a flattening treatment such as a CMP treatment after providing an insulating film, a barrier metal, and a metal-containing film on the wafer. The CMP treatment is a treatment of flattening a surface of a substrate having a metal-containing film, a barrier metal, and an insulating film by a combined action of chemical action using a polishing slurry containing polishing fine particles (abrasive grains) and mechanical polishing.

The surface of the substrate that has been subjected to the CMP treatment may have impurities remaining thereon, such as abrasive grains (for example, silica and alumina) used in the CMP treatment, a polished metal-containing film, and metal impurities (metal residue) derived from the barrier metal. For example, since these impurities may short-circuit the wiring lines and deteriorate the electrical characteristics of the substrate, the substrate that has been subjected to the CMP treatment is subjected to a washing treatment for removing these impurities from the surface.

Specific examples of the substrate that has been subjected to the CMP treatment include the substrate that has been subjected to a CMP treatment, described in Vol. 84, No. 3, 2018, but the present invention is not limited thereto.

[Step A]

Examples of the present treatment method include a step A of removing a metal-containing substance on a substrate by bringing the treatment liquid into contact with an object to be treated, which contains a metal-containing substance.

The treatment liquid that is used in the step A is as described above.

In addition, the substrate having a metal-containing substance, which is the object to be treated in the step A, is as described above.

The method of bringing the treatment liquid into contact with an object to be treated is not particularly limited, and examples thereof include a method of immersing an object to be treated, in the treatment liquid charged in a tank, a method of spraying the treatment liquid onto a substrate, a method of allowing the treatment liquid to flow onto a substrate, and any combination thereof. Among them, a method of immersing, as an object to be treated, a substrate having a metal-containing substance in the treatment liquid, is preferable.

Further, in order to further improve the washing ability of the treatment liquid, a mechanical stirring method may be used.

Examples of the mechanical stirring method include a method of circulating a treatment liquid on a substrate, a method of flowing or spraying a treatment liquid on a substrate, and a method of stirring a treatment liquid with an ultrasonic wave or a megasonic wave.

In addition, the treatment by immersion may be a batch method in which a plurality of objects to be treated are immersed in a treatment tank or may be a single substrate method.

The treatment time in the step A may be adjusted according to the method of bringing the treatment liquid into contact with a substrate, the temperature of the treatment liquid, and the like. The treatment time (the contact time between the treatment liquid and the object to be treated) is not particularly limited; however, it is preferably 0.25 to 10 minutes and more preferably 0.5 to 2 minutes.

The temperature of the treatment liquid at the time of treatment is not particularly limited; however, the lower limit thereof is preferably 15° C. or higher, more preferably 20° C. or higher, and still more preferably 30° C. or higher. In addition, the upper limit of the temperature is preferably 80° C. or lower, more preferably 75° C. or lower, and still more preferably 70° C. or lower.

Examples of the specific aspect of the step A include a step A1 of subjecting a wiring line consisting of a metal-containing substance, disposed on a substrate, to a recess-etching treatment by using a treatment liquid, a step A2 of removing a film on an outer edge of a substrate on which a film consisting of a metal-containing substance is disposed, by using a treatment liquid, a step A3 of removing a metal-containing substance that has adhered to a back surface of a substrate on which a film consisting of a metal-containing substance is disposed, using a treatment liquid, a step A4 of removing a metal-containing substance on a substrate after dry etching, by using a treatment liquid, and a step A5 of removing a metal-containing substance on a substrate after the chemical-mechanical polishing treatment, by using a treatment liquid.

For the steps A1 to A5, the description in paragraphs to of WO2019/138814A, the contents of which are incorporated herein by reference, can be referenced.

[Rinsing Step]

The substrate washing method according to the embodiment of the present invention may further include a step of rinsing the object to be treated with a solvent (hereinafter, referred to as a "step B"), after the step A.

The step B is carried out continuously after the step A, and it is preferably a step of carrying out rising with a rinsing solvent (a rinsing liquid) for 5 seconds to 5 minutes. The step B may be carried out using the above-mentioned mechanical stirring method.

Examples of the solvent of the rinsing liquid include deionized (DI) water, methanol, ethanol, isopropanol, N-methylpyrrolidinone, γ-butyrolactone, dimethyl sulfoxide, ethyl lactate, and propylene glycol monomethyl ether acetate.

The solvent of the rinsing liquid is preferably DI water, methanol, ethanol, isopropanol, or a mixed liquid thereof, and more preferably DI water, isopropanol, or a mixed liquid of DI water and isopropanol.

As a method of bringing the rinsing solvent into contact with the object to be treated, the above-described method of bringing the treatment liquid into contact with the object to be treated can be similarly applied.

The temperature of the rinsing solvent in the step B is preferably 16° C. to 27° C.

[Drying Step]

The present treatment method may include a step C of drying the object to be treated, after the step B.

The drying method is not particularly limited, and examples thereof include a spin drying method, a method of flowing a dry gas onto an object to be treated, a method of heating a substrate by a heating means such as a hot plate and an infrared lamp, a Marangoni drying method, a Rotagoni drying method, an isopropanol (IPA) drying method, and any combinations thereof.

The drying time in the step C depends on the specific method to be used; however, it is preferably 20 seconds to 5 minutes.

In the step C, it is preferable to dry a substrate by heating the substrate with a heating means from the viewpoint of excellent removability of the treatment liquid in the SiOx layer.

In that case, the heating temperature is not particularly limited; however, it is preferably 50° C. to 350° C. and more preferably more than 100° C. and less than 400° C. from the viewpoint of being more excellent in the removability of the treatment liquid in the SiOx layer and the film reduction in the Co film and the SiOx layer, and it is still more preferably 150° C. to 250° C. from the viewpoint of being more excellent in the removability of the treatment liquid in the Co film and the SiOx layer.

Second Aspect

Examples of another aspect of the present treatment method include the following second aspect.

That is, it is a treatment method for an object to be treated, which includes a step P of subjecting an object to be treated (a substrate) having a metal-containing layer to an oxidation treatment to oxidize a surface layer of the metal-containing layer, thereby forming a metal oxide layer, and a step Q of bringing the treatment liquid into contact with the surface of the metal oxide layer of the object to be treated, where the metal oxide layer has been formed in the step P, to dissolve the metal oxide layer.

The metal-containing layer is preferably, for example, a single body or alloy of a metal. In addition, the metal-containing layer preferably contains at least one selected from the group consisting of cobalt, copper, tungsten, titanium, and aluminum. That is, the metal-containing layer is preferably a cobalt-containing substance (a cobalt single body, a cobalt alloy, or the like), a copper-containing substance (a single body, an alloy, or the like), a tungsten-containing substance (a tungsten single body, a tungsten alloy, or the like), a titanium-containing substance (a titanium single body, a titanium alloy, or the like), or an aluminum-containing substance (an aluminum single body, an aluminum alloy, or the like) is preferable, and a tungsten-containing substance is more preferable.

The metal oxide layer is a layer obtained by oxidizing the surface layer of the metal-containing layer. A part of the surface layer of the metal-containing layer may be a metal oxide layer, or the entire surface layer of the metal-containing layer may be a metal oxide layer.

The metal oxide layer is a layer consisting of a metal single body or an oxide of an alloy, and it is preferably a layer consisting of a cobalt oxide, an oxide of a cobalt alloy, a copper oxide, an oxide of a copper alloy, a tungsten oxide, an oxide of a tungsten alloy, a titanium oxide, an oxide of a titanium alloy, an aluminum oxide, or an oxide of an aluminum alloy, more preferably a layer consisting of a tungsten oxide or an oxide of a tungsten alloy, and still more preferably a layer consisting of a tungsten oxide.

The thickness of the metal oxide layer is, for example, a thickness equivalent to that of a mono-atomic to deca-atomic layer. It is noted that the thickness of the mono-atomic layer of the metal and the metal oxide is 1 nm or less (for example, 0.3 to 0.4 nm).

In many cases, the metal oxide layer has high solubility (is easily etched) in the treatment liquid as compared with the metal-containing layer.

That is, in the second aspect, the surface of the metal-containing layer is made to be a thin metal oxide layer in the step P, and only the above-described metal oxide layer (and a part where the metal-containing layer present in the underlayer of the metal oxide layer may be inevitably dissolved) is (are) removed in the step Q by using the treatment liquid, whereby only a very thin surface of the metal-containing layer contained in the object to be treated can be removed (dissolved).

Further, in a case of repeatedly carrying out the step P and the step Q alternately, it is possible to control the etching amount with high accuracy.

In a case where the step P and the step Q are alternately carried out, the number of times of each step to be carried out may be, for example, 1 to 20 cycles in a case where a combination of the step P and the step Q is defined as one cycle. From the viewpoint of excellent control of the recess amount, the number of times of each step to be carried out in a case where the step P and the step Q are alternately carried out is preferably 3 cycles or more and more preferably 5 cycles or more.

The object to be treated to which the second aspect can be applied may include one kind of metal-containing layer alone or may include two or more kinds thereof. In addition, the object to be treated to which the second aspect can be applied may contain a metal-based material other than the metal-containing layer or the metal oxide layer, and a part or whole of such metal-based material may be removed intentionally or unavoidably through the step P and the step Q.

The step P is a step of subjecting the object to be treated including the metal-containing layer to an oxidation treatment to oxidize the surface layer of the metal-containing layer, thereby forming a metal oxide layer.

There is no limitation on the method of the oxidation treatment for oxidizing the surface layer of the metal-containing layer to form a metal oxide layer, and the method can be carried out by subjecting the object to be treated to a liquid treatment in which the object to be treated is brought into contact with an oxidizing liquid, a gas treatment in which an oxidation gas is brought into contact (an ozone treatment in which an ozone gas is brought into contact with a substrate described later, a heating treatment in oxygen in which heating is carried out in an oxygen atmosphere, or the like), or a plasma treatment using an oxygen gas.

One kind of oxidation treatment may be carried out alone, or two or more kinds thereof may be carried out in combination.

Among the above, as the oxidation treatment, it is preferable to at least carry out a liquid treatment in which a predetermined oxidizing liquid is brought into contact with the object to be treated.

The oxidizing liquid may be any chemical liquid that can oxidize the surface layer of the metal-containing layer. The oxidizing liquid is preferably an oxidizing liquid other than the present treatment liquid.

The oxidizing liquid is preferably a chemical liquid (hereinafter, also referred to as a "specific chemical liquid") selected from the group consisting of water, hydrogen peroxide water, a mixed aqueous solution of ammonia and hydrogen peroxide (APM), a mixed aqueous solution of hydrofluoric acid and hydrogen peroxide water (FPM), a mixed aqueous solution of sulfuric acid and hydrogen peroxide water (SPM), a mixed aqueous solution of hydrochloric acid and hydrogen peroxide water (HPM), oxygen-dissolved water, ozone-dissolved water, perchloric acid, and nitric acid.

Regarding the composition of the hydrogen peroxide water, for example, the content of $H_2O_2$ is 0.5% to 31% by mass and more preferably 3% to 15% by mass with respect to the total mass of the hydrogen peroxide water.

The composition of APM is, for example, preferably within a range (in terms of mass ratio) of "ammonia water: hydrogen peroxide water:water=1:1:1" to "ammonia water: hydrogen peroxide water:water=1:3:45".

The composition of FPM is, for example, preferably within a range (in terms of mass ratio) of "fluoric acid: hydrogen peroxide water:water=1:1:1" to "fluoric acid:hydrogen peroxide water:water=1:1:200".

The composition of SPM is, for example, preferably within a range (in terms of mass ratio) of "sulfate:hydrogen peroxide water:water=3:1:0" to "sulfate:hydrogen peroxide water:water=1:1:10".

The composition of HPM is, for example, preferably within a range (in terms of mass ratio) of "hydrochloric acid:hydrogen peroxide water:water=1:1:1" to "hydrochloric acid:hydrogen peroxide water:water=1:1:30".

It is noted that these descriptions of the preferred compositional ratios are intended to be compositional ratios in a case where the ammonia water is 28% by mass ammonia water, the hydrofluoric acid is 49% by mass hydrofluoric acid, the sulfuric acid is 98% by mass sulfuric acid, the hydrochloric acid is 37% by mass hydrochloric acid, and the hydrogen peroxide water is 30% by mass hydrogen peroxide water.

The volume ratio is based on the volume at room temperature.

The description ["A:B:C=x:y:z" to "A:B:C=X:Y:Z"] as a suitable range indicates that it is preferable to satisfy at least one range of ["A:B=x:y" to "A:B=X:Y"], ["B:C=y:z" to "B:C=Y:Z"], or ["A:C=x:z" to "A:C=X:Z"] (preferably two ranges and more preferably all the ranges).

The composition of the oxygen-dissolved water is, for example, that of an aqueous solution in which the content of $O_2$ is 20 to 500 ppm by mass with respect to the total mass of the oxygen-dissolved water.

The composition of the ozone-dissolved water is, for example, that of an aqueous solution in which the content of $O_3$ is 1 to 60 ppm by mass with respect to the total mass of the ozone-dissolved water.

The perchloric acid is, for example, an aqueous solution in which the content of $HClO_4$ is 0.001% to 60% by mass with respect to the total mass of the solution.

The nitric acid is, for example, an aqueous solution in which the content of $HNO_3$ is 0.001% to 60% by mass with respect to the total mass of the solution.

In the liquid treatment, a method of bringing an object to be treated into contact with the oxidizing liquid (preferably the specific chemical liquid) is not particularly limited, and examples thereof include a method of immersing an object to be treated, in the oxidizing liquid charged in a tank, a method of spraying the oxidizing liquid onto an object to be treated, a method of allowing the oxidizing liquid to flow onto an object to be treated, and any combination thereof.

The contact time between the object to be treated and the oxidizing liquid is, for example, preferably 0.25 to 10 minutes and more preferably 0.5 to 5 minutes.

The temperature of the oxidizing liquid is preferably 20° C. to 75° C. and more preferably 20° C. to 60° C.

In the gas treatment, examples of the oxidation gas that comes into contact with an object to be treated include dry air, an oxygen gas, an ozone gas, and a mixed gas thereof. The oxidation gas may contain a gas other than the above-described gas.

In the gas treatment, the oxidation gas that comes into contact with an object to be treated is preferably an oxygen gas or an ozone gas. In a case of being brought into contact with an object to be treated, an oxygen gas or an ozone gas is preferably brought into contact under an oxygen atmosphere, an ozone atmosphere, or a mixed gas atmosphere of oxygen and ozone.

In the gas treatment, an aspect in which an object to be treated is heated (for example, heating at 40° C. to 200° C.) while being brought into contact with the oxidation gas is also preferable.

Among them, the gas treatment is preferably an ozone treatment in which an ozone gas is brought into contact with an object to be treated or a heating treatment in oxygen in which an object to be treated is heated in an oxygen atmosphere.

In the ozone treatment, an ozone gas may be brought into contact with an object to be treated in an ozone atmosphere, or ozone gas may be brought into contact with an object to be treated in an atmosphere of a mixed gas of an ozone gas and another gas (for example, an oxygen gas). In addition, the ozone treatment may be a treatment in which an object to be treated is heated while being brought into contact with an ozone gas.

In the step P (particularly in the case of carrying out a liquid treatment), the object to be treated may contain a metal-based material other than the metal-containing layer of which the surface layer is oxidized by the oxidation treatment to be a metal oxide layer, and a part or whole of such a metal-based material may be intentionally or unavoidably removed by the step P (particularly, the liquid treatment).

In addition, in the step P (particularly in the case of carrying out the liquid treatment), a part of the metal-containing layer of the object to be treated may be intentionally or unavoidably removed.

The step Q is a step of bringing the object to be treated obtained in the step Pinto contact with the treatment liquid to dissolve the metal oxide layer.

In the step Q, the method of bringing the object to be treated into contact with the treatment liquid is not particularly limited, and examples thereof include the same method as the method of bringing the object to be treated into contact with the oxidizing liquid.

The contact time between the object to be treated and the treatment liquid is, for example, preferably 0.25 to 10 minutes and more preferably 0.5 to 5 minutes.

The temperature of the treatment liquid is preferably 20° C. to 75° C. and more preferably 20° C. to 60° C.

In the step Q, the removal of the metal oxide layer may be carried out partially or entirely.

In the step Q, a part or whole of the metal-containing layer (for example, the metal-containing layer that has been exposed to the surface layer by removing the metal oxide layer that covers the surface) may be intentionally or unavoidably removed.

In the step Q, the object to be treated may contain another metal-based material other than the metal oxide layer and the metal-containing layer that forms the metal oxide layer on the surface, and a part or whole of such a metal-based material may be intentionally or unavoidably removed.

It is noted that in a case where the metal-containing layer and/or the other metal-based material is not intentionally dissolved, it is preferable that the amount of the metal-containing layer and/or the other metal-based material, which is inevitably dissolved, is small.

The treatment liquid to be subjected to the step Q may be subjected to a degassing treatment or the like in advance to reduce the amount of dissolved oxygen. The metal-containing layer exposed by removing the metal oxide layer with the treatment liquid is oxidized by the dissolved oxygen in the treatment liquid to become a new metal oxide layer, and such a metal oxide layer is further removed by the treatment liquid, and as a result, it is possible to suppress the removal of an excessive amount of the metal-containing layer by reducing the amount of dissolved oxygen in the treatment liquid.

The present treatment method may be carried out in combination before or after other steps which are carried out in the manufacturing method for a semiconductor device. Another step may be incorporated into the execution of the present treatment method, or the present treatment method may be incorporated into the other step.

Examples of the other step include a step of forming each structure such as a metal wire, a gate structure, a source structure, a drain structure, an insulating layer, a ferromagnetic layer, and/or a non-magnetic layer (layer formation, etching, chemical mechanical polishing, modification, or the like), a resist forming step, an exposure step and a removal step, a heat treatment step, a washing step, and an examination step.

The present treatment method may be carried out at any stage of a back-end-of-the-line (BEOL) process, a middle-of-the-line (MOL) process, and a front-end-of-the-line (FEOL) process.

EXAMPLES

Hereinbelow, the present invention will be described in more detail with reference to Examples. The materials, amounts of use, proportions, treatments, procedures, and the like described in the following Examples can be appropriately modified as long as the gist of the invention is maintained. Therefore, the scope of the present invention should not be construed to be limited by Examples described below.

[Raw Material of Treatment Liquid]

The following compounds were used to prepare the treatment liquid. It is noted that as the various components used in Example, those all classified into a semiconductor grade or a high-purity grade equivalent thereto were used.

<Copolymer>

As the copolymer, compounds CP-1 to CP-37 shown in Table 1 below were used.

In the "Structural formula" column of Table 1, the structural formulae that represent the corresponding compounds among Formulae (P-1) to (P-25) are shown. The columns "m" and "n" in Table 1 indicate the ratio (m:n) of the number of moles m of the first repeating unit to the number of moles n of the second repeating unit in each compound. The compositional ratio (the ratio in terms of % by mole) of each repeating unit in the resin was measured by $^{13}$C-NMR.

"Weight-average molecular weight Mw" in Table 1 indicates the weight-average molecular weight of each compound, which is a value in terms of polystyrene measured by the above-described gel permeation chromatography (GPC) method.

TABLE 1

| Chemical | Structural formula | m | n | Weight-average molecular weight Mw |
|---|---|---|---|---|
| CP-1 | (P-19) | 1 | 1 | 60,000 |
| CP-2 | (P-19) | 2 | 1 | 60,000 |
| CP-3 | (P-1) | 1 | 1 | 1,000 |
| CP-4 | (P-2) | 1 | 2 | 15,000 |
| CP-5 | (P-20) | 1 | 2 | 60,000 |
| CP-6 | (P-21) | 2 | 1 | 60,000 |
| CP-7 | (P-14) | 1 | 1 | 5,000 |
| CP-8 | (P-22) | 1 | 1 | 2,000 |
| CP-9 | (P-18) | 1 | 2 | 40,000 |
| CP-10 | (P-13) | 1 | 1 | 3,000 |
| CP-11 | (P-15) | 2 | 1 | 10,000 |
| CP-12 | (P-8) | 2 | 1 | 10,000 |
| CP-13 | (P-17) | 1 | 1 | 150,000 |
| CP-14 | (P-16) | 2 | 1 | 25,000 |
| CP-15 | (P-23) | 2 | 1 | 25,000 |
| CP-16 | (P-4) | 1 | 1 | 15,000 |
| CP-17 | (P-5) | 1 | 1 | 15,000 |
| CP-18 | (P-6) | 1 | 1 | 15,000 |
| CP-19 | (P-7) | 1 | 1 | 2,500 |
| CP-20 | (P-8) | 2 | 1 | 4,000 |
| CP-21 | (P-3) | 3 | 1 | 15,000 |
| CP-22 | (P-10) | 1 | 1 | 100,000 |
| CP-23 | (P-10) | 2 | 1 | 100,000 |
| CP-24 | (P-11) | 1 | 1 | 15,000 |
| CP-25 | (P-12) | 1 | 1 | 12,000 |
| CP-26 | (P-7) | 2 | 1 | 2,000 |
| CP-27 | (P-11) | 2 | 1 | 30,000 |
| CP-28 | (P-12) | 1 | 2 | 15,000 |
| CP-29 | (P-12) | 1 | 2 | 15,000 |
| CP-30 | (P-3) | 1 | 1 | 15,000 |
| CP-31 | (P-3) | 1 | 3 | 15,000 |
| CP-32 | (P-3) | 1 | 5 | 15,000 |
| CP-33 | (P-8) | 2 | 1 | 10,000 |
| CP-34 | (P-8) | 2 | 1 | 15,000 |
| CP-35 | (P-9) | 2 | 1 | 10,000 |

TABLE 1-continued
| Chemical | Structural formula | m | n | Weight-average molecular weight Mw |
|---|---|---|---|---|
| CP-36 | (P-24) | 1 | 1 | 10,000 |
| CP-37 | (P-25) | 1 | 1 | 10,000 |
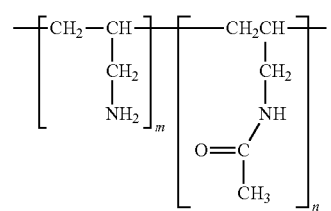
(P-1)
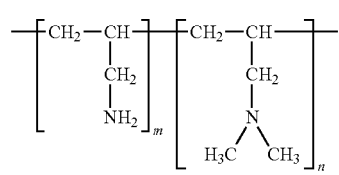
(P-2)
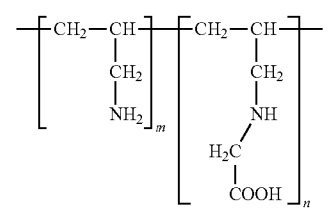
(P-3)
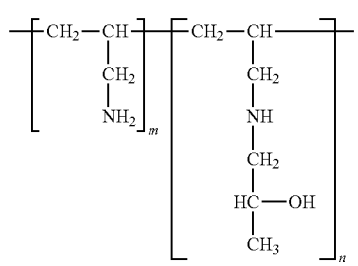
(P-4)
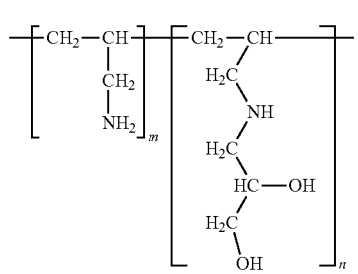
(P-5)
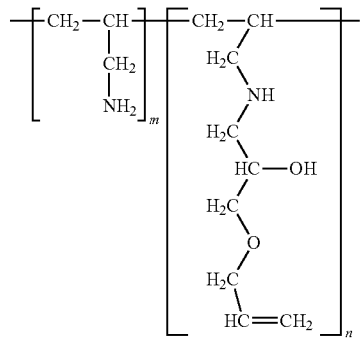
(P-6)
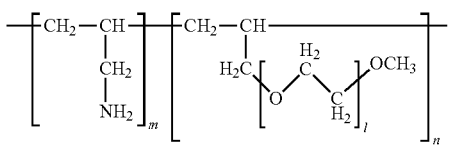
(P-7)
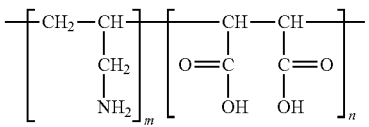
(P-8)
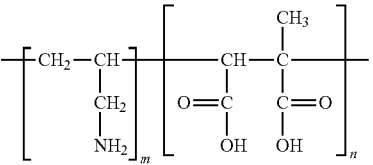
(P-9)
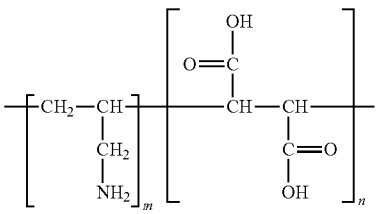
(P-10)
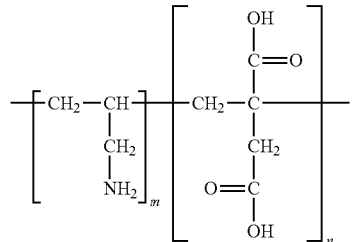
(P-11)
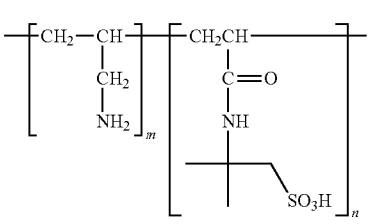
(P-12)

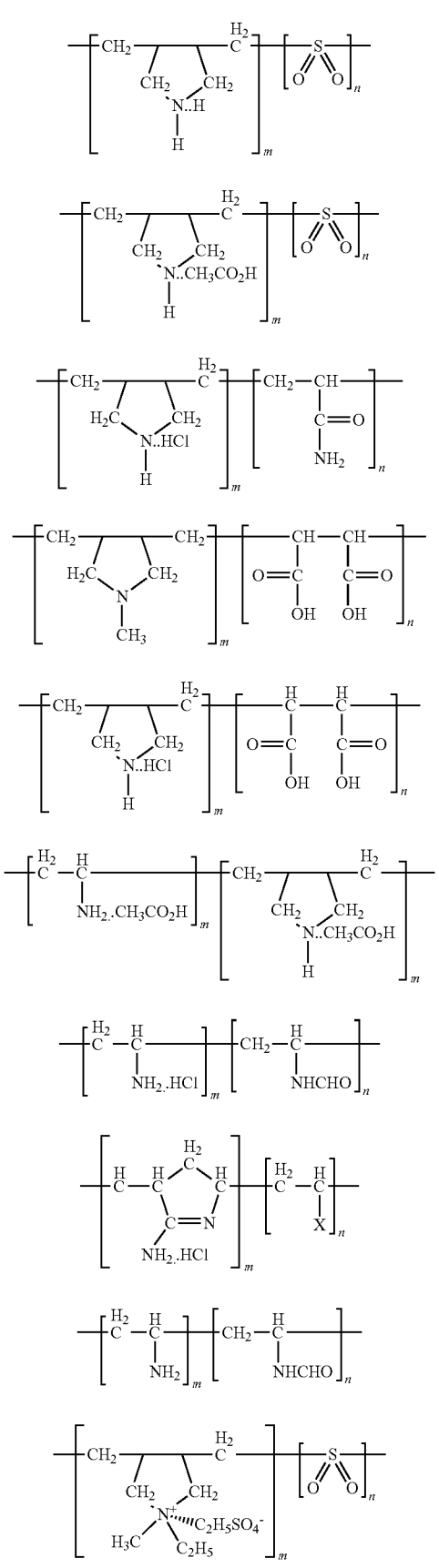
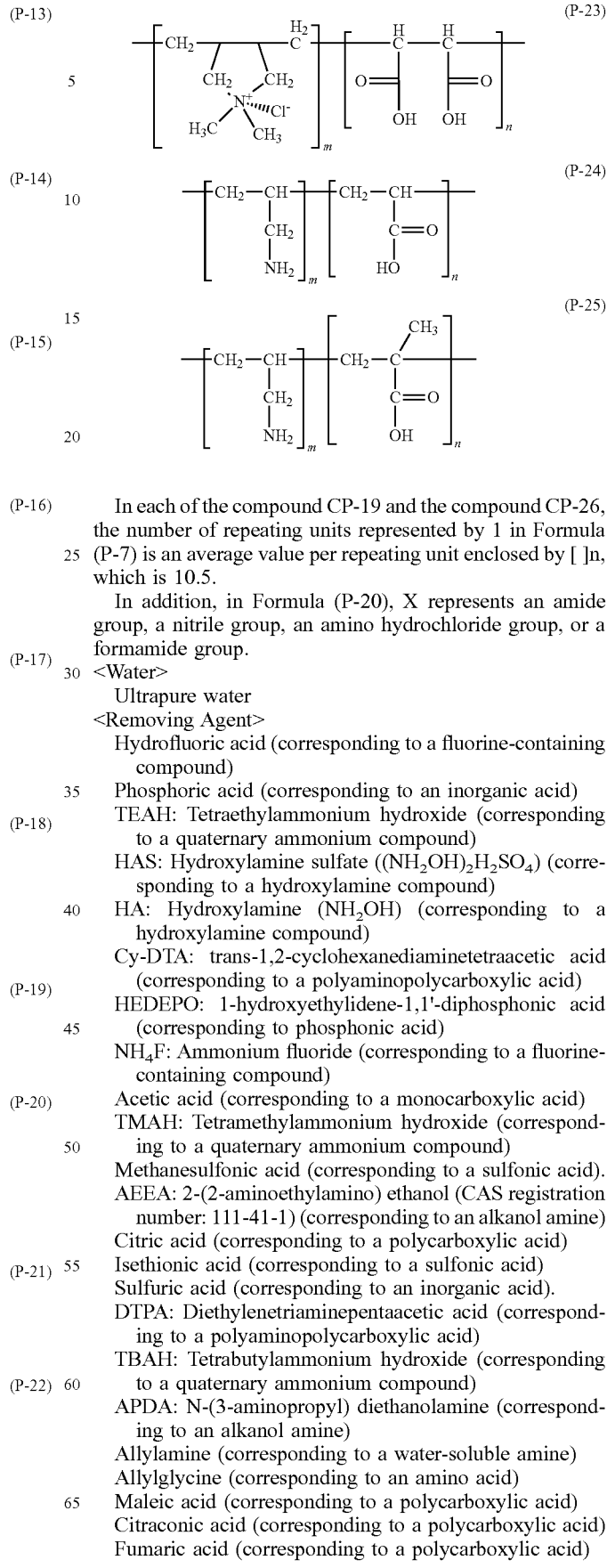

In each of the compound CP-19 and the compound CP-26, the number of repeating units represented by 1 in Formula (P-7) is an average value per repeating unit enclosed by [ ]n, which is 10.5.

In addition, in Formula (P-20), X represents an amide group, a nitrile group, an amino hydrochloride group, or a formamide group.

<Water>
Ultrapure water

<Removing Agent>
Hydrofluoric acid (corresponding to a fluorine-containing compound)
Phosphoric acid (corresponding to an inorganic acid)
TEAH: Tetraethylammonium hydroxide (corresponding to a quaternary ammonium compound)
HAS: Hydroxylamine sulfate (($NH_2OH)_2H_2SO_4$) (corresponding to a hydroxylamine compound)
HA: Hydroxylamine ($NH_2OH$) (corresponding to a hydroxylamine compound)
Cy-DTA: trans-1,2-cyclohexanediaminetetraacetic acid (corresponding to a polyaminopolycarboxylic acid)
HEDEPO: 1-hydroxyethylidene-1,1'-diphosphonic acid (corresponding to phosphonic acid)
$NH_4F$: Ammonium fluoride (corresponding to a fluorine-containing compound)
Acetic acid (corresponding to a monocarboxylic acid)
TMAH: Tetramethylammonium hydroxide (corresponding to a quaternary ammonium compound)
Methanesulfonic acid (corresponding to a sulfonic acid).
AEEA: 2-(2-aminoethylamino) ethanol (CAS registration number: 111-41-1) (corresponding to an alkanol amine)
Citric acid (corresponding to a polycarboxylic acid)
Isethionic acid (corresponding to a sulfonic acid)
Sulfuric acid (corresponding to an inorganic acid).
DTPA: Diethylenetriaminepentaacetic acid (corresponding to a polyaminopolycarboxylic acid)
TBAH: Tetrabutylammonium hydroxide (corresponding to a quaternary ammonium compound)
APDA: N-(3-aminopropyl) diethanolamine (corresponding to an alkanol amine)
Allylamine (corresponding to a water-soluble amine)
Allylglycine (corresponding to an amino acid)
Maleic acid (corresponding to a polycarboxylic acid)
Citraconic acid (corresponding to a polycarboxylic acid)
Fumaric acid (corresponding to a polycarboxylic acid)

Itaconic acid (corresponding to a polycarboxylic acid)
<Oxidizing Agent>
  Nitric acid
  Periodic acid
  Hydrogen peroxide
  Peracetic acid
<Corrosion Inhibitor>
  5MBTA: 5-methyl-1H-benzotriazole (corresponding to the compound represented by Formula (C))
  DBS: Dodecylbenzenesulfonic acid (corresponding to an anionic surfactant)
<Organic Solvent>
  PG: Propylene glycol
  HG: Hexylene glycol
  Sulfolane
  EGME: Ethylene glycol methyl ether
  EGBE: Ethylene glycol butyl ether
<Surfactant (Anionic Surfactant)>
  S-1: NIKKOL (registered trade name) Phosten HLP (lauryl phosphate, manufactured by Nikko Chemicals Co., Ltd.)
  S-2: NIKKOL Phosten HLP-1 (POE (1) lauryl ether phosphoric acid, manufactured by Nikko Chemicals Co., Ltd.)
  S-3: PLYSURF (registered trade name) A208B (a POE lauryl ether phosphoric acid ester, manufactured by DKS Co., Ltd.)
  S-4: NIKKOL ECT-3NEX (POE (3)tridecyl ether sodium acetate, manufactured by Nikko Chemicals Co., Ltd.)
  S-5: NIKKOL ECT-7 (POE (7)tridecyl ether acetate, manufactured by Nikko Chemicals Co., Ltd.)
  S-6: NIKKOL SBL-2A-27 (POE (2) lauryl ether ammonium sulfate, manufactured by Nikko Chemicals Co., Ltd.)
  S-7: TAKESURF (registered trade name) A-43-NQ (an alkyl diphenyl ether disulfonic acid salt, manufactured by TAKEMOTO OIL & FAT Co., Ltd.)
<Antifoaming Agent>
  E-1: KM-73A (a silicone-based antifoaming agent, manufactured by Shin-Etsu Chemical Co., Ltd.)
  E-2: KA-540 (a silicone-based antifoaming agent, manufactured by Shin-Etsu Chemical Co., Ltd.)
  E-3: Surfynol (registered trade name) MD20 (an acetylene diol-based antifoaming agent, manufactured by Evonic Chemicals)
  E-4: BYK-012 (a polydimethylsiloxane-based antifoaming agent, manufactured by BYK Additives & Instruments)
  E-5: BYK-014 (a polydimethylsiloxane-based antifoaming agent, manufactured by BYK Additives & Instruments).
  E-6: KS-508 (a self-emulsification-type silicone-based antifoaming agent, manufactured by Shin-Etsu Astec Co., Ltd.)
  E-7: KM-85 (an emulsion-type silicone-based antifoaming agent, manufactured by Shin-Etsu Astec Co., Ltd.)
  E-8: Q-23183A (a silicone-based antifoaming agent, manufactured by DuPont Toray Specialty Materials K.K.)
  E-9: SH5510 (an emulsion-type silicone-based antifoaming agent, manufactured by DuPont Toray Specialty Materials K.K.)
  E-10: SAG30 (a silicone-based antifoaming agent, manufactured by Nippon Unicar Company Limited).
  E-11: BYK-1650 (a silicone-based antifoaming agent, manufactured by BYK Additives & Instruments)

Example A

[Preparation of Etchant]

In Examples A-1 to A-11 and Comparative Examples A-1 to A-11, etchants were prepared. A preparation method for the etchant will be described by taking Example A-1 as an example.

Each of the compound CP-1, hydrofluoric acid, and ultrapure water was mixed so that the amount thereof was the content shown in Table 2, and then the obtained mixed solution was sufficiently stirred with a stirrer to prepare an etchant of Example A-1

According to the preparation method for the etchant of Example A-1, each of etchants of Examples A-2 to A-11 and Comparative Examples A-1 to A-11, having the composition shown in Table 2, was prepared. The content of each component in each etchant (each based on mass) is as described in the table.

The pH's of the prepared treatment liquids of Examples A-1 to A-11 were all within a range of 0 to 12.

[Evaluation of Etchant]

The following test was carried out using the prepared etchants of Examples or Comparative Examples.

<Evaluation of Solubility and Dissolution Selectivity>

A substrate on which a film (a WBx film) consisting of tungsten boride (WBx, W:B=4:1 (in terms of element ratio)) was laminated at a film thickness of 100 nm, and a substrate on which a film (a WOx film) consisting of tungsten oxide (WOx, W:O=4:1 (in terms of element ratio)) was laminated at a film thickness of 100 nm was produced, and the prepared substrate was cut into a 2×2 cm square to prepare a specimen.

Each of the obtained specimens was immersed in the etchant of each Example or each Comparative Example for 10 minutes. Table 2 shows the temperatures of the etchants at this time.

Before and after the immersion test, the film thickness of each film was measured with an optical film thickness meter Ellipsometer M-2000 (manufactured by J.A. Woollam Co.). From the measured film thicknesses before and after immersion, the dissolution rate (Å/min) of each film in a case where each etchant was used was calculated.

The calculated dissolution rate of the WBx film is shown in Table 2.

In addition, in each Example and each Comparative Example, the ratio of the dissolution rate of the WOx film to the dissolution rate of the WBx film (the dissolution rate ratio of the WOx film/the WBx film) was obtained from the dissolution rate of each film obtained by the above method. From each of the calculated dissolution rate ratios, the dissolution selectivity of the WOx film with respect to the WBx film was evaluated based on the following evaluation standards.

(Evaluation Standard for Dissolution Selectivity)
  A: The dissolution rate ratio of the WOx film/the WBx film is 20 or more.
  B: The dissolution rate ratio of the WOx film/the WBx film is 1 or more and less than 20.
  C: The dissolution rate ratio of the WOx film/the WBx film is less than 1.

Table 2 shows the composition of the etchant and the evaluation results in each Example and Comparative Example.

In the table, the "Amount" column indicates the content (unit: % by mass) of the corresponding component, and the "Amount [ppm]" column indicates the content (unit: ppm by mass) of the corresponding component.

TABLE 2

| Example | Water Amount | Copolymer Chemical | Copolymer Amount [ppm] | Removing agent Chemical | Amount | Chemical | Amount | Chemical | Amount | Chemical | Amount |
|---|---|---|---|---|---|---|---|---|---|---|---|
| A-1 | 99.48% | CP-1 | 250 | Hydrofluoric acid | 0.50% | | | | | | |
| A-2 | 20.34% | CP-3 | 250 | Phosphoric acid | 73.17% | Acetic acid | 3.33% | | | | |
| A-3 | 96.71% | CP-5 | 250 | TEAH | 1.27% | | | | | | |
| A-4 | 92.72% | CP-2 | 250 | HAS | 2.46% | TMAH | 3.80% | Citric acid | 1.00% | | |
| A-5 | 78.25% | CP-1 | 250 | HAS | 21.50% | TMAH | 0.23% | | | | |
| A-6 | 48.82% | CP-1 | 250 | HA | 5.00% | Methanesulfonic acid | 3.68% | Isethionic acid | 0.63% | | |
| A-7 | 21.48% | CP-4 | 250 | HA | 7.50% | AEEA | 1.00% | | | | |
| A-8 | 54.98% | CP-7 | 250 | Cy-DTA | 0.70% | TMAH | 1.30% | | | | |
| A-9 | 99.66% | CP-8 | 250 | HEDEPO | 0.01% | Citric acid | 0.30% | | | | |
| A-10 | 27.48% | CP-13 | 250 | NH$_4$F | 2.50% | | | | | | |
| A-11 | 22.87% | CP-16 | 250 | Hydrofluoric acid | 0.20% | Acetic acid | 61.00% | Sulfuric acid | 0.90% | APDA | 0.01% |

| Comparative Example | Water Amount | Copolymer Chemical | Copolymer Amount [ppm] | Removing agent Chemical | Amount | Chemical | Amount | Chemical | Amount | Chemical | Amount |
|---|---|---|---|---|---|---|---|---|---|---|---|
| A-1 | 99.50% | Absent | | Hydrofluoric acid | 0.50% | | | | | | |
| A-2 | 20.36% | Absent | | Phosphoric acid | 73.17% | Acetic acid | 3.33% | | | | |
| A-3 | 96.73% | Absent | | TEAH | 1.27% | | | | | | |
| A-4 | 92.74% | Absent | | HAS | 2.46% | TMAH | 3.80% | Citric acid | 1.00% | | |
| A-5 | 78.27% | Absent | | HAS | 21.50% | TMAH | 0.23% | | | | |
| A-6 | 48.85% | Absent | | HA | 5.00% | Methanesulfonic acid | 3.68% | Isethionic acid | 0.63% | | |
| A-7 | 21.50% | Absent | | HA | 7.50% | AEEA | 1.00% | | | | |
| A-8 | 55.00% | Absent | | Cy-DTA | 0.70% | TMAH | 1.30% | | | | |
| A-9 | 99.68% | Absent | | HEDEPO | 0.01% | Citric acid | 0.30% | | | | |
| A-10 | 27.50% | Absent | | NH$_4$F | 2.50% | | | | | | |
| A-11 | 22.90% | Absent | | Hydrofluoric acid | 0.20% | Acetic acid | 61.00% | Sulfuric acid | 0.90% | APDA | 0.01% |

TABLE 3

| Etchant composition Oxidizing agent Chemical | Amount | Corrosion inhibitor Chemical | Amount | Organic solvent Chemical | Amount | WBx Dissolution rate [Å/min] | Dissolution selectivity Target | Evaluation | Treatment temperature [° C.] |
|---|---|---|---|---|---|---|---|---|---|
| | | | | | | 2.1 | WOx | A | 21 |
| Nitric acid | 3.14% | | | | | 2.4 | WOx | A | 87 |
| Periodic acid | 2.00% | | | | | 0.3 | WOx | A | 21 |
| | | | | | | 0.7 | WOx | A | 40 |
| | | | | | | 0.5 | WOx | A | 40 |
| | | 5MBTA | 0.50% | PG | 41.35% | 0.8 | WOx | A | 40 |
| | | | | HG | 70.00% | 1.5 | WOx | A | 40 |
| | | | | Sulfolane | 43.00% | 6.7 | WOx | A | 40 |
| | | DBS | 0.01% | | | 0.1 | WOx | A | 21 |
| | | | | EGME | 70.00% | 0.1 | WOx | A | 21 |
| Hydrogen peroxide | 3.00% | | | | | 0.1 | WOx | A | 21 |
| Acetic acid | 12.00% | | | | | | | | |

TABLE 3-continued

| Etchant composition | | | | | | Evaluation | | | Treatment temperature [° C.] |
|---|---|---|---|---|---|---|---|---|---|
| Oxidizing agent | | Corrosion inhibitor | | Organic solvent | | WBx Dissolution rate [Å/min] | Dissolution selectivity | | |
| Chemical | Amount | Chemical | Amount | Chemical | Amount | | Target | Evaluation | |
|  |  |  |  |  |  | 15.6 | WOx | C | 21 |
| Nitric acid | 3.14% |  |  |  |  | 21.6 | WOx | C | 87 |
| Periodic acid | 2.00% |  |  |  |  | 12.9 | WOx | C | 21 |
|  |  |  |  |  |  | 9.1 | WOx | C | 40 |
|  |  |  |  |  |  | 2.3 | WOx | C | 40 |
|  |  | 5MBTA | 0.50% | PG | 41.35% | 3.3 | WOx | C | 40 |
|  |  |  |  | HG | 70.00% | 3.8 | WOx | C | 40 |
|  |  |  |  | Sulfolane | 43.00% | 9.3 | WOx | C | 40 |
|  |  | DBS | 0.01% |  |  | 2.1 | WOx | C | 21 |
|  |  |  |  | EGME | 70.00% | 6.0 | WOx | C | 21 |
| Hydrogen peroxide | 3.00% |  |  |  |  | 8.0 | WOx | C | 21 |
| Acetic acid | 12.00% |  |  |  |  |  |  |  |  |

From the results shown in Table 2, it has been confirmed that the present treatment liquid (the etchant) is excellent in the dissolution selectivity of the WOx film with respect to the WBx film and the corrosion prevention property with respect to the WBx film.

The dissolution selectivity of the etchants of Examples A-1 to A-11 was evaluated according to the above method, except that in Examples A-1 to A-11, a film consisting of silicon oxide ($SiO_2$), a film consisting of aluminum oxide ($Al_2O_3$), a Ru film, a film consisting of cobalt oxide (CoO), a film consisting of copper oxide (CuO), and a film consisting of silicon germanium (Si:Ge=75:25 (in terms of element ratio)) were respectively used instead of the WOx film shown in Table 2. As a result, it has been confirmed that regarding the etchants of Examples A-1 to A-11, the dissolution selectivity of the films other than the WOx film with respect to the WBx film is also as excellent as each film to be removed.

In addition, the dissolution rate and the dissolution selectivity of the etchants of Examples A-1 to A-11 were evaluated according to the above method, except that in Examples A-1 to A-11, instead of the WBx film, a specimen obtained by laminating, on a substrate, a film consisting of a tungsten single body and a film consisting of a W-based metal material obtained by adding one element selected from the group consisting of carbon, nitrogen, and phosphorus to tungsten was prepared. As a result, it has been confirmed that regarding the etchants of Examples A-1 to A-11, the dissolution rate and the dissolution selectivity with respect to each of the films consisting of a tungsten single body and the film consisting of the W-based metal material containing each of the above-described elements are also as excellent as the WBx film.

Example B

[Preparation of Washing Solution]

In Examples B-1 to B-66 and Comparative Examples B-1 to B-2, washing solutions were prepared. A preparation method for the washing solution will be described by taking Example B-1 as an example.

Each of the compound CP-1, hydroxylamine (HA), diethylenetriaminepentaacetic acid (DTPA), tetrabutylammonium hydroxide (TBAH), ethylene glycol butyl ether (EGBE), and ultrapure water was mixed so that the amount thereof was the content shown in Table 3, and then the obtained mixed solution was sufficiently stirred with a stirrer to prepare a washing solution of Example B-1.

According to the preparation method for the washing solution of Example B-1, each of washing solutions of Examples B-2 to B-66 and Comparative Examples B-1 to B-2, having the compositions shown in Table 3, was prepared. The content of each component in each washing solution (each based on mass) is as described in the table.

Table 3 shows the pH of the prepared washing solutions of Examples B-1 to B-66.

[Evaluation of Washing Solution]

The following test was carried out using the prepared washing solutions of Examples or Comparative Examples.

<Evaluation of Solubility and Dissolution Selectivity>

According to the method described in <Evaluation of solubility> in [Example A], each of substrates on which a Co film consisting of a cobalt single body (Co), a W film consisting of a tungsten single body (W), a WBx film consisting of tungsten boride (WBx), a CoO film consisting of cobalt oxide (CoO), or a WOx film consisting of tungsten oxide (WOx) was laminated at a film thickness of 100 nm was produced, and each of these substrates was cut into a square shape of 2 cm×2 cm to prepare a specimen.

Each of the obtained specimens was immersed in the washing solution of each Example or each Comparative Example for 10 minutes. Table 3 shows the temperatures of the washing solutions at this time.

Before and after the immersion test, the film thickness of each film was measured with an optical film thickness meter Ellipsometer M-2000 (manufactured by J.A. Woollam Co.). From the measured film thicknesses before and after immersion, the dissolution rate (Å/min) of each film in a case where each washing solution was used was calculated.

Table 3 shows the calculated dissolution rates of the Co film, the W film, and the WBx film.

In each Example and each Comparative Example, the ratio of the dissolution rate of the WOx film to the dissolution rate of the WBx film was obtained from the dissolution rate of the WBx film and the dissolution rate of the WOx film, obtained by the above method. From the calculated dissolution rate ratio, the dissolution selectivity of the WOx film with respect to the WBx film was evaluated based on the following evaluation standards.

(Evaluation Standard for Dissolution Selectivity)

A: The dissolution rate ratio of the WOx film/the WBx film is 20 or more.

B: The dissolution rate ratio of the WOx film/the WBx film is 5 or more and less than 20.
C: The dissolution rate ratio of the WOx film/the WBx film is 1 or more and less than 5.
D: The dissolution rate ratio of the WOx film/the WBx film is less than 1.

In addition, in each Example and each Comparative Example, the ratio of the dissolution rate of the CoOx film to the dissolution rate of the Co film was obtained from the dissolution rate of the Co film and the dissolution rate of the CoOx film, obtained by the above method. From the calculated dissolution rate ratio, the dissolution selectivity of the CoOx film with respect to the Co film was evaluated based on the following evaluation standards.
(Evaluation Standard for Dissolution Selectivity)
A: The dissolution rate ratio of the CoOx film/the Co film is 20 or more.
B: The dissolution rate ratio of the CoOx film/the Co film is 5 or more and less than 20.
C: The dissolution rate ratio of the CoOx film/the Co film is 1 or more and less than 5.
D: The dissolution rate ratio of the CoOx film/the Co film is less than 1.

<Evaluation of Residue Removability>

A laminate (corresponding to a laminate before treatment) including a WBx film, a $SiO_2$ film, and a metal hard mask (TiN) having a predetermined opening portion, in this order, was formed on a substrate (Si). Using the obtained laminate, dry etching was carried out using the metal hard mask as a mask, and the $SiO_2$ film was etched until the surface of the WBx film was exposed to form holes, thereby preparing a sample 1 (FIG. 1). When a cross section of this laminate was checked with a scanning electron microscope (SEM), dry etching residues were observed on the wall surface in the holes.

Residue removability was evaluated by the following procedure. First, a section (having a square shape of about 2.0 cm×2.0 cm) of the prepared sample 1 was immersed in each washing solution of which the temperature was adjusted to 60° C. Immediately after 5 minutes had elapsed from the start of the immersion, the section of the sample 1 was taken out, immediately washed with ultrapure water, and dried with $N_2$. Then, the surface of the section of the immersed sample 1 was observed with SEM to check the presence or absence of the dry etching residues. Similarly, the section of the sample 1, which had been immersed for 10 minutes, was washed with ultrapure water and dried with $N_2$, and then the surface of the section was observed with SEM to check the presence or absence of the dry etching residues.

From the observation results of each section of the sample 1, the removability of the dry etching residues ("residue removability") was evaluated according to the following determination standards.
(Evaluation Standard for Residue Removability)
A: The dry etching residues have been completely removed by immersion for 5 minutes.
B: The dry etching residues have not been completely removed by immersion for 5 minutes but have been completely removed by immersion for 10 minutes.
C: The dry etching residues have not been completely removed by immersion for 10 minutes.

<Evaluation of Residual Rate of Washing Solution after Rinsing>

According to the method described in <Evaluation of solubility and dissolution selectivity> described above, a laminate having a WBx film was subjected to a treatment of immersing the laminate in each of the washing solutions of Examples and Comparative Examples. Next, the WBx film was subjected to a rinsing treatment by immersing the laminate subjected to the immersion treatment, in a rinsing liquid consisting of isopropanol for 0.5 minutes.

The surface of the WBx film subjected to the rinsing treatment was analyzed by the X-ray photoelectron spectroscopic analysis, and the ratio (unit: atom %) of the number of nitrogen atoms derived from the washing solution of each Example or Comparative Example to the number of all atoms on the surface of the WBx film was measured.

In addition, the measurement conditions of the X-ray photoelectron spectroscopic analysis are shown below.
(Measurement Conditions)
Device: Quantera SXMTM manufactured by ULVAC-PHI. Inc.
X-ray source: Monochromatic Al Kα ray
X-ray beam diameter: φ200 μm
Signal capture angle: 45°

Table 3 shows the compositions of the used washing solutions and the evaluation results in Examples B-1 to B-66 and Comparative Examples B-1 to B-2.

In the table, the "Amount" column indicates the content (unit: % by mass) of the corresponding component, and the "Amount [ppm]" column indicates the content (unit: ppm by mass) of the corresponding component.

In addition, "n. d" in the "Residual rate after rinsing" column means that the number of nitrogen atoms is equal to or less than the detection limit (the number of nitrogen atoms is equal to or lower than the detection limit with respect to the total number of atoms).

TABLE 4

| | | Washing solution composition | | | | | | | |
|---|---|---|---|---|---|---|---|---|---|
| | Water | | Copolymer | | | Removing agent | | | |
| Example | Amount | Chemical | Amount [ppm] | Chemical | Amount | Chemical | Amount | Chemical | Amount |
| B-1 | 91.25% | CP-1 | 250 | HA | 5.00% | DTPA | 0.15% | TBAH | 0.38% |
| B-2 | 91.25% | CP-2 | 250 | HA | 5.00% | DTPA | 0.15% | TBAH | 0.38% |
| B-3 | 91.25% | CP-3 | 250 | HA | 5.00% | DTPA | 0.15% | TBAH | 0.38% |
| B-4 | 91.25% | CP-4 | 250 | HA | 5.00% | DTPA | 0.15% | TBAH | 0.38% |
| B-5 | 91.25% | CP-5 | 250 | HA | 5.00% | DTPA | 0.15% | TBAH | 0.38% |
| B-6 | 91.25% | CP-6 | 250 | HA | 5.00% | DTPA | 0.15% | TBAH | 0.38% |
| B-7 | 91.25% | CP-7 | 250 | HA | 5.00% | DTPA | 0.15% | TBAH | 0.38% |
| B-8 | 91.25% | CP-8 | 250 | HA | 5.00% | DTPA | 0.15% | TBAH | 0.38% |
| B-9 | 91.25% | CP-9 | 250 | HA | 5.00% | DTPA | 0.15% | TBAH | 0.38% |

TABLE 4-continued

| | Washing solution composition | | | | | | | | |
|---|---|---|---|---|---|---|---|---|---|
| | Water | | Copolymer | | Removing agent | | | | |
| | | | | Amount | | | | | |
| Example | Amount | Chemical | [ppm] | Chemical | Amount | Chemical | Amount | Chemical | Amount |
| B-10 | 91.25% | CP-10 | 250 | HA | 5.00% | DTPA | 0.15% | TBAH | 0.38% |
| B-11 | 91.25% | CP-11 | 250 | HA | 5.00% | DTPA | 0.15% | TBAH | 0.38% |
| B-12 | 91.25% | CP-12 | 250 | HA | 5.00% | DTPA | 0.15% | TBAH | 0.38% |
| B-13 | 91.25% | CP-13 | 250 | HA | 5.00% | DTPA | 0.15% | TBAH | 0.38% |
| B-14 | 91.25% | CP-14 | 250 | HA | 5.00% | DTPA | 0.15% | TBAH | 0.38% |
| B-15 | 91.25% | CP-15 | 250 | HA | 5.00% | DTPA | 0.15% | TBAH | 0.38% |
| B-16 | 91.25% | CP-16 | 250 | HA | 5.00% | DTPA | 0.15% | TBAH | 0.38% |
| B-17 | 91.25% | CP-17 | 250 | HA | 5.00% | DTPA | 0.15% | TBAH | 0.38% |
| B-18 | 91.25% | CP-18 | 250 | HA | 5.00% | DTPA | 0.15% | TBAH | 0.38% |
| B-19 | 91.25% | CP-19 | 250 | HA | 5.00% | DTPA | 0.15% | TBAH | 0.38% |
| B-20 | 91.25% | CP-20 | 250 | HA | 5.00% | DTPA | 0.15% | TBAH | 0.38% |
| B-21 | 91.25% | CP-21 | 250 | HA | 5.00% | DTPA | 0.15% | TBAH | 0.38% |
| B-22 | 91.25% | CP-22 | 250 | HA | 5.00% | DTPA | 0.15% | TBAH | 0.38% |
| B-23 | 91.25% | CP-23 | 250 | HA | 5.00% | DTPA | 0.15% | TBAH | 0.38% |
| B-24 | 91.25% | CP-24 | 250 | HA | 5.00% | DTPA | 0.15% | TBAH | 0.38% |
| B-25 | 91.25% | CP-25 | 250 | HA | 5.00% | DTPA | 0.15% | TBAH | 0.38% |
| B-26 | 91.26% | CP-16 | 125 | HA | 5.00% | DTPA | 0.15% | TBAH | 0.38% |
| B-27 | 91.22% | CP-16 | 500 | HA | 5.00% | DTPA | 0.15% | TBAH | 0.38% |
| B-28 | 91.26% | CP-20 | 125 | HA | 5.00% | DTPA | 0.15% | TBAH | 0.38% |
| B-29 | 91.22% | CP-20 | 500 | HA | 5.00% | DTPA | 0.15% | TBAH | 0.38% |
| B-30 | 91.26% | CP-21 | 60 | HA | 5.00% | DTPA | 0.15% | TBAH | 0.38% |
| B-31 | 91.26% | CP-21 | 125 | HA | 5.00% | DTPA | 0.15% | TBAH | 0.38% |
| B-32 | 91.23% | CP-21 | 375 | HA | 5.00% | DTPA | 0.15% | TBAH | 0.38% |
| B-33 | 91.26% | CP-23 | 125 | HA | 5.00% | DTPA | 0.15% | TBAH | 0.38% |
| B-34 | 91.22% | CP-23 | 500 | HA | 5.00% | DTPA | 0.15% | TBAH | 0.38% |
| B-35 | 91.25% | CP-26 | 250 | HA | 5.00% | DTPA | 0.15% | TBAH | 0.38% |

TABLE 5

| | Washing solution composition | | | | pH of | Evaluation | | | | | | | |
|---|---|---|---|---|---|---|---|---|---|---|---|---|---|
| | Corrosion inhibitor | | Organic solvent | | washing | Dissolution rate[Å/min] | | | Dissolution selectivity | | Residue | Residual rate after rinsing | Treatment temperature |
| Example | Chemical | Amount | Chemical | Amount | solution | Co | W | WBx | CoO/Co | WOx/WBx | removability | [atom %] | [° C.] |
| B-1 | 5MBTA | 0.20% | EGBE | 3.00% | 8.6 | 0.1 | 0.3 | 2.3 | B | B | A | 5.2 | 40 |
| B-2 | 5MBTA | 0.20% | EGBE | 3.00% | 8.6 | 0.0 | 0.5 | 3.3 | B | B | A | 6.2 | 40 |
| B-3 | 5MBTA | 0.20% | EGBE | 3.00% | 8.6 | 0.2 | 0.4 | 4.4 | B | B | A | 3.8 | 40 |
| B-4 | 5MBTA | 0.20% | EGBE | 3.00% | 8.6 | 0.1 | 0.4 | 2.5 | B | B | B | 5.8 | 40 |
| B-5 | 5MBTA | 0.20% | EGBE | 3.00% | 8.6 | 0.1 | 0.4 | 9.5 | B | A | A | 2.1 | 40 |
| B-6 | 5MBTA | 0.20% | EGBE | 3.00% | 8.6 | 0.0 | 1.4 | 10.9 | B | B | A | 6.7 | 40 |
| B-7 | 5MBTA | 0.20% | EGBE | 3.00% | 8.6 | 0.0 | 1.2 | 3.8 | B | B | B | 6.7 | 40 |
| B-8 | 5MBTA | 0.20% | EGBE | 3.00% | 8.6 | 0.0 | 0.4 | 8.2 | B | B | A | 0.0 | 40 |
| B-9 | 5MBTA | 0.20% | EGBE | 3.00% | 8.6 | 0.0 | 0.2 | 3.3 | B | B | A | 5.2 | 40 |
| B-10 | 5MBTA | 0.20% | EGBE | 3.00% | 8.6 | 0.1 | 0.5 | 3.7 | B | B | A | 9.3 | 40 |
| B-11 | 5MBTA | 0.20% | EGBE | 3.00% | 8.6 | 0.0 | 0.5 | 3.5 | B | B | B | 5.9 | 40 |
| B-12 | 5MBTA | 0.20% | EGBE | 3.00% | 8.6 | 0.3 | 0.2 | 9.2 | B | A | A | 0.0 | 40 |
| B-13 | 5MBTA | 0.20% | EGBE | 3.00% | 8.6 | 0.3 | 0.5 | 5.1 | B | B | A | 3.7 | 40 |
| B-14 | 5MBTA | 0.20% | EGBE | 3.00% | 8.6 | 0.0 | 0.4 | 5.2 | B | B | A | 3.4 | 40 |
| B-15 | 5MBTA | 0.20% | EGBE | 3.00% | 8.6 | 0.1 | 0.4 | 3.0 | B | B | B | 7.2 | 40 |
| B-16 | 5MBTA | 0.20% | EGBE | 3.00% | 8.6 | 0.0 | 0.7 | 3.6 | B | B | B | 2.1 | 40 |
| B-17 | 5MBTA | 0.20% | EGBE | 3.00% | 8.6 | 0.1 | 0.8 | 7.3 | B | B | B | 4.1 | 40 |
| B-18 | 5MBTA | 0.20% | EGBE | 3.00% | 8.6 | 0.0 | 0.8 | 7.3 | B | B | A | 4.5 | 40 |
| B-19 | 5MBTA | 0.20% | EGBE | 3.00% | 8.6 | 0.1 | 1.2 | 7.1 | B | B | A | n. d | 40 |
| B-20 | 5MBTA | 0.20% | EGBE | 3.00% | 8.6 | 0.3 | 0.6 | 3.1 | B | A | B | 4.1 | 40 |
| B-21 | 5MBTA | 0.20% | EGBE | 3.00% | 8.6 | 0.0 | 0.7 | 0.5 | B | B | B | 4.6 | 40 |
| B-22 | 5MBTA | 0.20% | EGBE | 3.00% | 8.6 | 0.7 | 1.3 | 8.6 | B | B | B | 0.0 | 40 |
| B-23 | 5MBTA | 0.20% | EGBE | 3.00% | 8.6 | 0.2 | 0.5 | 2.7 | B | B | B | 0.0 | 40 |
| B-24 | 5MBTA | 0.20% | EGBE | 3.00% | 8.6 | 1.1 | 0.6 | 6.2 | B | B | B | 0.0 | 40 |
| B-25 | 5MBTA | 0.20% | EGBE | 3.00% | 8.6 | 0.1 | 0.5 | 2.8 | B | B | A | 2.4 | 40 |
| B-26 | 5MBTA | 0.20% | EGBE | 3.00% | 8.6 | 0.0 | 0.9 | 3.7 | B | B | A | 2.4 | 40 |
| B-27 | 5MBTA | 0.20% | EGBE | 3.00% | 8.6 | 0.1 | 0.7 | 2.9 | B | B | A | 3.0 | 40 |
| B-28 | 5MBTA | 0.20% | EGBE | 3.00% | 8.6 | 0.3 | 0.6 | 3.9 | B | B | A | 0.0 | 40 |
| B-29 | 5MBTA | 0.20% | EGBE | 3.00% | 8.6 | 0.3 | 0.5 | 2.0 | B | B | A | 1.1 | 40 |
| B-30 | 5MBTA | 0.20% | EGBE | 3.00% | 8.6 | 0.1 | 0.6 | 3.2 | B | B | A | 3.7 | 40 |
| B-31 | 5MBTA | 0.20% | EGBE | 3.00% | 8.6 | 0.1 | 0.6 | 1.9 | B | A | B | 4.1 | 40 |

TABLE 5-continued

| | Washing solution composition | | | | pH of washing solution | Evaluation | | | | | | | |
|---|---|---|---|---|---|---|---|---|---|---|---|---|---|
| | Corrosion inhibitor | | Organic solvent | | | Dissolution rate[Å/min] | | | Dissolution selectivity | | Residue removability | Residual rate after rinsing [atom %] | Treatment temperature [° C.] |
| Example | Chemical | Amount | Chemical | Amount | | Co | W | WBx | CoO/Co | WOx/WBx | | | |
| B-32 | 5MBTA | 0.20% | EGBE | 3.00% | 8.6 | 0.1 | 0.4 | 1.9 | B | A | B | 4.3 | 40 |
| B-33 | 5MBTA | 0.20% | EGBE | 3.00% | 8.6 | 0.2 | 0.5 | 2.6 | B | B | A | 0.0 | 40 |
| B-34 | 5MBTA | 0.20% | EGBE | 3.00% | 8.6 | 0.1 | 0.4 | 3.6 | B | B | A | 1.6 | 40 |
| B-35 | 5MBTA | 0.20% | EGBE | 3.00% | 8.6 | 0.3 | 0.8 | 5.3 | B | B | A | 1.1 | 40 |

TABLE 6

| | Washing solution composition | | | | | | | | |
|---|---|---|---|---|---|---|---|---|---|
| | Water | Copolymer | | Removing agent | | | | | |
| Example | Amount | Chemical | Amount [ppm] | Chemical | Amount | Chemical | Amount | Chemical | Amount |
| B-36 | 91.25% | CP-27 | 250 | HA | 5.00% | DTPA | 0.15% | TBAH | 0.38% |
| B-37 | 91.25% | CP-28 | 250 | HA | 5.00% | DTPA | 0.15% | TBAH | 0.38% |
| B-38 | 91.25% | CP-29 | 250 | HA | 5.00% | DTPA | 0.15% | TBAH | 0.38% |
| B-39 | 91.25% | CP-30 | 250 | HA | 5.00% | DTPA | 0.15% | TBAH | 0.38% |
| B-40 | 91.25% | CP-31 | 250 | HA | 5.00% | DTPA | 0.15% | TBAH | 0.38% |
| B-41 | 91.25% | CP-32 | 250 | HA | 5.00% | DTPA | 0.15% | TBAH | 0.38% |
| B-42 | 91.25% | CP-33 | 250 | HA | 5.00% | DTPA | 0.15% | TBAH | 0.38% |
| B-43 | 91.09% | CP-24 | 250 | HA | 5.00% | DTPA | 0.15% | TBAH | 0.54% |
| B-44 | 91.09% | CP-36 | 250 | HA | 5.00% | DTPA | 0.15% | TBAH | 0.54% |
| B-45 | 90.97% | CP-24 | 250 | HA | 5.00% | DTPA | 0.15% | TBAH | 0.66% |
| B-46 | 90.97% | CP-37 | 250 | HA | 5.00% | DTPA | 0.15% | TBAH | 0.66% |
| B-47 | 94.97% | CP-24 | 250 | HA | 1.00% | DTPA | 0.15% | TBAH | 0.66% |
| B-48 | 92.97% | CP-24 | 250 | HA | 3.00% | DTPA | 0.15% | TBAH | 0.66% |
| B-49 | 89.97% | CP-24 | 250 | HA | 6.00% | DTPA | 0.15% | TBAH | 0.66% |
| B-50 | 88.47% | CP-24 | 250 | HA | 7.50% | DTPA | 0.15% | TBAH | 0.66% |
| B-51 | 90.87% | CP-33 | 250 | HA | 5.00% | DTPA | 0.15% | TBAH | 0.76% |
| B-52 | 90.67% | CP-33 | 250 | HA | 5.00% | DTPA | 0.15% | TBAH | 0.96% |
| B-53 | 89.84% | CP-33 | 250 | HA | 5.00% | DTPA | 0.15% | TBAH | 1.79% |
| B-54 | 83.87% | CP-33 | 250 | HA | 5.00% | DTPA | 0.15% | TBAH | 7.76% |
| B-55 | 91.25% | CP-34 | 250 | HA | 5.00% | DTPA | 0.15% | TBAH | 0.38% |
| B-56 | 91.25% | CP-35 | 250 | HA | 5.00% | DTPA | 0.15% | TBAH | 0.38% |
| B-57 | 91.27% | CP-27 | 50 | HA | 5.00% | DTPA | 0.15% | TBAH | 0.38% |
| B-58 | 91.26% | CP-27 | 125 | HA | 5.00% | DTPA | 0.15% | TBAH | 0.38% |
| B-59 | 91.22% | CP-27 | 500 | HA | 5.00% | DTPA | 0.15% | TBAH | 0.38% |
| B-60 | 91.17% | CP-27 | 1000 | HA | 5.00% | DTPA | 0.15% | TBAH | 0.38% |
| B-61 | 90.77% | CP-27 | 5000 | HA | 5.00% | DTPA | 0.15% | TBAH | 0.38% |
| B-62 | 91.27% | CP-33 | 50 | HA | 5.00% | DTPA | 0.15% | TBAH | 0.38% |
| B-63 | 91.26% | CP-33 | 125 | HA | 5.00% | DTPA | 0.15% | TBAH | 0.38% |
| B-64 | 91.22% | CP-33 | 500 | HA | 5.00% | DTPA | 0.15% | TBAH | 0.38% |
| B-65 | 91.17% | CP-33 | 1000 | HA | 5.00% | DTPA | 0.15% | TBAH | 0.38% |
| B-66 | 90.77% | CP-33 | 5000 | HA | 5.00% | DTPA | 0.15% | TBAH | 0.38% |
| Comparative Example B-1 | 91.27% | Absent | — | HA | 5.00% | DTPA | 0.15% | TBAH | 0.38% |
| Comparative Example B-2 | 91.24% | Polyethylene imine | 300 | HA | 5.00% | DTPA | 0.15% | TBAH | 0.38% |

TABLE 7

| | Washing solution composition | | | | pH of washing solution | Dissolution rate[Å/min] | | | Dissolution selectivity | | Residue removability | Residual rate after rinsing [atom %] | Treatment temperature [° C.] |
|---|---|---|---|---|---|---|---|---|---|---|---|---|---|
| | Corrosion inhibitor | | Organic solvent | | | | | | CoO/Co | WOx/WBx | | | |
| Example | Chemical | Amount | Chemical | Amount | | Co | W | WBx | | | | | |
| B-36 | 5MBTA | 0.20% | EGBE | 3.00% | 8.6 | 1.2 | 0.5 | 3.9 | A | A | A | 0.0 | 40 |
| B-37 | 5MBTA | 0.20% | EGBE | 3.00% | 8.6 | 0.8 | 0.9 | 6.1 | B | B | A | 0.0 | 40 |
| B-38 | 5MBTA | 0.20% | EGBE | 3.00% | 8.6 | 0.4 | 1.0 | 7.3 | B | B | A | 0.0 | 40 |
| B-39 | 5MBTA | 0.20% | EGBE | 3.00% | 8.6 | 0.4 | 0.4 | 1.8 | B | A | B | 4.7 | 40 |
| B-40 | 5MBTA | 0.20% | EGBE | 3.00% | 8.6 | 0.6 | 0.6 | 0.9 | B | A | A | 3.2 | 40 |
| B-41 | 5MBTA | 0.20% | EGBE | 3.00% | 8.6 | 0.5 | 0.6 | 4.5 | B | B | A | 2.2 | 40 |
| B-42 | 5MBTA | 0.20% | EGBE | 3.00% | 8.6 | 0.5 | 0.3 | 4.3 | A | A | A | 0.0 | 40 |
| B-43 | 5MBTA | 0.20% | EGBE | 3.00% | 9.0 | 0.5 | 0.3 | 4.3 | A | A | A | 0.0 | 40 |
| B-44 | 5MBTA | 0.20% | EGBE | 3.00% | 9.0 | 0.4 | 0.2 | 2.1 | A | A | A | 1.2 | 40 |
| B-45 | 5MBTA | 0.20% | EGBE | 3.00% | 9.4 | 0.2 | 0.3 | 3.9 | A | A | A | 0.0 | 40 |
| B-46 | 5MBTA | 0.20% | EGBE | 3.00% | 9.4 | 0.3 | 0.1 | 3.2 | A | A | A | 1.5 | 40 |
| B-47 | 5MBTA | 0.20% | EGBE | 3.00% | 9.2 | 0.5 | 0.1 | 3.5 | A | A | A | 0.0 | 40 |
| B-48 | 5MBTA | 0.20% | EGBE | 3.00% | 9.3 | 0.3 | 0.1 | 3.8 | A | A | A | 0.0 | 40 |
| B-49 | 5MBTA | 0.20% | EGBE | 3.00% | 9.5 | 0.4 | 0.4 | 4.9 | A | A | A | 0.0 | 40 |
| B-50 | 5MBTA | 0.20% | EGBE | 3.00% | 9.6 | 0.3 | 0.6 | 5.3 | A | A | A | 0.0 | 40 |
| B-51 | 5MBTA | 0.20% | EGBE | 3.00% | 10.0 | 0.3 | 0.4 | 4.5 | A | A | A | 0.0 | 40 |
| B-52 | 5MBTA | 0.20% | EGBE | 3.00% | 11.0 | 0.2 | 0.5 | 4.6 | A | A | A | 0.0 | 40 |
| B-53 | 5MBTA | 0.20% | EGBE | 3.00% | 12.0 | 0.5 | 0.6 | 4.1 | A | A | A | 0.0 | 40 |
| B-54 | 5MBTA | 0.20% | EGBE | 3.00% | 13.0 | 1.3 | 1.1 | 4.8 | B | A | A | 0.0 | 40 |
| B-55 | 5MBTA | 0.20% | EGBE | 3.00% | 8.6 | 0.5 | 0.2 | 3.7 | B | B | A | 2.1 | 40 |
| B-56 | 5MBTA | 0.20% | EGBE | 3.00% | 8.6 | 0.5 | 0.1 | 3.3 | B | A | A | 2.6 | 40 |
| B-57 | 5MBTA | 0.20% | EGBE | 3.00% | 8.6 | 0.5 | 0.8 | 7.5 | B | B | A | 0.0 | 40 |
| B-58 | 5MBTA | 0.20% | EGBE | 3.00% | 8.6 | 0.5 | 0.6 | 5.8 | A | A | A | 0.0 | 40 |
| B-59 | 5MBTA | 0.20% | EGBE | 3.00% | 8.6 | 0.5 | 0.5 | 5.4 | A | A | A | 0.0 | 40 |
| B-60 | 5MBTA | 0.20% | EGBE | 3.00% | 8.6 | 0.5 | 0.4 | 3.9 | A | A | B | 1.0 | 40 |
| B-61 | 5MBTA | 0.20% | EGBE | 3.00% | 8.6 | 0.5 | 0.3 | 2.5 | B | B | B | 4.5 | 40 |
| B-62 | 5MBTA | 0.20% | EGBE | 3.00% | 8.6 | 0.5 | 0.6 | 5.5 | B | B | A | 0.0 | 40 |
| B-63 | 5MBTA | 0.20% | EGBE | 3.00% | 8.6 | 0.5 | 0.6 | 4.3 | A | B | A | 0.0 | 40 |
| B-64 | 5MBTA | 0.20% | EGBE | 3.00% | 8.6 | 0.5 | 0.4 | 3.7 | A | B | A | 0.0 | 40 |
| B-65 | 5MBTA | 0.20% | EGBE | 3.00% | 8.6 | 0.6 | 0.4 | 1.2 | A | A | B | 2.1 | 40 |
| B-66 | 5MBTA | 0.20% | EGBE | 3.00% | 8.6 | 0.6 | 0.4 | 2.3 | B | A | B | 7.6 | 40 |
| Comparative Example B-1 | 5MBTA | 0.20% | EGBE | 3.00% | 8.6 | 0.3 | 2.1 | 31.1 | C | D | B | 0 | 40 |
| Comparative Example B-2 | 5MBTA | 0.20% | EGBE | 3.00% | 8.6 | 0.3 | 1.5 | 15.6 | C | C | C | 18.6 | 40 |

From the results shown in Table 3, it has been confirmed that the washing solution according to the embodiment of the present invention is excellent in all of the corrosion prevention property with respect to the W-containing film, the dissolution selectivity of the film to be removed with respect to the W-containing film, and the solubility of the washing solution with respect to the rinsing liquid.

In addition, according to the above method, the washing solutions of Examples B-1 to B-66 were evaluated for the dissolution rate, the dissolution selectivity, the residue removability, and the residual rate after rinsing, except that in Examples B-1 to B-66, instead of the W film or the WBx film, a specimen obtained by laminating, on a substrate, a film consisting of a W-based metal material obtained by adding one element selected from the group consisting of carbon, nitrogen, and phosphorus to tungsten was prepared. As a result, it has been confirmed that regarding the washing solutions of Examples B-1 to B-66, the dissolution rate, the dissolution selectivity, the residue removability, and the residual rate after rinsing with respect to each of the films consisting of the W-based metal material containing each of the above-described elements are also as excellent as the WBx film.

Example C

[Preparation of Washing Solution]

Each of the compound CP-1, hydroxylamine (HA), diethylenetriaminepentaacetic acid (DTPA), tetrabutylammonium hydroxide (TBAH), 5-methyl-1H-benzotriazole (5MBTA), ethylene glycol butyl ether (EGBE), a surfactant S-1, and ultrapure water was mixed so that the amount thereof was the content shown in Table 4, and then the obtained mixed solution was sufficiently stirred with a stirrer to prepare a washing solution of Example C-1.

According to the preparation method for the washing solution of Example C-1, each of washing solutions of Examples C-2 to C-7, having the compositions shown in Table 4, was prepared. The content of each component in each washing solution (each based on mass) is as described in the table.

Table 4 shows the pH of the prepared washing solutions of Examples C-1 to C-7.

[Evaluation of Washing Solution]

According to the method described in <Evaluation of solubility> in [Example A], each of substrates on which a TiAlC film consisting of a Co film, a W film, a WBx film, a CoO film, and a titanium-aluminum carbide (TiAlC) was laminated at a film thickness of 100 nm was produced, and each of these substrates was cut into a square shape of 2 cm×2 cm to prepare a specimen.

Next, according to the method described in <Evaluation of solubility and dissolution selectivity> in [Example B], the evaluation test of the solubility of each of the films of the Co film, the W film, the WBx film, and the TiAlC film was carried out in a case where each of the prepared washing solutions of Examples C-1 to C-7 and Example B-36 (for reference) was used.

Table 4 shows the calculated dissolution rate (Å/min) of each of the Co film, the W film, the WBx film, and the TiAlC film.

In addition, according to the methods described in <Evaluation of solubility and dissolution selectivity>, <Evaluation of residue removability>, and <Evaluation of residual rate of washing solution after rinsing> in [Example B], each of the washing solutions C-1 to C-7 was subjected to the evaluation test of the dissolution selectivity, the residue removability, and the residual rate after rinsing.

Table 4 shows the compositions of the washing solutions and the evaluation results in Examples C-1 to C-7 and Examples B-36 (for reference).

In addition, it has been confirmed that in a case where the washing solution contains a surfactant, the corrosion prevention property with respect to the TiAlC film is excellent as compared with a case where the washing solution does not contain a surfactant (the comparison among Examples C-1 to C-7 and Example B-36).

Among the above, it has been confirmed that in a case where the washing solution contains a phosphoric acid ester-based surfactant or a carboxylic acid-based surfactant, the corrosion prevention property with respect to the TiAlC film is more excellent, and in a case where the washing solution contains a phosphoric acid ester-based surfactant, the corrosion prevention property with respect to the TiAlC film is particularly excellent (the comparison among Examples C-1 and C-7).

Further, according to the above method, the washing solutions of Examples C-1 to C-7 were evaluated for the dissolution rate, the dissolution selectivity, the residue removability, and the residual rate after rinsing, except that instead of the W film or the WBx film, a specimen obtained

TABLE 8

| | Washing solution composition | | | | | | | | | |
|---|---|---|---|---|---|---|---|---|---|---|
| | Water | Copolymer | | Removing agent | | | | | Corrosion inhibitor | |
| Example | Amount | Chemical | Amount [ppm] | Chemical | Amount | Chemical | Amount | Chemical | Amount | Chemical | Amount |
| C-1 | 91.20% | CP-27 | 250 | HA | 5.00% | DTPA | 0.15% | TBAH | 0.38% | 5MBTA | 0.20% |
| C-2 | 91.20% | CP-27 | 250 | HA | 5.00% | DTPA | 0.15% | TBAH | 0.38% | 5MBTA | 0.20% |
| C-3 | 91.20% | CP-27 | 250 | HA | 5.00% | DTPA | 0.15% | TBAH | 0.38% | 5MBTA | 0.20% |
| C-4 | 91.20% | CP-27 | 250 | HA | 5.00% | DTPA | 0.15% | TBAH | 0.38% | 5MBTA | 0.20% |
| C-5 | 91.20% | CP-27 | 250 | HA | 5.00% | DTPA | 0.15% | TBAH | 0.38% | 5MBTA | 0.20% |
| C-6 | 91.20% | CP-27 | 250 | HA | 5.00% | DTPA | 0.15% | TBAH | 0.38% | 5MBTA | 0.20% |
| C-7 | 91.20% | CP-27 | 250 | HA | 5.00% | DTPA | 0.15% | TBAH | 0.38% | 5MBTA | 0.20% |
| B-36 | 91.25% | CP-27 | 250 | HA | 5.00% | DTPA | 0.15% | TBAH | 0.38% | 5MBTA | 0.20% |

TABLE 9

| | Washing solution composition | | | | pH of washing solution | Evaluation | | | | | | | | |
|---|---|---|---|---|---|---|---|---|---|---|---|---|---|---|
| | Organic solvent | | Surfactant | | | Dissolution rate [Å/min] | | | | Dissolution selectivity | | Residue remov-ability | Residual rate after rinsing [atom %] | Treatment temperature [° C.] |
| Example | Chemical | Amount | Chemical | Amount | | Co | W | WBx | TiAlC | CoO/Co | WOx/WBx | | | |
| C-1 | EGBE | 3.00% | S-1 | 0.05% | 8.6 | 1.2 | 0.4 | 4.1 | 0.1 | A | A | A | 0.0 | 40 |
| C-2 | EGBE | 3.00% | S-2 | 0.05% | 8.6 | 1.1 | 0.5 | 3.9 | 0.1 | A | A | A | 0.0 | 40 |
| C-3 | EGBE | 3.00% | S-3 | 0.05% | 8.6 | 0.9 | 0.4 | 4.3 | 0.1 | A | A | A | 0.0 | 40 |
| C-4 | EGBE | 3.00% | S-4 | 0.05% | 8.6 | 1.3 | 0.6 | 3.5 | 0.2 | A | A | A | 0.0 | 40 |
| C-5 | EGBE | 3.00% | S-5 | 0.05% | 8.6 | 1.1 | 0.5 | 3.8 | 0.2 | A | A | A | 0.0 | 40 |
| C-6 | EGBE | 3.00% | S-6 | 0.05% | 8.6 | 1.2 | 0.5 | 3.5 | 2.3 | A | A | A | 0.0 | 40 |
| C-7 | EGBE | 3.00% | S-7 | 0.05% | 8.6 | 1.1 | 0.5 | 3.6 | 2.3 | A | A | A | 0.0 | 40 |
| B-36 | EGBE | 3.00% | — | — | 8.6 | 1.2 | 0.5 | 3.9 | 5.0 | A | A | A | 0.0 | 40 |

From the results shown in Table 4, it has been confirmed that the washing solutions of Examples C-1 to C-7, which are the washing solutions according to the embodiment of the present invention, have the corrosion prevention property with respect to the W-containing film, the dissolution selectivity of the film to be removed with respect to the W-containing film, the removal performance for dry etching residues (the residue removability), and the solubility of the washing solution with respect to the rinsing liquid, which are as excellent as the washing solution B-36.

by laminating, on a substrate, a film consisting of a W-based metal material obtained by adding one element selected from the group consisting of carbon, nitrogen, and phosphorus to tungsten was prepared. As a result, it has been confirmed that regarding the washing solutions of Examples C-1 to C-7, the dissolution rate, the dissolution selectivity, the residue removability, and the residual rate after rinsing with respect to each of the films consisting of the W-based metal material containing each of the above-described elements are also as excellent as the case of being applied to the WBx film.

Example D

[Preparation of Washing Solution]

Each of the compound CP-1, hydroxylamine (HA), diethylenetriaminepentaacetic acid (DTPA), tetrabutylammonium hydroxide (TBAH), allylamine, maleic acid, 5-methyl-1H-benzotriazole (5MBTA), ethylene glycol butyl ether (EGBE), and ultrapure water was mixed so that the amount thereof was the content shown in Table 5, and then the obtained mixed solution was sufficiently stirred with a stirrer to prepare a washing solution of Example D-1.

According to the preparation method for the washing solution of Example D-1, each of washing solutions of Examples D-2 to D-34, having the compositions shown in Table 5, was prepared. The content of each component in each washing solution (each based on mass) is as described in the table.

Table 5 shows the pH of the prepared washing solutions of Examples D-1 to D-34.

[Evaluation of Washing Solution]

According to the methods described in <Evaluation of solubility and dissolution selectivity>, <Evaluation of residue removability>, and <Evaluation of residual rate of washing solution after rinsing> in [Example B], each of the washing solutions D-1 to D-34 was subjected to the evaluation test of the solubility, the dissolution selectivity, the residue removability, and the residual rate after rinsing with respect to each of the Co film, the W film, and the WBx film.

Table 5 shows the compositions of the washing solutions and the evaluation results in Examples D-1 to D-34.

TABLE 10

| | | Washing solution composition | | | | | | | |
|---|---|---|---|---|---|---|---|---|---|
| | Water | Copolymer | | Removing agent | | | | | |
| Example | Amount | Chemical | Amount [ppm] | Chemical | Amount | Chemical | Amount | Chemical | Amount |
| D-1 | 91.23% | CP-12 | 250 | HA | 5.00% | DTPA | 0.15% | TBAH | 0.38% |
| D-2 | 91.23% | CP-20 | 250 | HA | 5.00% | DTPA | 0.15% | TBAH | 0.38% |
| D-3 | 91.23% | CP-21 | 250 | HA | 5.00% | DTPA | 0.15% | TBAH | 0.38% |
| D-4 | 91.23% | CP-22 | 250 | HA | 5.00% | DTPA | 0.15% | TBAH | 0.38% |
| D-5 | 91.23% | CP-23 | 250 | HA | 5.00% | DTPA | 0.15% | TBAH | 0.38% |
| D-6 | 91.23% | CP-24 | 250 | HA | 5.00% | DTPA | 0.15% | TBAH | 0.38% |
| D-7 | 91.25% | CP-20 | 125 | HA | 5.00% | DTPA | 0.15% | TBAH | 0.38% |
| D-8 | 91.20% | CP-20 | 500 | HA | 5.00% | DTPA | 0.15% | TBAH | 0.38% |
| D-9 | 91.26% | CP-21 | 60 | HA | 5.00% | DTPA | 0.15% | TBAH | 0.38% |
| D-10 | 91.25% | CP-21 | 125 | HA | 5.00% | DTPA | 0.15% | TBAH | 0.38% |
| D-11 | 91.21% | CP-21 | 375 | HA | 5.00% | DTPA | 0.15% | TBAH | 0.38% |
| D-12 | 91.25% | CP-23 | 125 | HA | 5.00% | DTPA | 0.15% | TBAH | 0.38% |
| D-13 | 91.20% | CP-23 | 500 | HA | 5.00% | DTPA | 0.15% | TBAH | 0.38% |
| D-14 | 91.23% | CP-27 | 250 | HA | 5.00% | DTPA | 0.15% | TBAH | 0.38% |
| D-15 | 91.23% | CP-30 | 250 | HA | 5.00% | DTPA | 0.15% | TBAH | 0.38% |
| D-16 | 91.23% | CP-31 | 250 | HA | 5.00% | DTPA | 0.15% | TBAH | 0.38% |
| D-17 | 91.23% | CP-32 | 250 | HA | 5.00% | DTPA | 0.15% | TBAH | 0.38% |
| D-18 | 91.23% | CP-33 | 250 | HA | 5.00% | DTPA | 0.15% | TBAH | 0.38% |
| D-19 | 90.85% | CP-33 | 250 | HA | 5.00% | DTPA | 0.15% | TBAH | 0.76% |
| D-20 | 90.65% | CP-33 | 250 | HA | 5.00% | DTPA | 0.15% | TBAH | 0.96% |
| D-21 | 89.82% | CP-33 | 250 | HA | 5.00% | DTPA | 0.15% | TBAH | 1.79% |
| D-22 | 83.85% | CP-33 | 250 | HA | 5.00% | DTPA | 0.15% | TBAH | 7.76% |
| D-23 | 91.23% | CP-34 | 250 | HA | 5.00% | DTPA | 0.15% | TBAH | 0.38% |
| D-24 | 91.23% | CP-35 | 250 | HA | 5.00% | DTPA | 0.15% | TBAH | 0.38% |
| D-25 | 91.26% | CP-27 | 50 | HA | 5.00% | DTPA | 0.15% | TBAH | 0.38% |
| D-26 | 91.25% | CP-27 | 125 | HA | 5.00% | DTPA | 0.15% | TBAH | 0.38% |
| D-27 | 91.20% | CP-27 | 500 | HA | 5.00% | DTPA | 0.15% | TBAH | 0.38% |
| D-28 | 91.12% | CP-27 | 1000 | HA | 5.00% | DTPA | 0.15% | TBAH | 0.38% |
| D-29 | 90.52% | CP-27 | 5000 | HA | 5.00% | DTPA | 0.15% | TBAH | 0.38% |
| D-30 | 91.26% | CP-33 | 50 | HA | 5.00% | DTPA | 0.15% | TBAH | 0.38% |
| D-31 | 91.25% | CP-33 | 125 | HA | 5.00% | DTPA | 0.15% | TBAH | 0.38% |
| D-32 | 91.20% | CP-33 | 500 | HA | 5.00% | DTPA | 0.15% | TBAH | 0.38% |
| D-33 | 91.12% | CP-33 | 1000 | HA | 5.00% | DTPA | 0.15% | TBAH | 0.38% |
| D-34 | 90.52% | CP-33 | 5000 | HA | 5.00% | DTPA | 0.15% | TBAH | 0.38% |

TABLE 11

| | Washing solution composition | | | | | | | | pH of washing solution |
|---|---|---|---|---|---|---|---|---|---|
| | Removing agent | | | | Corrosion inhibitor | | Organic solvent | | |
| Example | Chemical | Amount [ppm] | Chemical | Amount [ppm] | Chemical | Amount | Chemical | Amount | |
| D-1 | Allylamine | 75 | Maleic acid | 50 | 5MBTA | 0.20% | EGBE | 3.00% | 8.6 |
| D-2 | Allylamine | 75 | Maleic acid | 50 | 5MBTA | 0.20% | EGBE | 3.00% | 8.6 |
| D-3 | Allylamine | 75 | Allylglycine | 50 | 5MBTA | 0.20% | EGBE | 3.00% | 8.6 |
| D-4 | Allylamine | 75 | Fumaric acid | 50 | 5MBTA | 0.20% | EGBE | 3.00% | 8.6 |
| D-5 | Allylamine | 75 | Fumaric acid | 50 | 5MBTA | 0.20% | EGBE | 3.00% | 8.6 |
| D-6 | Allylamine | 75 | Itaconic acid | 50 | 5MBTA | 0.20% | EGBE | 3.00% | 8.6 |
| D-7 | Allylamine | 38 | Maleic acid | 25 | 5MBTA | 0.20% | EGBE | 3.00% | 8.6 |
| D-8 | Allylamine | 150 | Maleic acid | 100 | 5MBTA | 0.20% | EGBE | 3.00% | 8.6 |
| D-9 | Allylamine | 18 | Allylglycine | 12 | 5MBTA | 0.20% | EGBE | 3.00% | 8.6 |
| D-10 | Allylamine | 38 | Allylglycine | 25 | 5MBTA | 0.20% | EGBE | 3.00% | 8.6 |
| D-11 | Allylamine | 113 | Allylglycine | 75 | 5MBTA | 0.20% | EGBE | 3.00% | 8.6 |
| D-12 | Allylamine | 38 | Fumaric acid | 25 | 5MBTA | 0.20% | EGBE | 3.00% | 8.6 |
| D-13 | Allylamine | 150 | Fumaric acid | 100 | 5MBTA | 0.20% | EGBE | 3.00% | 8.6 |
| D-14 | Allylamine | 75 | Itaconic acid | 50 | 5MBTA | 0.20% | EGBE | 3.00% | 8.6 |
| D-15 | Allylamine | 75 | Allylglycine | 50 | 5MBTA | 0.20% | EGBE | 3.00% | 8.6 |
| D-16 | Allylamine | 75 | Allylglycine | 50 | 5MBTA | 0.20% | EGBE | 3.00% | 8.6 |
| D-17 | Allylamine | 75 | Allylglycine | 50 | 5MBTA | 0.20% | EGBE | 3.00% | 8.6 |
| D-18 | Allylamine | 75 | Maleic acid | 50 | 5MBTA | 0.20% | EGBE | 3.00% | 8.6 |
| D-19 | Allylamine | 75 | Maleic acid | 50 | 5MBTA | 0.20% | EGBE | 3.00% | 10.0 |
| D-20 | Allylamine | 75 | Maleic acid | 50 | 5MBTA | 0.20% | EGBE | 3.00% | 11.0 |
| D-21 | Allylamine | 75 | Maleic acid | 50 | 5MBTA | 0.20% | EGBE | 3.00% | 12.0 |
| D-22 | Allylamine | 75 | Maleic acid | 50 | 5MBTA | 0.20% | EGBE | 3.00% | 13.0 |
| D-23 | Allylamine | 75 | Maleic acid | 50 | 5MBTA | 0.20% | EGBE | 3.00% | 8.6 |
| D-24 | Allylamine | 75 | Citraconic acid | 50 | 5MBTA | 0.20% | EGBE | 3.00% | 8.6 |
| D-25 | Allylamine | 15 | Itaconic acid | 10 | 5MBTA | 0.20% | EGBE | 3.00% | 8.6 |
| D-26 | Allylamine | 38 | Itaconic acid | 25 | 5MBTA | 0.20% | EGBE | 3.00% | 8.6 |
| D-27 | Allylamine | 150 | Itaconic acid | 100 | 5MBTA | 0.20% | EGBE | 3.00% | 8.6 |
| D-28 | Allylamine | 300 | Itaconic acid | 200 | 5MBTA | 0.20% | EGBE | 3.00% | 8.6 |
| D-29 | Allylamine | 1500 | Itaconic acid | 1000 | 5MBTA | 0.20% | EGBE | 3.00% | 8.6 |
| D-30 | Allylamine | 15 | Maleic acid | 10 | 5MBTA | 0.20% | EGBE | 3.00% | 8.6 |
| D-31 | Allylamine | 38 | Maleic acid | 25 | 5MBTA | 0.20% | EGBE | 3.00% | 8.6 |
| D-32 | Allylamine | 150 | Maleic acid | 100 | 5MBTA | 0.20% | EGBE | 3.00% | 8.6 |
| D-33 | Allylamine | 300 | Maleic acid | 200 | 5MBTA | 0.20% | EGBE | 3.00% | 8.6 |
| D-34 | Allylamine | 1500 | Maleic acid | 1000 | 5MBTA | 0.20% | EGBE | 3.00% | 8.6 |

TABLE 12

| | Evaluation | | | | | | | |
|---|---|---|---|---|---|---|---|---|
| | Dissolution rate [Å/min] | | | Dissolution selectivity | | Residue removability | Residual rate after rinsing [atom %] | Treatment temperature [° C.] |
| Example | Co | W | WBx | CoO/Co | WOx/WBx | | | |
| D-1 | 0.3 | 0.2 | 9.2 | B | A | A | 0.0 | 40 |
| D-2 | 0.3 | 0.6 | 3.1 | B | A | A | 4.1 | 40 |
| D-3 | 0.0 | 0.7 | 0.5 | B | B | A | 4.6 | 40 |
| D-4 | 0.7 | 1.3 | 8.6 | B | B | A | 0.0 | 40 |
| D-5 | 0.2 | 0.5 | 2.7 | B | B | A | 0.0 | 40 |
| D-6 | 1.1 | 0.6 | 6.2 | B | B | A | 0.0 | 40 |
| D-7 | 0.3 | 0.6 | 3.9 | B | B | A | 0.0 | 40 |
| D-8 | 0.3 | 0.5 | 2.0 | B | B | A | 1.1 | 40 |
| D-9 | 0.1 | 0.6 | 3.2 | B | B | A | 3.7 | 40 |
| D-10 | 0.1 | 0.6 | 1.9 | B | A | A | 4.1 | 40 |
| D-11 | 0.1 | 0.4 | 1.9 | B | A | A | 4.3 | 40 |
| D-12 | 0.2 | 0.5 | 2.6 | B | B | A | 0.0 | 40 |
| D-13 | 0.1 | 0.4 | 3.6 | B | B | A | 1.6 | 40 |
| D-14 | 1.2 | 0.5 | 3.9 | A | A | A | 0.0 | 40 |
| D-15 | 0.4 | 0.4 | 1.8 | B | A | A | 4.7 | 40 |
| D-16 | 0.6 | 0.6 | 0.9 | B | A | A | 3.2 | 40 |
| D-17 | 0.5 | 0.6 | 4.5 | B | B | A | 2.2 | 40 |
| D-18 | 0.5 | 0.3 | 4.3 | A | A | A | 0.0 | 40 |
| D-19 | 0.3 | 0.4 | 4.5 | A | A | A | 0.0 | 40 |
| D-20 | 0.2 | 0.5 | 4.6 | A | A | A | 0.0 | 40 |
| D-21 | 0.5 | 0.6 | 4.1 | A | A | A | 0.0 | 40 |
| D-22 | 1.3 | 1.1 | 4.8 | B | A | A | 0.0 | 40 |
| D-23 | 0.5 | 0.2 | 3.7 | B | B | A | 2.1 | 40 |

TABLE 12-continued

| | | | | Evaluation | | | | |
|---|---|---|---|---|---|---|---|---|
| | Dissolution rate[Å/min] | | | Dissolution selectivity | | Residue removability | Residual rate after rinsing [atom %] | Treatment temperature [° C.] |
| Example | Co | W | WBx | CoO/Co | WOx/WBx | | | |
| D-24 | 0.5 | 0.1 | 3.3 | B | A | A | 2.6 | 40 |
| D-25 | 0.5 | 0.8 | 7.5 | B | B | A | 0.0 | 40 |
| D-26 | 0.5 | 0.6 | 5.8 | A | A | A | 0.0 | 40 |
| D-27 | 0.5 | 0.5 | 5.4 | A | A | A | 0.0 | 40 |
| D-28 | 0.5 | 0.4 | 3.9 | A | A | A | 1.0 | 40 |
| D-29 | 0.5 | 0.3 | 2.5 | B | B | A | 4.5 | 40 |
| D-30 | 0.5 | 0.6 | 5.5 | B | B | A | 0.0 | 40 |
| D-31 | 0.5 | 0.6 | 4.3 | A | B | A | 0.0 | 40 |
| D-32 | 0.5 | 0.4 | 3.7 | A | B | A | 0.0 | 40 |
| D-33 | 0.6 | 0.4 | 1.2 | A | A | A | 2.1 | 40 |
| D-34 | 0.6 | 0.4 | 2.3 | B | A | A | 7.6 | 40 |

From the results shown in Table 5, it has been confirmed that the washing solutions of Examples D-1 to D-34, which are the washing solutions according to the embodiment of the present invention, are excellent in all of the corrosion prevention property with respect to the W-containing film, the dissolution selectivity of the film to be removed with respect to the W-containing film, and the solubility of the washing solution with respect to the rinsing liquid.

In addition, it has been confirmed that in a case where the washing solution contains, as a removing agent, a water-soluble amine and an amino acid or polycarboxylic acid, the removal performance for dry etching residues is further improved (for example, the comparison among Examples D-2 to D-6 and Examples B-20 to B-24, and the like).

Further, according to the above method, the washing solutions of Examples D-1 to D-34 were evaluated for the dissolution rate, the dissolution selectivity, the residue removability, and the residual rate after rinsing, except that instead of the W film or the WBx film, a specimen obtained by laminating, on a substrate, a film consisting of a W-based metal material obtained by adding one element selected from the group consisting of carbon, nitrogen, and phosphorus to tungsten was prepared. As a result, it has been confirmed that regarding the washing solutions of Examples D-1 to D-34, the dissolution rate, the dissolution selectivity, the residue removability, and the residual rate after rinsing with respect to each of the films consisting of the W-based metal material containing each of the above-described elements are also as excellent as the case of being applied to the WBx film.

Example E

[Preparation of Washing Solution]

Each of the compound CP-27, hydroxylamine (HA), diethylenetriaminepentaacetic acid (DTPA), tetrabutylammonium hydroxide (TBAH), 5-methyl-1H-benzotriazole (5MBTA), ethylene glycol butyl ether (EGBE), a surfactant S-4, an antifoaming agent E-1, and ultrapure water was mixed so that the amount thereof was the content shown in Table 6, and then the obtained mixed solution was sufficiently stirred with a stirrer to prepare a washing solution of Example E-1.

According to the preparation method for the washing solution of Example E-1, each of washing solutions of Examples E-2 to E-15, having the compositions shown in Table 6, was prepared. The content of each component in each washing solution (each based on mass) is as described in the table.

Table 6 shows the pH of the prepared washing solutions of Examples E-1 to E-15.

[Evaluation of Washing Solution]

According to the method described in <Evaluation of solubility and dissolution selectivity> in [Example B], the evaluation test of the solubility of each of the films of the Co film, the W film, the WBx film, and the TiAlC film was carried out using each of the prepared washing solutions of Examples E-1 to E-15. Table 6 shows the calculated dissolution rate (Å/min) of each of the Co film, the W film, the WBx film, and the TiAlC film.

In addition, according to the methods described in <Evaluation of solubility and dissolution selectivity>, <Evaluation of residue removability>, and <Evaluation of residual rate of washing solution after rinsing> in [Example B], each of the washing solutions E-1 to E-15 was subjected to the evaluation test of the dissolution selectivity, the residue removability, and the residual rate after rinsing.

<Evaluation of Foaming of Washing Solution>

A 150 mL transparent glass bottle (a wide-neck standard glass bottle PS-No. 12) was filled with 70 g of each of the washing solutions of Examples E-1 to E-15 and C-4, and the transparent glass bottle containing the washing solution was subjected to stirring at 250 rpm for 5 minutes using a shaker. The height (unit: cm) of foaming from the liquid surface immediately after the stirring was stopped was recorded.

The lower the height of the foaming, the more excellent the effect of suppressing the foam residue in the washing solution.

Table 6 shows the compositions of the washing solutions and the evaluation results in Examples E-1 to E-15 and Example C-4 (for reference).

TABLE 13

Washing solution composition

| Example | Water Amount | Copolymer Chemical | Amount [ppm] | Removing agent Chemical | Amount | Chemical | Amount | Chemical | Amount | Corrosion inhibitor Chemical | Amount | Organic solvent Chemical | Amount |
|---|---|---|---|---|---|---|---|---|---|---|---|---|---|
| E-1  | 91.15% | CP-27 | 250 | HA | 5.00% | DTPA | 0.15% | TBAH | 0.38% | 5MBTA | 0.20% | EGBE | 3.00% |
| E-2  | 91.19% | CP-27 | 250 | HA | 5.00% | DTPA | 0.15% | TBAH | 0.38% | 5MBTA | 0.20% | EGBE | 3.00% |
| E-3  | 91.17% | CP-27 | 250 | HA | 5.00% | DTPA | 0.15% | TBAH | 0.38% | 5MBTA | 0.20% | EGBE | 3.00% |
| E-4  | 91.15% | CP-27 | 250 | HA | 5.00% | DTPA | 0.15% | TBAH | 0.38% | 5MBTA | 0.20% | EGBE | 3.00% |
| E-5  | 91.10% | CP-27 | 250 | HA | 5.00% | DTPA | 0.15% | TBAH | 0.38% | 5MBTA | 0.20% | EGBE | 3.00% |
| E-6  | 91.15% | CP-27 | 250 | HA | 5.00% | DTPA | 0.15% | TBAH | 0.38% | 5MBTA | 0.20% | EGBE | 3.00% |
| E-7  | 91.15% | CP-27 | 250 | HA | 5.00% | DTPA | 0.15% | TBAH | 0.38% | 5MBTA | 0.20% | EGBE | 3.00% |
| E-8  | 91.15% | CP-27 | 250 | HA | 5.00% | DTPA | 0.15% | TBAH | 0.38% | 5MBTA | 0.20% | EGBE | 3.00% |
| E-9  | 91.17% | CP-27 | 250 | HA | 5.00% | DTPA | 0.15% | TBAH | 0.38% | 5MBTA | 0.20% | EGBE | 3.00% |
| E-10 | 91.17% | CP-27 | 250 | HA | 5.00% | DTPA | 0.15% | TBAH | 0.38% | 5MBTA | 0.20% | EGBE | 3.00% |
| E-11 | 91.17% | CP-27 | 250 | HA | 5.00% | DTPA | 0.15% | TBAH | 0.38% | 5MBTA | 0.20% | EGBE | 3.00% |
| E-12 | 91.17% | CP-27 | 250 | HA | 5.00% | DTPA | 0.15% | TBAH | 0.38% | 5MBTA | 0.20% | EGBE | 3.00% |
| E-13 | 91.17% | CP-27 | 250 | HA | 5.00% | DTPA | 0.15% | TBAH | 0.38% | 5MBTA | 0.20% | EGBE | 3.00% |
| E-14 | 91.17% | CP-27 | 250 | HA | 5.00% | DTPA | 0.15% | TBAH | 0.38% | 5MBTA | 0.20% | EGBE | 3.00% |
| E-15 | 91.14% | CP-27 | 250 | HA | 5.00% | DTPA | 0.15% | TBAH | 0.38% | 5MBTA | 0.20% | EGBE | 3.00% |
| C-4  | 91.20% | CP-27 | 250 | HA | 5.00% | DTPA | 0.15% | TBAH | 0.38% | 5MBTA | 0.20% | EGBE | 3.00% |

TABLE 14

Evaluation

| Example | Washing solution composition Surfactant Chemical | Amount | Antifoaming agent Chemical | Amount | pH of washing solution | Dissolution rate [Å/min] Co | W | WBx | TiAlC | Dissolution selectivity CoO/Co | WOx/WBx | Residue removability | Residual rate after rinsing [atom %] | Height of foaming [cm] | Treatment temperature [° C.] |
|---|---|---|---|---|---|---|---|---|---|---|---|---|---|---|---|
| E-1  | S-4 | 0.05% | E-1  | 0.05% | 8.6 | 0.3 | 0.3 | 4.1 | 0.1 | A | A | A | 0.0 | 0.5 | 40 |
| E-2  | S-4 | 0.05% | E-2  | 0.01% | 8.6 | 0.4 | 0.3 | 3.9 | 0.2 | A | A | A | 0.0 | 1.2 | 40 |
| E-3  | S-4 | 0.05% | E-2  | 0.03% | 8.6 | 0.6 | 0.2 | 3.4 | 0.3 | A | A | A | 0.0 | 0.1 | 40 |
| E-4  | S-4 | 0.05% | E-2  | 0.05% | 8.6 | 0.2 | 0.4 | 4.3 | 0.1 | A | A | A | 0.0 | 0.0 | 40 |
| E-5  | S-4 | 0.05% | E-2  | 0.10% | 8.6 | 0.5 | 0.5 | 3.5 | 0.2 | A | A | B | 1.3 | 0.0 | 40 |
| E-6  | S-4 | 0.05% | E-3  | 0.05% | 8.6 | 0.7 | 0.6 | 4.6 | 0.3 | A | A | A | 0.0 | 2.1 | 40 |
| E-7  | S-4 | 0.05% | E-4  | 0.05% | 8.6 | 1.0 | 0.7 | 4.8 | 0.4 | A | A | A | 0.0 | 3.2 | 40 |
| E-8  | S-4 | 0.05% | E-5  | 0.05% | 8.6 | 1.1 | 0.9 | 4.1 | 0.4 | A | A | A | 0.0 | 3.6 | 40 |
| E-9  | S-4 | 0.05% | E-6  | 0.03% | 8.6 | 0.4 | 0.5 | 4.5 | 0.2 | A | B | A | 1.2 | 1.5 | 40 |
| E-10 | S-4 | 0.05% | E-7  | 0.03% | 8.6 | 0.2 | 0.3 | 3.9 | 0.5 | A | A | B | 0.5 | 2.4 | 40 |
| E-11 | S-4 | 0.05% | E-8  | 0.03% | 8.6 | 0.6 | 0.6 | 3.8 | 0.1 | B | B | A | 0.0 | 3.5 | 40 |
| E-12 | S-4 | 0.05% | E-9  | 0.03% | 8.6 | 0.3 | 0.7 | 4.1 | 0.4 | B | A | B | 0.0 | 0.8 | 40 |
| E-13 | S-4 | 0.05% | E-10 | 0.03% | 8.6 | 0.5 | 0.8 | 4.2 | 0.2 | A | A | B | 0.0 | 0.7 | 40 |
| E-14 | S-4 | 0.05% | E-11 | 0.03% | 8.6 | 0.1 | 0.2 | 4.5 | 0.4 | A | B | A | 0.0 | 1.1 | 40 |
| E-15 | S-4 | 0.05% | E-2 E-4 | 0.03% 0.03% | 8.6 | 0.5 | 0.2 | 4.6 | 0.4 | A | A | A | 0.0 | 0.0 | 40 |
| C-4  | S-4 | 0.05% | — | — | 8.6 | 1.3 | 0.6 | 3.5 | 0.2 | A | A | A | 0.0 | 5.0 | 40 |

From the results shown in Table 4, it has been confirmed that the washing solutions of Examples E-1 to E-15 are excellent in the corrosion prevention property with respect to the W-containing film, the dissolution selectivity of the film to be removed with respect to the W-containing film, the removal performance for dry etching residues (the residue removability), and the solubility of the washing solution with respect to the rinsing liquid.

In addition, it has been confirmed that in a case where the washing solution contains an antifoaming agent, foam residue can be suppressed as compared with a case where the washing solution does not contain an antifoaming agent (the comparison among Examples E-1 to E-15 and Examples C and Example C-4).

Above all, it has been confirmed that in a case where the washing solution contains a silicone-based antifoaming agent having a high molecular weight (antifoaming agents E-1 and E-2, or the like), the effect of suppressing foam residue is more excellent (the comparison among Examples E-1 to E-15).

Further, according to the above method, the washing solutions of Examples E-1 to E-15 were evaluated for the dissolution rate, the dissolution selectivity, the residue removability, and the residual rate after rinsing, except that instead of the W film or the WBx film, a specimen obtained by laminating, on a substrate, a film consisting of a W-based metal material obtained by adding one element selected from the group consisting of carbon, nitrogen, and phosphorus to tungsten was prepared. As a result, it has been confirmed that regarding the washing solutions of Examples E-1 to E-15, the dissolution rate, the dissolution selectivity, the residue removability, and the residual rate after rinsing with respect to each of the films consisting of the W-based metal material containing each of the above-described elements are also as excellent as the case of being applied to the WBx film.

EXPLANATION OF REFERENCES

1: substrate
2: metal layer
3: etching stop layer
4: insulating film
5: metal hard mask
6: hole
10: laminate
11: inner wall
11a: cross-sectional wall
11b: bottom wall
12: dry etching residue

What is claimed is:

1. A treatment liquid for a semiconductor device, comprising:
water;
a removing agent; and
a resin,
wherein the resin has a first repeating unit having at least one selected from the group consisting of a primary amino group, a secondary amino group, a tertiary amino group, and a quaternary ammonium cation, and a second repeating unit different from the first repeating unit, and
the second repeating unit comprises a sulfonyl group, or a repeating unit represented by Formula (2a),

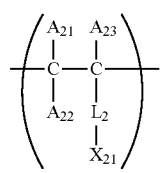

in Formula (2a), $A_{21}$, $A_{22}$, and $A_{23}$ each independently represent a hydrogen atom, a linear or branched alkyl group having 1 to 4 carbon atoms, or $-L_2-X_{21}$,
where $X_{21}$ represents a hydrophilic group selected from the group consisting of a carboxy group, an alkoxy group, a polyoxyalkylene group, an amide group, a carbamoyl group, a nitrile group, a sulfonamide group, and a sulfamoyl group,
$L_2$ represents a divalent linking group, and
in a case where two or more $X_{21}$'s or two or more $L_2$'s are present, the two or more $X_{21}$'s or two or more $L_2$'s may be the same or different from each other.

2. The treatment liquid according to claim 1,
wherein the first repeating unit has the primary amino group.

3. The treatment liquid according to claim 1,
wherein the resin has at least one selected from the group consisting of skeleton structures represented by Formulae (P-3), (P-7), (P-13) and (P-14),

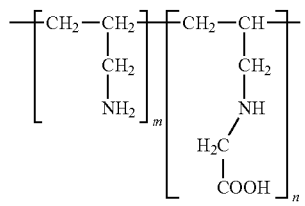

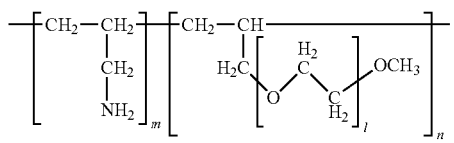

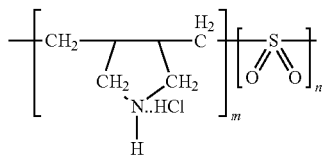

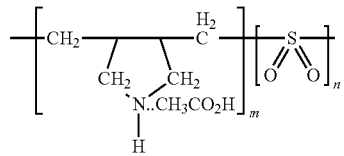

in Formulae (P-3), (P-7), (P-13) and (P-14), a ratio m:n of the number of moles m of the first repeating unit to the number of moles n of the second repeating unit is 1:20 to 20:1, and
in Formula (P-7), 1 represents an integer of 1 to 30.

4. The treatment liquid according to claim 1,
wherein a ratio m:n of the number of moles m of the first repeating unit to the number of moles n of the second repeating unit is 5:1 to 1:5, where the first repeating unit and the second repeating unit are contained in the resin.

5. The treatment liquid according to claim 1,
wherein the resin has a weight-average molecular weight of 1,000 to 150,000.

6. The treatment liquid according to claim 1,
wherein a content of the resin is 10 to 10,000 ppm by mass with respect to a total mass of the treatment liquid.

7. The treatment liquid according to claim 1,
wherein the removing agent comprises at least one selected from the group consisting of hydrofluoric acid, ammonium fluoride, tetramethylammonium fluoride, a hydroxylamine compound, ammonium hydroxide, a water-soluble amine, a quaternary ammonium compound, sulfuric acid, hydrochloric acid, phosphoric acid, carboxylic acid, sulfonic acid, and phosphonic acid.

8. The treatment liquid according to claim 1,
wherein the removing agent comprises a water-soluble amine and at least one organic acid selected from the group consisting of carboxylic acid, sulfonic acid, and phosphonic acid.

9. The treatment liquid according to claim 8,
wherein the water-soluble amine is at least one selected from the group consisting of methylamine, ethylamine, propylamine, butylamine, pentylamine, methoxyethylamine, methoxypropylamine, 2-amino-2-methyl-1-propanol, and allylamine, and the organic acid is at least one selected from the group consisting of acetic acid, propionic acid, methanesulfonic acid, ethanesulfonic acid, allylglycine, maleic acid, citraconic acid, fumaric acid, and itaconic acid.

10. The treatment liquid according to claim 1, further comprising an oxidizing agent.

11. The treatment liquid according to claim 10,
wherein the oxidizing agent is at least one selected from the group consisting of hydrogen peroxide, nitric acid, peracetic acid, periodic acid, perchloric acid, chloric acid, hypochlorous acid, a cerium ammonium nitrate salt, iron nitrate, and ammonium persulfate.

12. The treatment liquid according to claim 1, further comprising a corrosion inhibitor.

13. The treatment liquid according to claim 12,
wherein the corrosion inhibitor comprises at least one compound selected from the group consisting of a compound represented by Formula (A), a compound represented by Formula (B), a compound represented by Formula (C), and a substituted or unsubstituted tetrazole,

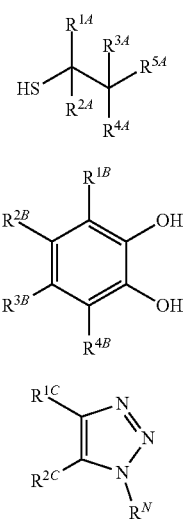

Formula (A)

Formula (B)

Formula (C)

in Formula (A), $R^{1A}$ to $R^{5A}$ each independently represent a hydrogen atom, a substituted or unsubstituted hydrocarbon group, a hydroxyl group, a carboxy group, or a substituted or unsubstituted amino group, provided that a structure of Formula (A) comprises at least one group selected from the hydroxyl group, the carboxy group, or the substituted or unsubstituted amino group, in Formula (B), $R^{1B}$ to $R^{4B}$ each independently represent a hydrogen atom or a substituted or unsubstituted hydrocarbon group, and in Formula (C), $R^{1C}$, $R^{2C}$, and $R^N$ each independently represent a hydrogen atom or a substituted or unsubstituted hydrocarbon group, where $R^{1C}$ and $R^{2C}$ may be bonded to each other to form a ring.

14. The treatment liquid according to claim 1, further comprising a surfactant.

15. The treatment liquid according to claim 14,
wherein the surfactant is at least one selected from the group consisting of a phosphoric acid ester-based surfactant, a carboxylic acid-based surfactant, a sulfonic acid-based surfactant, and a sulfuric acid ester-based surfactant.

16. The treatment liquid according to claim 15,
wherein the phosphoric acid ester-based surfactant is at least one selected from the group consisting of an alkyl phosphoric acid ester, a mono- or polyoxyalkyl ether phosphoric acid ester, and a salt thereof.

17. The treatment liquid according to claim 15,
wherein the carboxylic acid-based surfactant is a polyoxyalkylene alkyl ether carboxylic acid.

18. The treatment liquid according to claim 15,
wherein the sulfonic acid-based surfactant is an alkyl diphenyl ether disulfonic acid, and
the sulfuric acid ester-based surfactant is a polyoxyalkylene ether sulfuric acid ester or a salt thereof.

19. The treatment liquid according to claim 1, further comprising an organic solvent.

20. The treatment liquid according to claim 1, further comprising an antifoaming agent.

21. The treatment liquid according to claim 20,
wherein the antifoaming agent is a silicone-based antifoaming agent.

22. The treatment liquid according to claim 1,
wherein the treatment liquid is a treatment liquid for a substrate having a metal-containing substance, and
the metal-containing substance contains at least one component selected from the group consisting of copper, cobalt, a cobalt alloy, tungsten, a tungsten alloy, ruthenium, a ruthenium alloy, tantalum, a tantalum alloy, aluminum oxide, aluminum nitride, aluminum oxynitride, titanium aluminum, titanium, titanium nitride, titanium oxide, zirconium oxide, hafnium oxide, tantalum oxide, lanthanum oxide, and a yttrium alloy.

23. The treatment liquid according to claim 1,
wherein the treatment liquid is used as a washing solution for removing etching residues, a solution for removing a resist film used in a pattern formation, a washing solution for removing residues from a substrate after chemical mechanical polishing, or an etchant.

24. A substrate treatment method comprising a step A of removing a metal-containing substance on a substrate by using the treatment liquid according to claim 1.

25. The substrate treatment method according to claim 24, further comprising a step B, after the step A, of subjecting the substrate obtained in the step A to a rinsing treatment by using a rinsing liquid.

26. A substrate treatment method for treating a substrate having a metal-containing layer on a surface, the substrate treatment method comprising:
a step P of carrying out a liquid treatment of bringing the surface of the substrate into contact with
a chemical liquid selected from the group consisting of water, hydrogen peroxide water, a mixed aqueous solution of ammonia water and hydrogen peroxide water, a mixed aqueous solution of hydrofluoric acid and hydrogen peroxide water, a mixed aqueous solution of sulfuric acid and hydrogen peroxide water, a mixed aqueous solution of hydrochloric acid and hydrogen peroxide water, oxygen-dissolved water, and ozone-dissolved water, an ozone treatment of bringing an ozone gas into contact with the substrate, a heating treatment of the substrate in an oxygen atmosphere, or a plasma treatment of the substrate using an oxygen gas,
and oxidizing a surface layer of the metal-containing layer to form a metal oxide layer; and a step Q of bringing the treatment liquid according to claim 1 into contact with a surface of the metal oxide layer formed in the step P to remove the metal oxide layer.

27. The treatment method according to claim 26, wherein the step P and the step Q are repeatedly carried out.

28. The treatment method according to claim 26, wherein the metal-containing layer contains at least one selected from the group consisting of cobalt, copper, tungsten, titanium, and aluminum.

* * * * *